United States Patent
Koyama et al.

(10) Patent No.: US 9,263,116 B2
(45) Date of Patent: Feb. 16, 2016

(54) MEMORY DEVICE

(71) Applicant: SEMICONDUCTOR ENERGY LABORATORY CO., LTD., Atsugi-shi, Kanagawa-ken (JP)

(72) Inventors: Jun Koyama, Kanagawa (JP); Shunpei Yamazaki, Tokyo (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 14/717,071

(22) Filed: May 20, 2015

(65) Prior Publication Data

US 2015/0255141 A1    Sep. 10, 2015

Related U.S. Application Data

(63) Continuation of application No. 13/230,184, filed on Sep. 12, 2011, now Pat. No. 9,042,161.

(30) Foreign Application Priority Data

Sep. 13, 2010  (JP) .................................. 2010-204090
May 14, 2011  (JP) .................................. 2011-108899

(51) Int. Cl.
  *G11C 11/24*    (2006.01)
  *G11C 11/407*   (2006.01)
  (Continued)

(52) U.S. Cl.
  CPC .............. *G11C 11/407* (2013.01); *G11C 5/025* (2013.01); *G11C 11/404* (2013.01); *G11C 11/4097* (2013.01); *G11C 8/08* (2013.01)

(58) Field of Classification Search
  USPC ......................................................... 365/149
  See application file for complete search history.

(56) References Cited

U.S. PATENT DOCUMENTS 4,466,081 A   8/1984   Masuoka
5,060,191 A   10/1991  Nagasaki et al.
(Continued)

FOREIGN PATENT DOCUMENTS

CN    001656618 A   8/2005
CN    101038919 A   9/2007
(Continued)

OTHER PUBLICATIONS

Kamiya.T et al., "Carrier transport properties and electronic structures of amorphous oxide semiconductors: the present status", Solid State Physics, Sep. 1, 2009, vol. 44, No. 9, pp. 621-633, Agne Gijutsu Center.

(Continued)

*Primary Examiner* — Hoai V Ho
*Assistant Examiner* — Pablo Huerta
(74) *Attorney, Agent, or Firm* — Fish & Richardson P.C.

(57) ABSTRACT

In a memory device, memory capacity per unit area is increased while a period in which data is held is ensured. The memory device includes a driver circuit provided over a substrate, and a plurality of memory cell arrays which are provided over the driver circuit and driven by the driver circuit. Each of the plurality of memory cell arrays includes a plurality of memory cells. Each of the plurality of memory cells includes a first transistor including a first gate electrode overlapping with an oxide semiconductor layer, and a capacitor including a source electrode or a drain electrode, a first gate insulating layer, and a conductive layer. The plurality of memory cell arrays is stacked to overlap. Thus, in the memory device, memory capacity per unit area is increased while a period in which data is held is ensured.

21 Claims, 37 Drawing Sheets

(51) Int. Cl.
*G11C 5/02* (2006.01)
*G11C 11/404* (2006.01)
*G11C 11/4097* (2006.01)
*G11C 8/08* (2006.01)

(56) References Cited

U.S. PATENT DOCUMENTS

| | | |
|---|---|---|
| 5,349,366 A | 9/1994 | Yamazaki et al. |
| 5,375,085 A | 12/1994 | Gnade et al. |
| 5,487,031 A | 1/1996 | Gnade et al. |
| 5,731,856 A | 3/1998 | Kim et al. |
| 5,744,864 A | 4/1998 | Cillessen et al. |
| 6,127,702 A | 10/2000 | Yamazaki et al. |
| 6,294,274 B1 | 9/2001 | Kawazoe et al. |
| 6,445,026 B1 | 9/2002 | Kubota et al. |
| 6,563,174 B2 | 5/2003 | Kawasaki et al. |
| 6,690,598 B2 | 2/2004 | Oguchi et al. |
| 6,727,522 B1 | 4/2004 | Kawasaki et al. |
| 6,765,844 B2 | 7/2004 | Fujisawa et al. |
| 6,791,863 B2 | 9/2004 | Oguchi et al. |
| 6,846,703 B2 | 1/2005 | Shimoda et al. |
| 6,881,975 B2 | 4/2005 | Anzai et al. |
| 6,972,985 B2 | 12/2005 | Rinerson et al. |
| 7,026,647 B2 | 4/2006 | Wu et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,189,992 B2 | 3/2007 | Wager, III et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,339,187 B2 | 3/2008 | Wager, III et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,554,169 B2 | 6/2009 | Anzai et al. |
| 7,663,174 B2 | 2/2010 | Shibata |
| 7,674,650 B2 | 3/2010 | Akimoto et al. |
| 7,696,063 B2 | 4/2010 | Tsuchiya |
| 7,732,819 B2 | 6/2010 | Akimoto et al. |
| 7,791,074 B2 | 9/2010 | Iwasaki |
| 7,884,360 B2 | 2/2011 | Takechi et al. |
| 7,888,207 B2 | 2/2011 | Wager, III et al. |
| 7,910,490 B2 | 3/2011 | Akimoto et al. |
| 7,932,521 B2 | 4/2011 | Akimoto et al. |
| 7,939,831 B2 | 5/2011 | Anzai et al. |
| 8,008,137 B2 | 8/2011 | Wu et al. |
| 8,036,010 B2 | 10/2011 | Maejima |
| 8,179,707 B2 | 5/2012 | Song et al. |
| 8,202,365 B2 | 6/2012 | Umeda et al. |
| 8,274,077 B2 | 9/2012 | Akimoto et al. |
| 8,314,032 B2 | 11/2012 | Kawamura et al. |
| 8,378,341 B2 | 2/2013 | Hayashi et al. |
| 8,378,403 B2 | 2/2013 | Kato |
| 8,420,442 B2 | 4/2013 | Takechi et al. |
| 8,482,001 B2 | 7/2013 | Yamazaki et al. |
| 8,508,967 B2 * | 8/2013 | Yamazaki ............ G11C 5/025 365/149 |
| 8,610,187 B2 | 12/2013 | Yamazaki et al. |
| 8,637,865 B2 * | 1/2014 | Kato ................ H01L 27/0688 257/296 |
| 8,889,480 B2 | 11/2014 | Takechi et al. |
| 9,042,161 B2 * | 5/2015 | Koyama ............ G11C 5/025 365/149 |
| 2001/0015450 A1 | 8/2001 | Sugibayashi et al. |
| 2001/0046027 A1 | 11/2001 | Tai et al. |
| 2002/0018357 A1 | 2/2002 | Oguchi et al. |
| 2002/0056838 A1 | 5/2002 | Ogawa |
| 2002/0132454 A1 | 9/2002 | Ohtsu et al. |
| 2003/0057423 A1 | 3/2003 | Shimoda et al. |
| 2003/0189401 A1 | 10/2003 | Kido et al. |
| 2003/0202404 A1 | 10/2003 | Scheuerlein |
| 2003/0218221 A1 | 11/2003 | Wager, III et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0245555 A1 | 12/2004 | Ueda |
| 2004/0251461 A1 | 12/2004 | Anzai et al. |
| 2005/0017302 A1 | 1/2005 | Hoffman |
| 2005/0199959 A1 | 9/2005 | Chiang et al. |
| 2005/0243595 A1 | 11/2005 | Rinerson et al. |
| 2005/0280000 A1 | 12/2005 | Ishii et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0216877 A1 | 9/2006 | Toyota et al. |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0128815 A1 * | 6/2007 | Iino ................ H01L 27/115 438/297 |
| 2007/0141784 A1 | 6/2007 | Wager, III et al. |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0215906 A1 | 9/2007 | Wu et al. |
| 2007/0252928 A1 | 11/2007 | Ito et al. |
| 2007/0263423 A1 * | 11/2007 | Scheuerlein ............ G11C 7/18 365/63 |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0108198 A1 | 5/2008 | Wager, III et al. |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2008/0308806 A1 | 12/2008 | Akimoto et al. |
| 2008/0315193 A1 | 12/2008 | Kim et al. |

(56) References Cited

U.S. PATENT DOCUMENTS

| | | |
|---|---|---|
| 2009/0002590 A1 | 1/2009 | Kimura |
| 2009/0008638 A1 | 1/2009 | Kang et al. |
| 2009/0008639 A1 | 1/2009 | Akimoto et al. |
| 2009/0027371 A1 | 1/2009 | Lin et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0114918 A1 | 5/2009 | Wang et al. |
| 2009/0121233 A1 | 5/2009 | Yasukawa |
| 2009/0134399 A1 | 5/2009 | Sakakura et al. |
| 2009/0142888 A1 | 6/2009 | Tsuchiya |
| 2009/0152506 A1 | 6/2009 | Umeda et al. |
| 2009/0152541 A1 | 6/2009 | Maekawa et al. |
| 2009/0154262 A1* | 6/2009 | Tokunaga .............. G11C 7/24 365/189.15 |
| 2009/0184315 A1 | 7/2009 | Lee et al. |
| 2009/0230435 A1 | 9/2009 | Maejima |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0102397 A1 | 4/2010 | Park et al. |
| 2010/0109002 A1 | 5/2010 | Itagaki et al. |
| 2010/0136743 A1 | 6/2010 | Akimoto et al. |
| 2010/0140608 A1 | 6/2010 | Park et al. |
| 2010/0148171 A1 | 6/2010 | Hayashi et al. |
| 2010/0193785 A1 | 8/2010 | Kimura |
| 2010/0213531 A1* | 8/2010 | Asami .................. H01L 21/84 257/316 |
| 2010/0276685 A1 | 11/2010 | Itagaki et al. |
| 2010/0276689 A1 | 11/2010 | Iwasaki |
| 2010/0279462 A1 | 11/2010 | Iwasaki |
| 2011/0089417 A1 | 4/2011 | Yamazaki et al. |
| 2011/0101332 A1 | 5/2011 | Yamazaki et al. |
| 2011/0101334 A1 | 5/2011 | Yamazaki et al. |
| 2011/0101339 A1 | 5/2011 | Yamazaki et al. |
| 2011/0101351 A1 | 5/2011 | Yamazaki |
| 2011/0104851 A1 | 5/2011 | Akimoto et al. |
| 2011/0108706 A1 | 5/2011 | Koyama |
| 2011/0108836 A1 | 5/2011 | Koyama et al. |
| 2011/0110145 A1 | 5/2011 | Yamazaki et al. |
| 2011/0116310 A1 | 5/2011 | Yamazaki et al. |
| 2011/0117697 A1 | 5/2011 | Akimoto et al. |
| 2011/0121285 A1 | 5/2011 | Yamazaki et al. |
| 2011/0121286 A1 | 5/2011 | Yamazaki et al. |
| 2011/0121290 A1 | 5/2011 | Akimoto et al. |
| 2011/0122670 A1 | 5/2011 | Yamazaki et al. |
| 2011/0122673 A1 | 5/2011 | Kamata et al. |
| 2011/0128777 A1 | 6/2011 | Yamazaki et al. |
| 2011/0134683 A1 | 6/2011 | Yamazaki et al. |
| 2011/0147737 A1 | 6/2011 | Yamazaki et al. |
| 2011/0156027 A1 | 6/2011 | Yamazaki et al. |
| 2011/0156117 A1 | 6/2011 | Yamazaki et al. |
| 2011/0163311 A1 | 7/2011 | Akimoto et al. |
| 2011/0207251 A1 | 8/2011 | Anzai et al. |
| 2011/0299318 A1 | 12/2011 | Kaneko et al. |
| 2012/0057396 A1 | 3/2012 | Yamazaki et al. |
| 2012/0063207 A1 | 3/2012 | Kato et al. |
| 2012/0063209 A1 | 3/2012 | Koyama et al. |
| 2013/0056728 A1 | 3/2013 | Morosawa et al. |
| 2013/0256657 A1 | 10/2013 | Yamazaki et al. |
| 2013/0292677 A1 | 11/2013 | Yamazaki et al. |
| 2014/0138778 A1 | 5/2014 | Kato |
| 2015/0056747 A1 | 2/2015 | Takechi et al. |

FOREIGN PATENT DOCUMENTS

| | | |
|---|---|---|
| EP | 1737044 A | 12/2006 |
| EP | 1835535 A | 9/2007 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-154388 A | 6/1990 |
| JP | 02-154389 A | 6/1990 |
| JP | 05-251705 A | 9/1993 |
| JP | 06-097366 A | 4/1994 |
| JP | 06-204424 A | 7/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-502597 | 1/2006 |
| JP | 2007-096055 A | 4/2007 |
| JP | 2007-123861 A | 5/2007 |
| JP | 2007-294897 A | 11/2007 |
| JP | 2008-042088 A | 2/2008 |
| JP | 2009-135350 A | 6/2009 |
| JP | 2009-158939 A | 7/2009 |
| JP | 2009-167087 A | 7/2009 |
| WO | WO-2004/038757 | 5/2004 |
| WO | WO-2004/114391 | 12/2004 |
| WO | WO-2010/097862 | 9/2010 |

OTHER PUBLICATIONS

Coates.D et al., "Optical Studies of the Amorphous Liquid-Cholesteric Liquid Crystal Tranistion:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N. et al., "Spinel,YBFE2O4, and YB2FE3O7 Types of Structures for Compounds in the IN2O3 and SC2O3—A2O3—BO Systems [A; FE, GA, OR AL; B: MG, MN, FE, NI, CU,OR ZN] At Temperatures Over 1000°C", Jorunal of Solid State Chemistry, 1985, vol. 60, pp. 382-384.

Nakamura.M et al., "The phase relations in the In2O3—Ga2ZnO4—ZnO system at 1350°C", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N. et al., "Syntheses and Single-Crystal Data of Homologous Compounds, In2O3(ZnO)m (m = 3, 4, and 5), InGaO3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In, Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

(56) References Cited

OTHER PUBLICATIONS

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices.Employing MOO3 As a Charge-Generation Layer", Adv. Mater. (Advanced Materials), 2006, vol. 18, No. 3, pp. 339-342.

Lee.H et al., "Current Status of, Challenges to, and Perspective View of AM-OLED ", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "Suftla Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID DIGEST '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn—Oxide TFT With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev.B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using Castep", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) ,2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Films Transistors by Ar Plasma Treatment", Appl. Phys. Lett. (Applied Physics Letters) , Jun. 26, 2007, vol. 90, No. 26, pp. 262106-1-262106-3.

(56) References Cited

OTHER PUBLICATIONS

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08: SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of The Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Nomura.K et al., "Carrier transport in transparent oxide semiconductor with intrinsic structural probed using single-crystalline InGaO3(ZnO)5 films", Appl. Phys. Lett. (Applied Physics Letters) , Sep. 13, 2004, vol. 85, No. 11, pp. 1993-1995.

International Search Report (Application No. PCT/JP2011/070095) Dated Dec. 6, 2011.

Written Opinion (Application No. PCT/JP2011/070095) Dated Dec. 6, 2011.

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.

Kim.W et al., "An Experimental High-Density DRAM Cell with a Built-in Gain Stage", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs ", IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.

\* cited by examiner

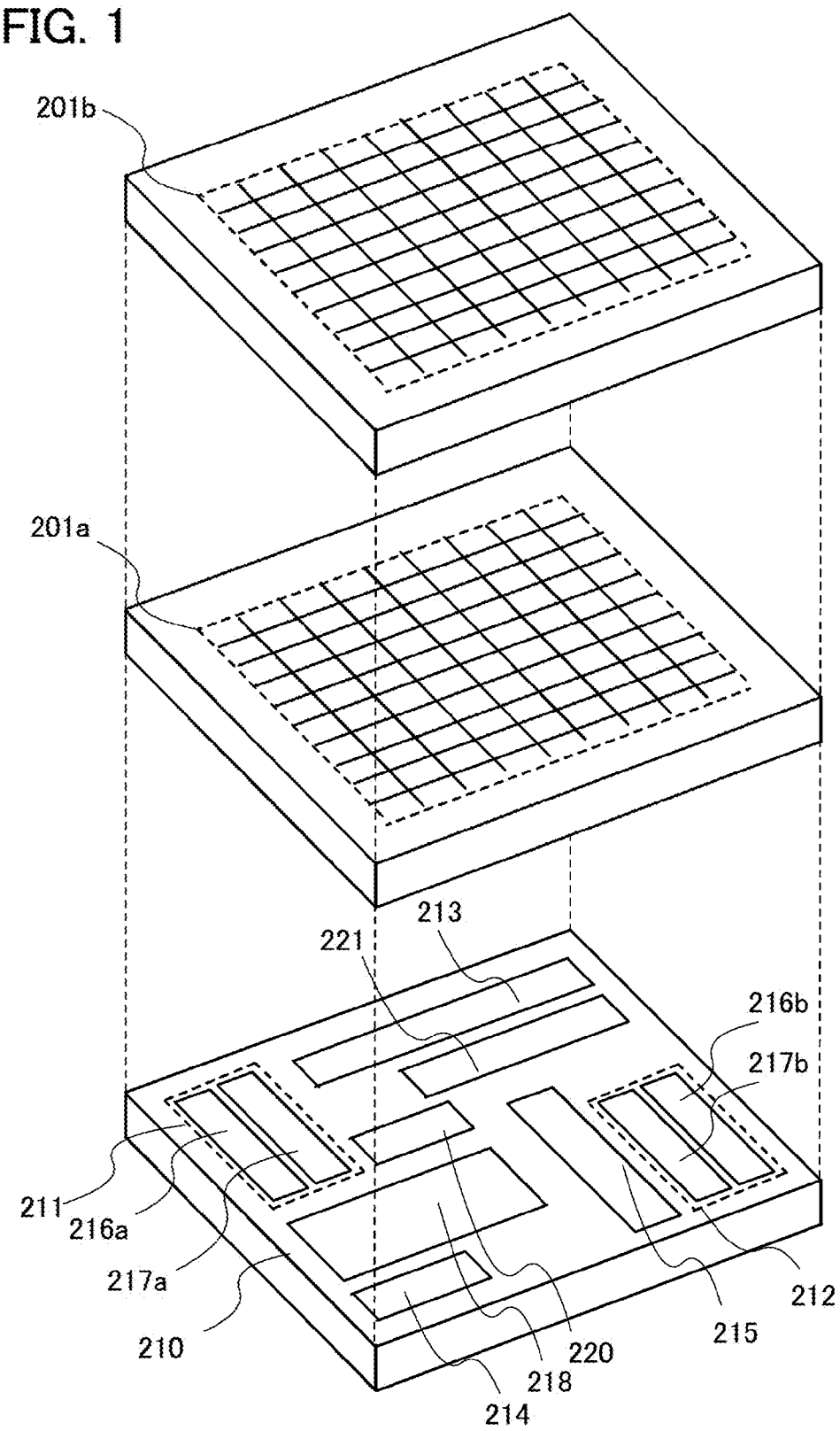

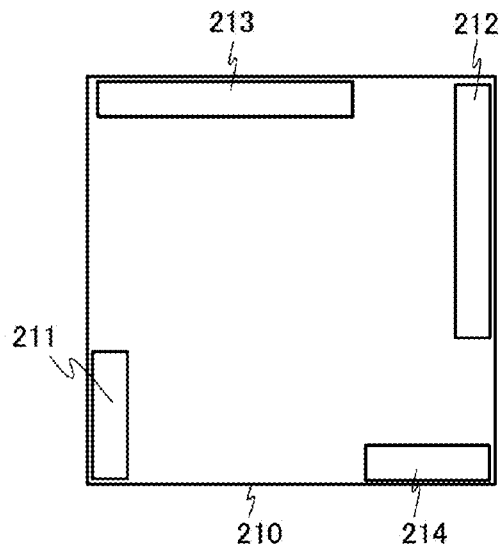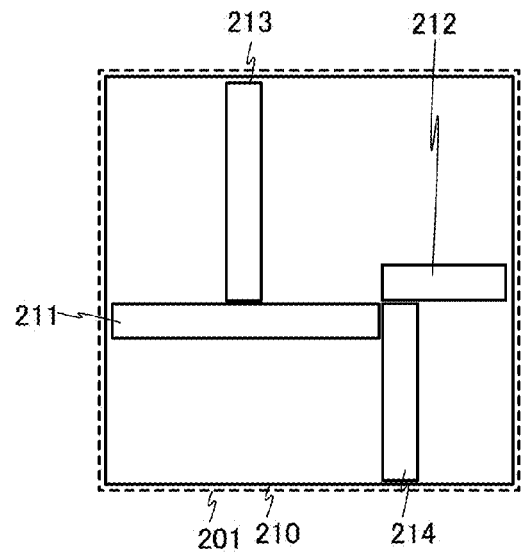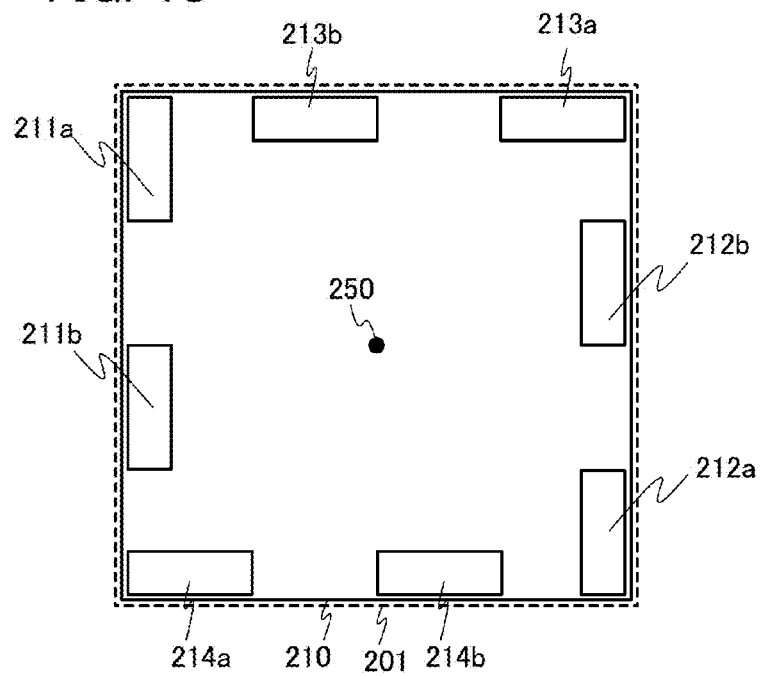

● In
☾ Sn
☽ Zn
• O

● In
● Ga
● Zn
● O

MEMORY DEVICE

CROSS-REFERENCE TO RELATED APPLICATIONS

This application is a continuation of U.S. application Ser. No. 13/230,184, filed Sep. 12, 2011, now allowed, which claims the benefit of foreign priority applications filed in Japan as Serial No. 2010-204090 on Sep. 13, 2010 and Serial No. 2011-108899 on May 14, 2011, all of which are incorporated by reference.

TECHNICAL FIELD

The present invention relates to a memory device and a semiconductor device including the memory device.

BACKGROUND ART

In recent years, a metal oxide having semiconductor characteristics, which is called an oxide semiconductor, has attracted attention as a novel semiconductor material having high mobility as in the case of polysilicon or microcrystalline silicon and having uniform element characteristics as in the case of amorphous silicon. The metal oxide is used for various applications; for example, indium oxide is a well-known metal oxide and used as a material of a pixel electrode in a liquid crystal display device. Examples of such metal oxides having semiconductor characteristics include tungsten oxide, tin oxide, indium oxide, and zinc oxide. Transistors in each of which a channel formation region is formed using such a metal oxide having semiconductor characteristics have been known (Patent Documents 1 and 2).

REFERENCE

Patent Document

[Patent Document 1] Japanese Published Patent Application No. 2007-123861
[Patent Document 2] Japanese Published Patent Application No. 2007-096055

DISCLOSURE OF INVENTION

Examples of a semiconductor memory device (hereinafter, simply referred to as a memory device) include a DRAM and an SRAM which are categorized as a volatile memory; a mask ROM, an EPROM, an EEPROM, a flash memory, and a ferroelectric memory which are categorized as a nonvolatile memory; and the like. Most of these memories including single crystal semiconductor substrates are already put into practical use. Among the above memory devices, a DRAM has a simple structure in which a memory cell includes a transistor and a capacitor and needs fewer semiconductor elements for forming a memory cell than other memory devices such as an SRAM. Therefore, memory capacity per unit area can be increased as compared to other memory devices, and thus, a DRAM is advantageous in cost reduction.

As described above, a DRAM is suitable for large storage capacity, but memory capacity per unit area needs to be further increased as in other memory devices in order that an integrated circuit having higher degree of integration is realized while an increase in a chip size is suppressed. For that purpose, the area of a capacitor for holding charge provided in each memory cell has to be reduced and the area of each memory cell has to be reduced.

However, as the capacitance value is decreased due to reduction in the area of a capacitor, difference between the amounts of charge of digital values (e.g., difference between the amount of charge corresponding to "1" and the amount of charge corresponding to "0") becomes smaller. Thus, if a slight amount of off-state current exists in the transistor, it is difficult to maintain the accuracy of data, and a holding period tends to be short. Accordingly, frequency of refresh operation is increased and power consumption is increased.

In view of the above problem, an object of the present invention is to propose a memory device in which a period in which data is held is ensured and memory capacity per unit area can be increased. Further, an object of the present invention is to propose a semiconductor device including the memory device.

In the disclosed invention, a memory device is formed using a material capable of sufficiently reducing the off-state current of a transistor, such as an oxide semiconductor material that is a wide gap semiconductor. The oxide semiconductor material preferably contains In, Ga, and Zn. The off-state current of a transistor in which an oxide semiconductor is used for a channel formation region is extremely small. Therefore, by forming a memory cell using the transistor, data can be held for a long time.

With the use of multilevel interconnection, a plurality of memory cells included in a memory device are stacked to overlap, and further, the memory cells and a driver circuit for driving the memory cells are stacked to overlap.

An embodiment of the present invention is a memory device including a driver circuit provided over a substrate and a plurality of memory cell arrays which are provided over the driver circuit and driven by the driver circuit. Each of the plurality of memory cell arrays includes a plurality of memory cells arranged in matrix. Each of the plurality of memory cells includes a first transistor including an oxide semiconductor layer, a source electrode, a drain electrode, a first gate insulating layer, and a first gate electrode overlapping with the oxide semiconductor layer with the first gate insulating layer provided therebetween, and a capacitor including one of the source electrode and the drain electrode, the first gate insulating layer, and a conductive layer overlapping with the one of the source electrode and the drain electrode with the first gate insulating layer provided therebetween. The plurality of memory cell arrays is stacked to overlap.

Each of the plurality of memory cell arrays may include a bit line which is electrically connected to the other of the source electrode and the drain electrode of the first transistor, a word line which is electrically connected to the first gate electrode of the first transistor, and a capacitor line which is electrically connected to the conductive layer of the capacitor.

The bit lines of the plurality of memory cell arrays may be electrically connected to each other.

The word lines of the plurality of memory cell arrays may be electrically connected to each other.

The capacitor lines of the plurality of memory cell arrays may be electrically connected to each other.

The bit lines of the two adjacent memory cell arrays of the plurality of memory cell arrays may be arranged so as not to overlap with each other.

The word lines of the two adjacent memory cell arrays of the plurality of memory cell arrays may be arranged so as not to overlap with each other.

The driver circuit can be formed using a second transistor. The second transistor includes a channel formation region that is provided in a substrate including a semiconductor material other than an oxide semiconductor, a pair of impurity regions that are provided so that the channel formation region is sandwiched between the pair of impurity regions, a second gate insulating layer that is provided over the channel formation region, and a second gate electrode that overlaps with the channel formation region and is provided over the second gate insulating layer. Here, one of the pair of impurity regions is a source and the other is a drain.

As another example, the second transistor is provided over an insulating surface and includes a channel formation region that is provided in a semiconductor layer including a semiconductor material other than an oxide semiconductor, a pair of impurity regions that are provided so that the channel formation region is sandwiched between the pair of impurity regions, a second gate insulating layer that overlaps with the channel formation region, and a second gate electrode that is provided to overlap with the channel formation region with the second gate insulating layer provided therebetween. Here, one of the pair of impurity regions is a source and the other is a drain.

Note that the substrate including a semiconductor material is preferably a single crystal semiconductor substrate or an SOI substrate. It is also preferable to use silicon as the semiconductor material other than an oxide semiconductor.

In the above structure, it is preferable that the driver circuit include a bit line driver circuit for driving a bit line and a word line driver circuit for driving a word line; the bit line driver circuit include a first driver circuit and a second driver circuit; each of the first driver circuit and the second driver circuit include a column decoder and a sense amplifier portion; the word line driver circuit include a third driver circuit and a fourth driver circuit; each of the third driver circuit and the fourth driver circuit include a row decoder; and the first to fourth driver circuits be arranged below the plurality of memory cell arrays.

In the above-described structures, the first transistor is formed using an oxide semiconductor; however, the disclosed invention is not limited thereto. A material which can realize the off-state current characteristics equivalent to those of the oxide semiconductor, such as a wide gap material like silicon carbide (specifically, a semiconductor material whose energy gap Eg is larger than 3 eV) may be used.

Since a transistor (first transistor) in which an oxide semiconductor is used for a channel formation region has extremely small off-state current, stored data can be held for an extremely long time by using the transistor. In other words, power consumption can be sufficiently reduced because refresh operation becomes unnecessary or the frequency of refresh operation can be extremely low. Moreover, stored data can be held for a long time even when power is not supplied.

Further, a memory device according to the disclosed invention does not require high voltage for writing data and does not have a problem of deterioration of elements. For example, unlike a conventional nonvolatile memory, it is not necessary to inject and extract electrons into and from a floating gate, and thus a problem such as deterioration of a gate insulating layer does not arise at all. In other words, the semiconductor device according to the disclosed invention does not have a limitation on the number of times data can be rewritten, which is a problem of a conventional nonvolatile memory, and the reliability thereof is drastically improved. Furthermore, since data is written by turning on or off the transistor, high-speed operation can be easily realized.

Further, with the use of multilevel interconnection, a plurality of memory cells included in a memory device is stacked to overlap, and furthermore, the memory cells and a driver circuit for driving the memory cells are stacked to overlap. Thus, memory capacity per unit area can be increased.

For example, in the case where a memory device is formed using only one memory cell array without using multilevel interconnection, the area of a memory cell is $8 F^2$ to $10 F^2$ (F is a half pitch determined by a design rule). On the other hand, the area of a memory cell can be reduced to $1 F^2$ by stacking 8 to 10 memory cell arrays so as to overlap.

Bit lines of the two adjacent memory cell arrays of the plurality of memory cell arrays may be arranged so as not to overlap with each other, so that parasitic capacitance of the bit lines can be reduced and accuracy of reading data can be improved. Further, speed of writing and reading data can be improved. Furthermore, a load on a driver circuit for driving the bit line can be reduced.

Word lines of the two adjacent memory cell arrays of the plurality of memory cell arrays can be arranged so as not to overlap with each other. Thus, parasitic capacitance of the word lines can be reduced and speed of writing and reading data can be improved. Further, a load on a driver circuit for driving the word line can be reduced.

Since a transistor (second transistor) in which a material other than an oxide semiconductor is used for a channel formation region can operate at sufficiently high speed, when it is combined with the transistor (first transistor) in which an oxide semiconductor is used for a channel formation region, a memory device can perform operation (e.g., reading data) at sufficiently high speed. Further, the transistor (second transistor) in which a material other than an oxide semiconductor is used for a channel formation region can favorably realize a variety of driver circuits which are required to operate at high speed.

Furthermore, the area par memory cell array becomes small due to multilevel interconnection by dividing a bit line driver circuit into a first driver circuit and a second driver circuit and dividing a word line driver circuit into a third driver circuit and a fourth driver circuit, so that all the driver circuits can be arranged in a region overlapping with the memory cell array. Thus, a memory device can be downsized.

BRIEF DESCRIPTION OF DRAWINGS

In the accompanying drawings:

FIG. 1 illustrates a structure of a memory device;

FIGS. 4A to 4C each illustrate arrangement of a driver circuit and the like of a memory device;

BEST MODE FOR CARRYING OUT THE INVENTION

Figure 2A:
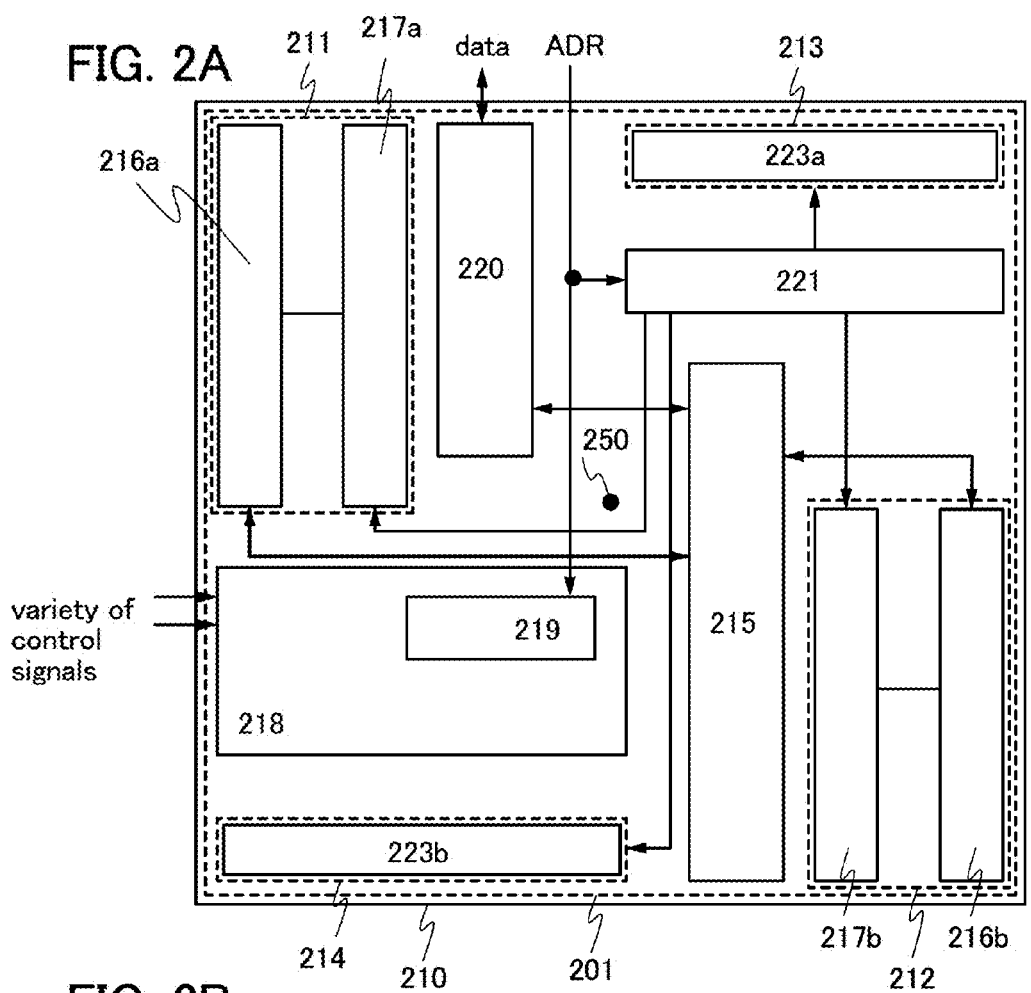
FIGS. 2A and 2B illustrate arrangement of a driver circuit and the like of a memory device.

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the present invention should not be construed as being limited to the description of the embodiments described below. In describing configurations of the present invention with reference to the drawings, the same reference numerals are used in common for the same portions in different drawings. The same hatching pattern is applied to similar parts, and the similar parts are not especially denoted by reference numerals in some cases. In addition, an insulating layer is not illustrated in a top view in some cases.

Note that the position, the size, the range, or the like of each structure illustrated in drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not mean limitation of the number of components.

Note that the term "over" or "under" in this specification and the like does not necessarily mean that a component is placed "directly on" or "directly under" another component. For example, the expression "a gate electrode over a gate insulating layer" does not exclude a structure where a component is placed between the gate insulating layer and the gate electrode.

In addition, in this specification and the like, the term such as "electrode" or "wiring" does not limit a function of a component. For example, an "electrode" is sometimes used as part of a "wiring", and vice versa. Further, the term "electrode" or "wiring" can include the case where a plurality of "electrodes" or "wirings" is formed in an integrated manner.

For example, part of a word line may be used as a first gate electrode of a first transistor and part of a capacitor line may be used as an electrode layer of a capacitor.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification and the like.

Note that in this specification and the like, the term "electrically connected" includes the case where components are connected through an object having any electric function. There is no particular limitation on an object having any electric function as long as electric signals can be transmitted and received between components that are connected through the object.

Examples of an "object having any electric function" are a switching element such as a transistor, a resistor, an inductor, a capacitor, and an element with a variety of functions as well as an electrode and a wiring.

(Embodiment 1)

A structure of a memory device according to an embodiment of the present invention will be described with reference to FIG. 1, FIGS. 2A and 2B, FIGS. 3A to 3H, FIGS. 4A to 4C, FIG. 5, FIG. 6, FIG. 7, and FIG. 8.

<Structure of Memory Device>

FIG. 1 is a schematic view illustrating an example of a structure of a memory device. The memory device according to an embodiment of the present invention has a stacked structure which includes a plurality of memory cell arrays (in FIG. 1, two memory cell arrays are typically illustrated) in the upper portion and a peripheral circuit including as a control circuit or a driver circuit which is required to operate at high speed for driving the plurality of memory cell arrays in the lower portion. Note that the driver circuit or the control circuit may include a logic circuit, an analog circuit, and/or an arithmetic circuit.

The memory device illustrated in FIG. 1 includes a memory cell array 201a including a plurality of memory cells and a memory cell array 201b including a plurality of memory cells in the upper portion, and a peripheral circuit 210 including a first driver circuit 211, a second driver circuit 212, a third driver circuit 213, a fourth driver circuit 214, a fifth driver circuit 215, a controller 218, an address buffer 221, an I/O buffer 220, and the like, which is necessary for operating the memory cell array 201a and the memory cell array 201b, in the lower portion. The first driver circuit 211 includes a column decoder 217*a* and a sense amplifier group 216*a*, and the second driver circuit 212 includes a column decoder 217*b* and a sense amplifier group 216*b*.

The memory cell array 201*a* and the memory cell array 201*b* are stacked to overlap. Accordingly, memory capacity per unit area can be increased. Although an example in which two memory cell arrays (the memory cell array 201*a* and the memory cell array 201*b*) are stacked to overlap is illustrated in FIG. 1, the number of memory cell arrays stacked to overlap is not limited to two in an embodiment of the present invention.

According to an embodiment of the present invention, a plurality of memory cell arrays is stacked to overlap with the use of multilevel interconnection. Here, as compared to the case where a memory cell array is one layer (the case where multilevel interconnection is not used), a method in which the memory cell array is divided and stacked to overlap will be described with reference to schematic views.

<Method for Dividing and Stacking Memory Cell Array>

FIGS. 3A to 3H each schematically illustrate a method for dividing and stacking a memory cell array to overlap.

Figure 3A:
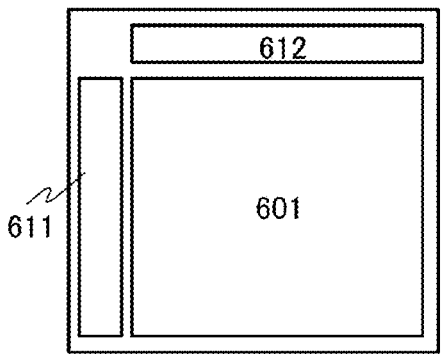
FIGS. 3A to 3H are schematic diagrams each illustrating a method for dividing a memory cell array of a memory device.

As illustrated in FIG. 3A, a memory cell array 601 is driven by a bit line driver circuit 611 and a word line driver circuit 612. The memory cell array 601 includes a plurality of memory cells arranged in matrix and each memory cell is electrically connected to a bit line and a word line. Here, the bit line is arranged in a row direction (the horizontal direction in the figure). The word line is arranged in a column direction (the vertical direction in the figure). The bit line is driven by the bit line driver circuit 611 and the word line is driven by the word line driver circuit 612. FIG. 3A illustrates a structure in the case where a memory cell array is one layer (the case where multilevel interconnection is not used).

According to an embodiment of the present invention, the memory cell array 601 is divided and the divided memory cell arrays are stacked to overlap in order to increase memory capacity per unit area.

Figure 3B:
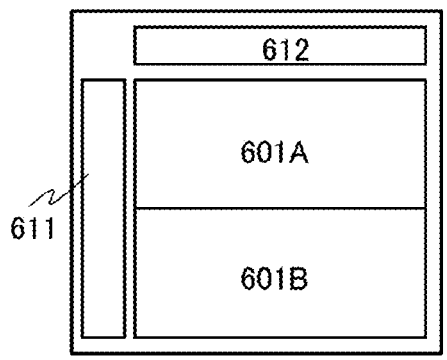
Figure 3C:
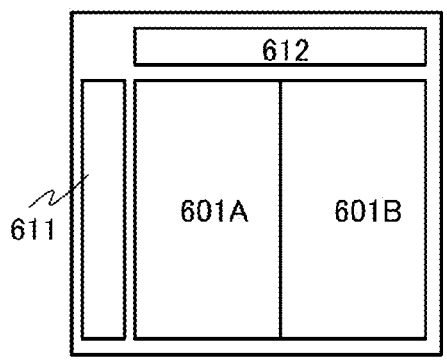

As examples of a method for dividing the memory cell array 601 into two parts, methods illustrated in FIG. 3B and FIG. 3C can be given. According to the method illustrated in FIG. 3B, the memory cell array 601 is divided laterally into two parts. According to the method illustrated in FIG. 3C, the memory cell array 601 is divided longitudinally into two parts. Then, a memory cell array 601A and a memory cell array 601B are stacked to overlap. Further, the bit line driver circuit 611 and the word line driver circuit 612 are also stacked to overlap with the memory cell array 601A and the memory cell array 601B.

In the dividing method illustrated in FIG. 3B, the word lines of the memory cell array 601A and the memory cell array 601B which are stacked to overlap can be electrically connected to each other. In the dividing method illustrated in FIG. 3C, the bit lines of the memory cell array 601A and the memory cell array 601B which are stacked to overlap can be electrically connected to each other. In those cases, the word line of the memory cell array 601A and the word line of the memory cell array 601B are preferably arranged so as not to overlap with each other. Further, the bit line of the memory cell array 601A and the bit line of the memory cell array 601B are preferably arranged so as not to overlap with each other. Thus, parasitic capacitance of the word lines and the bit lines can be reduced.

Note that the method for dividing a memory cell array into two parts is not limited to the methods illustrated in FIGS. 3B and 3C. For example, a memory cell array in an odd-numbered row may be the memory cell array 601A and a memory cell array in an even-numbered row may be the memory cell array 601B. Alternatively, a memory cell in an odd-numbered column may be the memory cell array 601A and a memory cell array in an even-numbered column may be the memory cell array 601B.

Figure 3D:
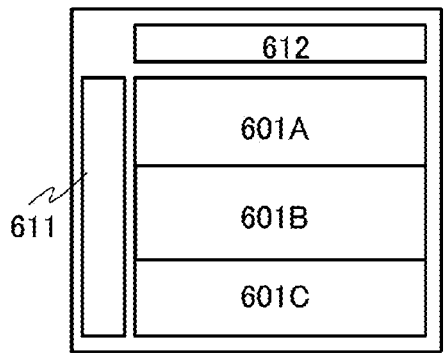
Figure 3E:
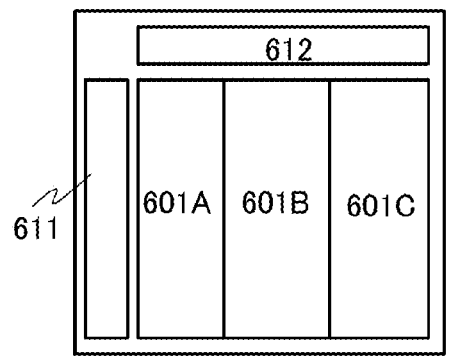

As examples of a method for dividing the memory cell array 601 into three parts, methods illustrated in FIGS. 3D and 3E can be given. According to the method illustrated in FIG. 3D, the memory cell array 601 is divided laterally into three parts. According to the method illustrated in FIG. 3E, the memory cell array 601 is divided longitudinally into three parts. Then, a memory cell array 601A, a memory cell array 601B, and a memory cell array 601C are stacked to overlap. Further, the bit line driver circuit 611 and the word line driver circuit 612 are also stacked to overlap with the memory cell array 601A, the memory cell array 601B, and the memory cell array 601C.

In the dividing method illustrated in FIG. 3D, the word lines of the memory cell array 601A, the memory cell array 601B, and the memory cell array 601C which are stacked to overlap can be connected to one another. In the dividing method illustrated in FIG. 3E, the bit lines of the memory cell array 601A, the memory cell array 601B, and the memory cell array 601C which are stacked to overlap can be electrically connected to one another. In those cases, the word line of the memory cell array 601A and the word line of the memory cell array 601B are preferably arranged so as not to overlap with each other, and the word line of the memory cell array 601B and the word line of the memory cell array 601C are preferably arranged so as not to overlap with each other. Further, the bit line of the memory cell array 601A and the bit line of the memory cell array 601B are arranged so as not to overlap with each other, and the bit line of the memory cell array 601B and the bit line of the memory cell array 601C are preferably arranged so as not to overlap with each other. Thus, parasitic capacitance of the word lines and the bit lines can be reduced.

Figure 3F:
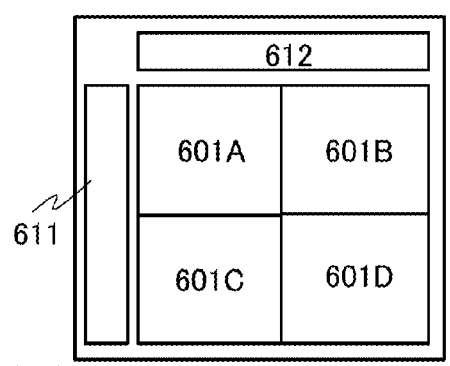
Figure 3G:
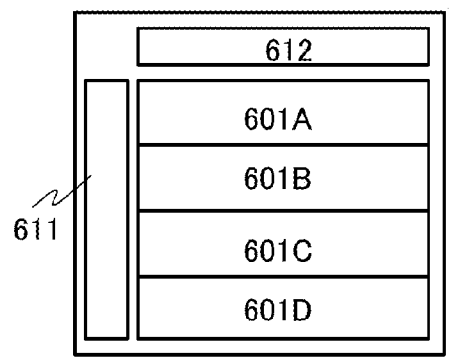
Figure 3H:
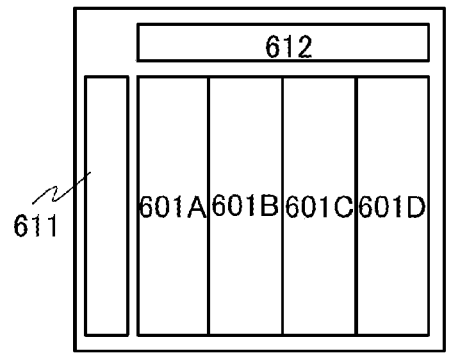

As examples of a method for dividing the memory cell array 601 into four parts, methods illustrated in FIGS. 3F to 3H can be given. According to the method illustrated in FIG. 3F, the memory cell array 601 is divided laterally into two parts and is further divided longitudinally into two parts. According to the method illustrated in FIG. 3G, the memory cell array 601 is divided laterally into four parts. According to the method illustrated in FIG. 3H, the memory cell array 601 is divided longitudinally into four parts. Then, a memory cell array 601A, a memory cell array 601B, a memory cell array 601C, and a memory cell array 601D are stacked to overlap with one another. Further, the bit line driver circuit 611 and the word line driver circuit 612 are also stacked to overlap with the memory cell array 601A, the memory cell array 601B, the memory cell array 601C, and the memory cell array 601D.

In the dividing method illustrated in FIG. 3F, the bit lines of the memory cell array 601A and the memory cell array 601B which are stacked to overlap can be electrically connected to each other; the bit lines of the memory cell array 601C and the memory cell array 601D which are stacked to overlap can be electrically connected to each other; the word lines of the memory cell array 601A and the memory cell array 601C which are stacked to overlap can be electrically connected to each other; and the word lines of the memory cell array 601B and the memory cell array 601D which are stacked to overlap can be electrically connected to each other. In the dividing method illustrated in FIG. 3G, the word lines of the memory cell array 601A, the memory cell array 601B, the memory cell array 601C, and the memory cell array 601D which are stacked to overlap can be electrically connected to one another. In the dividing method illustrated in FIG. 3H, the bit lines of the memory cell array 601A, the memory cell array 601B, the memory cell array 601C, and the memory cell array 601D which are stacked to overlap can be electrically connected to one another. In those cases, the word line of the memory cell array 601A and the word line of the memory cell array 601B, the word line of the memory cell array 601B and the word line of the memory cell array 601C, and the word line of the memory cell array 601C and the word line of the memory cell array 601D are preferably arranged so as not to overlap with each other. Further, the bit line of the memory cell array 601A and the bit line of the memory cell array 601B, the bit line of the memory cell array 601B and the bit line of the memory cell array 601C, and the bit line of the memory cell array 601C and the bit line of the memory cell array 601D are preferably arranged so as not to overlap with each other. Thus, parasitic capacitance of the word lines and the bit lines can be reduced.

Note that the method for dividing a memory cell array is not limited to the methods illustrated in FIGS. 3B to 3H. A memory cell array may be divided into five or more.

It is preferable that the memory cell array 601 be divided so that each of the divided memory cell arrays has a horizontal-to-vertical ratio as close to as 1:1. In addition, it is also preferable that the memory cell array 601 be divided so that each of the divided memory cell arrays includes the same number of memory cells. Thus, memory capacity per unit area can be further increased.

For example, in the case where a memory device is formed using only one memory cell array without using multilevel interconnection (corresponding to the case illustrated in FIG. 3A), the area of a memory cell is $8 F^2$ to $10 F^2$ (F is a half pitch determined by a design rule). On the other hand, the area of a memory cell can be reduced to $1 F^2$ by stacking 8 to 10 memory cell arrays so as to overlap.

Next, a configuration of each memory cell will be described.

<Configuration of Memory Cell>

Figure 5:
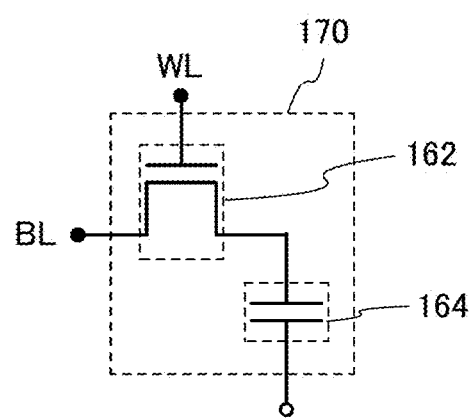
FIG. 5 is a circuit diagram illustrating a configuration of a memory cell of a memory device.

FIG. 5 illustrates an example of a circuit configuration of a memory cell which can be applied to the memory cell array (the memory cell array 201a and the memory cell array 201b in FIG. 1, the memory cell array 601 and the memory cell arrays 601A to 601D in FIGS. 3A to 3H, or the like). A memory cell 170 includes a transistor 162 in which an oxide semiconductor is used for a channel formation region and a capacitor 164.

In the memory cell 170 illustrated in FIG. 5, a bit line BL is electrically connected to a source or drain electrode of the transistor 162, a word line WL is electrically connected to a gate electrode of the transistor 162, and a source or drain electrode of the transistor 162 is electrically connected to a first terminal of the capacitor 164.

The transistor 162 in which an oxide semiconductor is used for a channel formation region has a characteristic of a significantly small off-state current. For that reason, when the transistor 162 is in an off state, a potential of the first terminal of the capacitor 164 (or charge accumulated in the capacitor 164) can be held for an extremely long period. Further, in the transistor 162 in which an oxide semiconductor is used for a channel formation region, a short channel effect is not likely to be caused, which is advantageous.

Next, writing and holding data in the memory cell 170 illustrated in FIG. 5 will be described.

First, the potential of the word line WL is set to a potential at which the transistor 162 is turned on, and the transistor 162 is turned on. Accordingly, the potential of the bit line BL is supplied to the first terminal of the capacitor 164 (writing).

After that, the potential of the word line WL is set to a potential at which the transistor 162 is turned off, so that the transistor 162 is turned off. Thus, the potential of the first terminal of the capacitor 164 is held (holding).

Because the off-state current of the transistor 162 is extremely small, the potential of the first terminal of the capacitor 164 (or charge accumulated in the capacitor 164) can be held for a long time.

Next, reading data will be described. When the transistor 162 is turned on, the bit line BL and the capacitor 164 which are in a floating state are electrically connected to each other, and the charge is redistributed between the bit line BL and the capacitor 164. As a result, the potential of the bit line BL is changed. The amount of change in potential of the bit line BL varies depending on the potential of the first terminal of the capacitor 164 (or charge accumulated in the capacitor 164).

For example, the potential of the bit line BL after charge redistribution is $(C_B*V_{B0}+C*V)/(C_B+C)$, where V is the potential of the first terminal of the capacitor 164, C is the capacitance of the capacitor 164, $C_B$ is the capacitance of the bit line BL (hereinafter also referred to as a bit line capacitance), and $V_{B0}$ is the potential of the bit line BL before the charge redistribution. Therefore, it can be found that assuming that the memory cell 170 is in either of two states in which the potentials of the first terminal of the capacitor 164 are $V_1$ and $V_0$ ($V_1 > V_0$), the potential of the bit line BL in the case of holding the potential $V_1$ ($=(C_B*V_{B0}+C*V_1)/(C_B+C)$) is higher than the potential of the bit line BL in the case of holding the potential $V_0$ ($=(C_B*V_{B0}+C*V_0)/(C_B+C)$).

Then, by comparing the potential of the bit line BL with a predetermined potential, data can be read.

Thus, the memory cell illustrated in FIG. 5 can hold charge accumulated in the capacitor 164 for a long time, since the off-state current of the transistor 162 is extremely small. In other words, power consumption can be sufficiently reduced because refresh operation becomes unnecessary or the frequency of refresh operation can be extremely low. Further, when a normally-off (enhancement) transistor is used as the transistor 162, and power is not supplied, a ground potential may be input to the gate of the transistor 162. With that structure, the transistor 162 can remain off even when power is not supplied, and charge accumulated in the capacitor 164 can be kept held. Accordingly, stored data can be held for a long time even when power is not supplied.

<Circuit Configuration of Memory Cell Array and Driving Method thereof>

Figure 6:
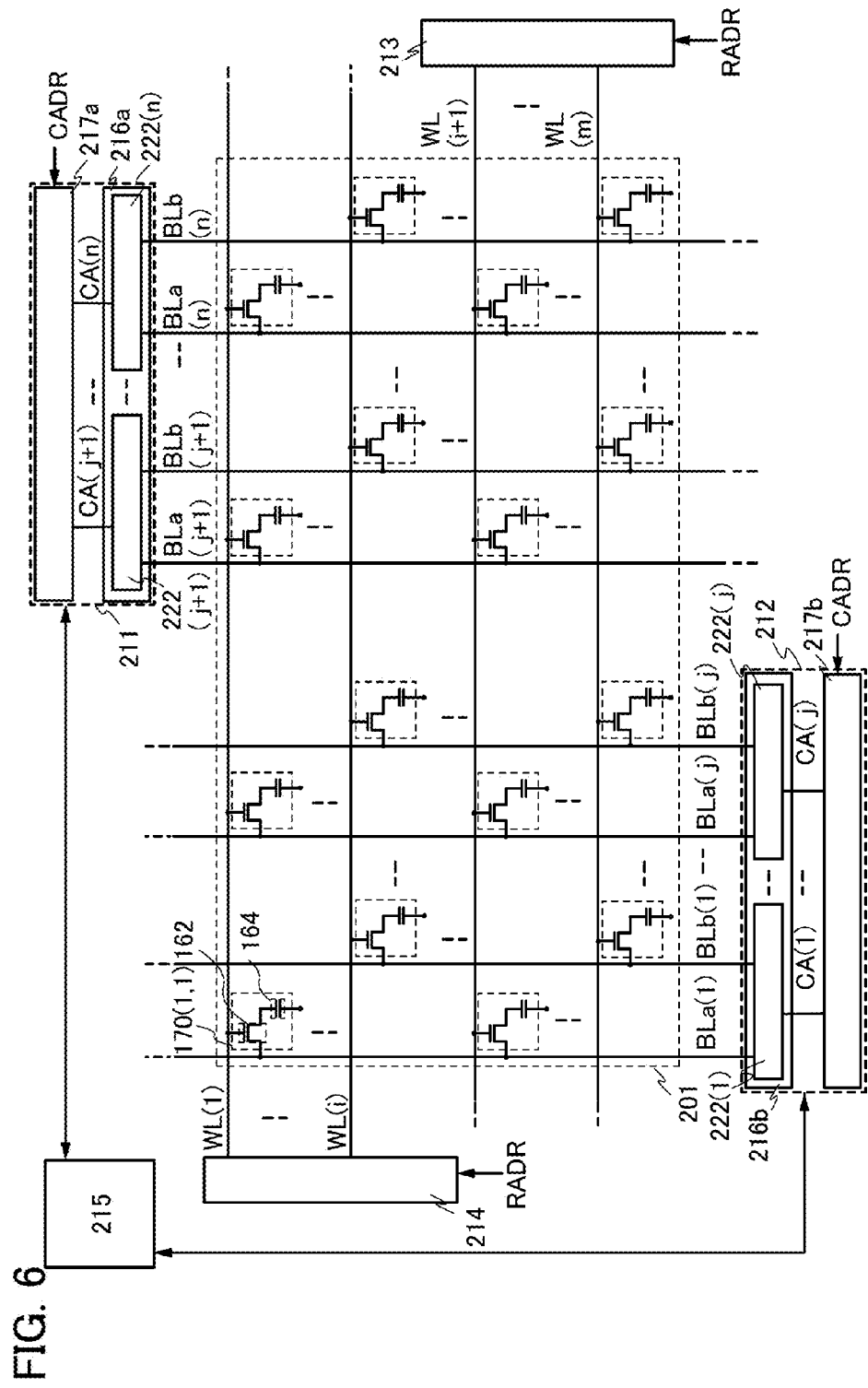
FIG. 6 is a circuit diagram illustrating a configuration of a memory cell array and a driver circuit of a memory device.

Next, a circuit diagram of the memory cell array 201 and part of the peripheral circuit is illustrated in FIG. 6. Note that in the circuit diagram in FIG. 6, the memory cell array 201 and part of the peripheral circuit are illustrated as if provided in the same plane. However, in the actual memory device, part of the peripheral circuit other than the memory cell array 201 is provided under the memory cell array 201. In addition, the memory cell array 201 is divided into a plurality of memory cell arrays, and the plurality of memory cell arrays is provided so as to overlap. The memory cells 170 illustrated in FIG. 5 are applied to the memory cell array 201 illustrated in FIG. 6.

The memory cell array 201 illustrated in FIG. 6 includes m word lines WL, n bit lines BLa, n bit lines BLb, and a plurality of memory cells 170 arranged in a matrix of m (rows) (in the vertical direction) and n (columns) (in the horizontal direction). The word lines WL(1) to WL(i) are electrically connected to the fourth driver circuit 214, and the word lines WL(i+1) to WL(m) are electrically connected to the third driver circuit 213. The bit lines BLa(1) to BLa(j) and the bit lines BLb(1) to BLb(j) are electrically connected to the second driver circuit 212, and the bit lines BLa(j+1) to BLa(n)

and the bit lines BLb(j+1) to BLb(n) are electrically connected to the first driver circuit 211. The first driver circuit 211 and the second driver circuit 212 are each electrically connected to the fifth driver circuit 215.

The first driver circuit 211 includes the column decoder 217a and the sense amplifier group 216a, and the sense amplifier group 216a includes sense amplifiers 222(j+1) to 222(n). The column decoder 217a is electrically connected to the sense amplifiers 222(j+1) to 222(n) through column address lines CA(j+1) to CA(n), and the sense amplifiers 222(j+1) to 222(n) are electrically connected to the memory cell array 201 through the bit lines BLa(j+1) to BLa(n) and the bit lines BLb(j+1) to BLb(n). Similarly, the second driver circuit 212 includes the column decoder 217b and the sense amplifier group 216b, and the sense amplifier group 216b includes sense amplifiers 222(1) to 222(j). The column decoder 217b is electrically connected to the sense amplifiers 222(1) to 222(j) through column address lines CA(1) to CA(j), and the sense amplifiers 222(1) to 222(j) are electrically connected to the memory cell array 201 through the bit lines BLa(1) to BLa(j) and the bit lines BLb(1) to BLb(j).

Figure 7:
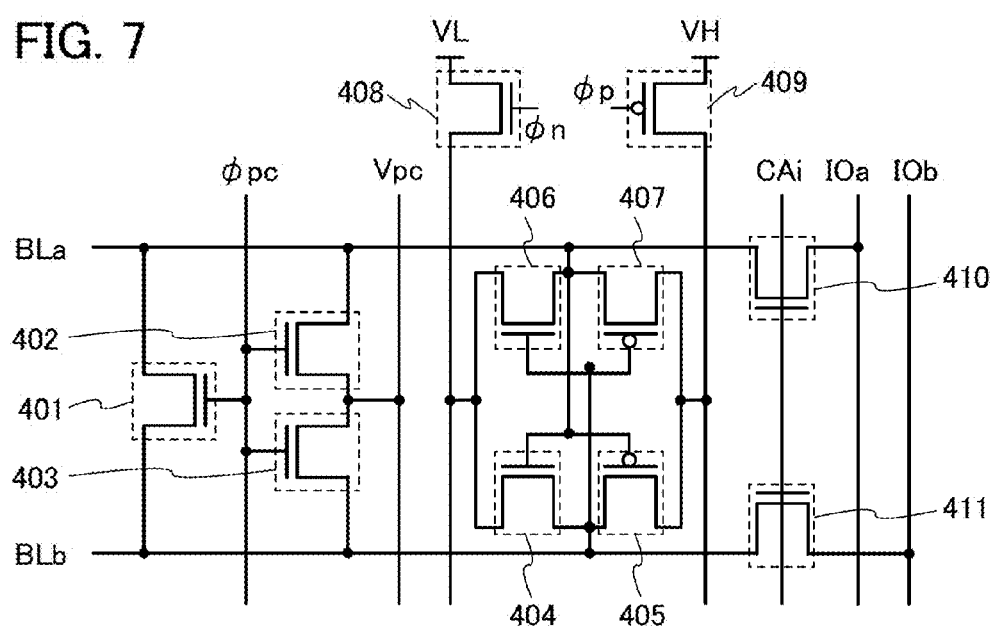
FIG. 7 is a circuit diagram illustrating a configuration of a driver circuit of a memory device.

FIG. 7 illustrates a circuit configuration of a sense amplifier which can be applied to the sense amplifier groups 216a and 216b.

In the sense amplifier illustrated in FIG. 7, a gate electrode of a transistor 401, a gate electrode of a transistor 402, and a gate electrode of a transistor 403 are electrically connected to a signal line φpc. One of a source electrode and a drain electrode of the transistor 402 and one of a source electrode and a drain electrode of the transistor 403 are electrically connected to a signal line Vpc. The other of the source electrode and the drain electrode of the transistor 402 is electrically connected to the signal line BLa. The other of the source electrode and the drain electrode of the transistor 403 is electrically connected to the signal line BLb. One of a source electrode and a drain electrode of the transistor 401 is electrically connected to the signal line BLa and the other of the source electrode and the drain electrode of the transistor 401 is electrically connected to the signal line BLb. A gate electrode of a transistor 404, a gate electrode of a transistor 405, one of a source electrode and a drain electrode of a transistor 406, and one of a source electrode and a drain electrode of a transistor 407 are electrically connected to the signal line BLa, and a gate electrode of the transistor 406, a gate electrode of the transistor 407, one of a source electrode and a drain electrode of the transistor 404, and one of a source electrode and a drain electrode of the transistor 405 are electrically connected to the signal line BLb. The other of the source electrode and the drain electrode of the transistor 404 and the other of the source electrode and the drain electrode of the transistor 406 are electrically connected to one of a source electrode and a drain electrode of a transistor 408, and the other of the source electrode and the drain electrode of the transistor 405 and the other of the source electrode and the drain electrode of the transistor 407 are electrically connected to one of a source electrode and a drain electrode of a transistor 409. One of a source electrode and a drain electrode of a transistor 410 is electrically connected to the signal line BLa, and the other of the source electrode and the drain electrode of the transistor 410 is electrically connected to a signal line IOa. One of a source electrode and a drain electrode of a transistor 411 is electrically connected to the signal line BLb, and the other of the source electrode and the drain electrode of the transistor 411 is electrically connected to a signal line IOb. A gate electrode of the transistor 410 and a gate electrode of the transistor 411 are electrically connected to a signal line CAi. A potential VH is supplied to the other of the source electrode and the drain electrode of the transistor 409, and a potential VL is supplied to the other of the source electrode and the drain electrode of the transistor 408.

In the sense amplifier illustrated in FIG. 7, the transistor 405, the transistor 407, and the transistor 409 are p-channel transistors, and the transistors 401 to 404, the transistor 406, the transistor 408, the transistor 410, and the transistor 411 are n-channel transistors.

Figure 8:
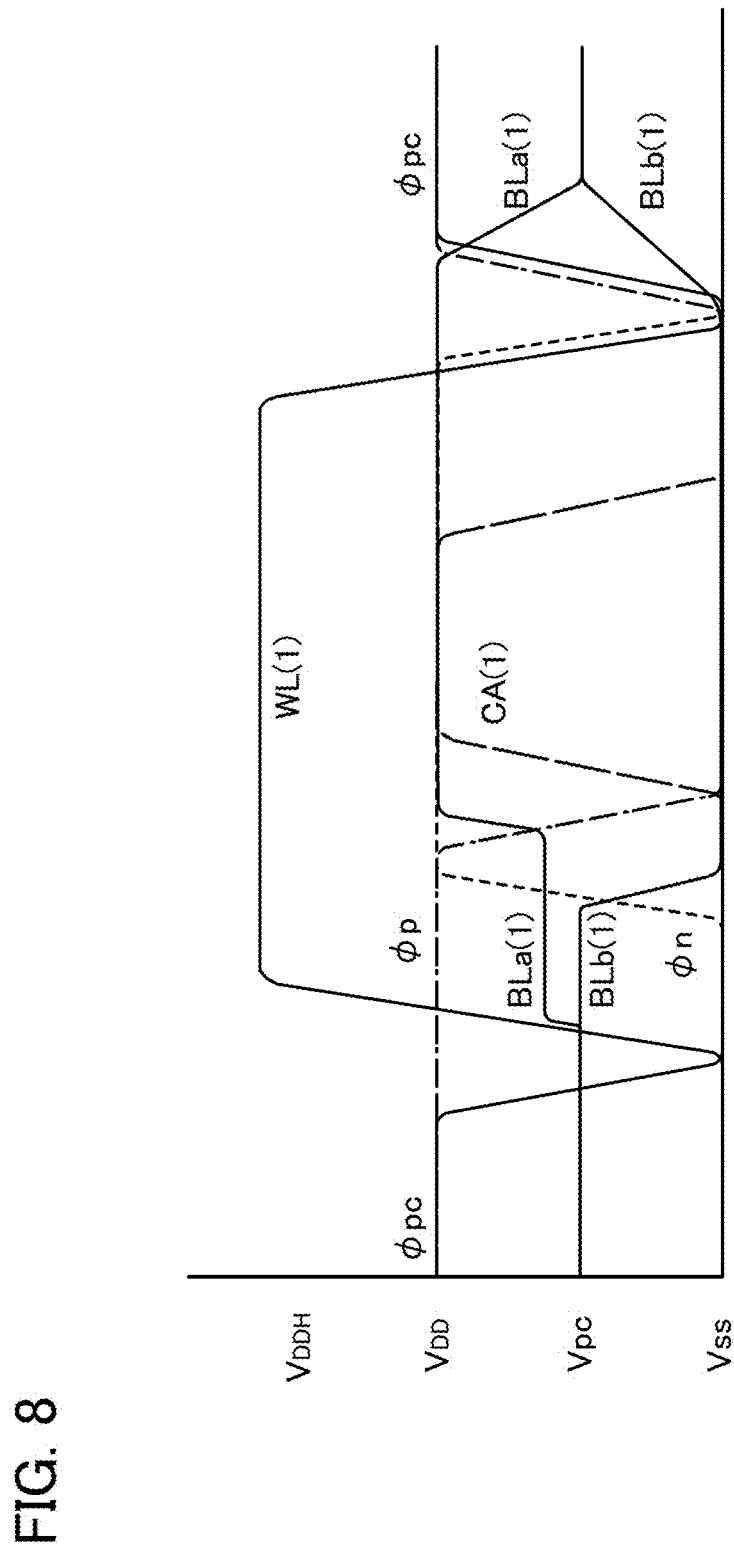
FIG. 8 shows a method for driving a memory device.

Next, the case where writing, holding, and reading data is performed on the memory cell array 201 is described with reference to FIG. 6, FIG. 7, and FIG. 8. Note that in the memory cell 170, two states of a potential VDD and a potential VSS are held in the first terminal of the capacitor 164, and a state in which the potential VDD is held is referred to as data "1", and a state in which the potential VSS is held is referred to as data "0". Here, the case where data "1" is written to the memory cell 170(1,1) of the memory cell array 201 illustrated in FIG. 6 and the case where data "1" is read from the memory cell 170(1,1) are described. In other words, the case where the memory cell 170(1,1) in the first row and the first column of the memory cells in the memory cell array 201 is selected and writing and reading data is performed thereon is described. Here, a row on which writing or reading data is performed is also referred to as a selected row, and a column on which writing or reading data is performed is also referred to as a selected column. Therefore, hereinafter, the case where the first row is the selected row and the first column is the selected column is described.

In the case where data is written to the memory cell 170(1, 1) illustrated in FIG. 6, the potential VDD is supplied to the signal line CA(1) in the first column (also referred to as "the signal line CA(1) is activated"). As a result, the bit line BLa(1) and the bit line BLb(1) are electrically connected the signal line IOa the and the signal line IOb, respectively. In the sense amplifier illustrated in FIG. 7, the potential VDD is supplied to a signal line φn and the potential VSS is supplied to a signal line φp. Thus, a predetermined power supply voltage (a potential difference between the potential VL and the potential VH) is input to the sense amplifier (also referred to as "the sense amplifier is activated"). At this time, the potential VSS is supplied to the signal line φpc. Here, the potential VH can be VDD and the potential VL can be VSS.

Then, a read circuit, a write circuit, and a latch circuit group included in the fifth driver circuit 215 illustrated in FIG. 6 are supplied with potentials corresponding to data to be written to the signal line IOa and the signal line IOb. For example, when data "1" is written to the memory cell 170(1,1), the signal line IOa is supplied with VDD and the signal line IOb is supplied with VSS. As a result, the bit line BLa(1) is supplied with VDD and the bit line BLb(1) is supplied with VSS. Note that the potentials of the bit line BLa(1) and the bit line BLb(1) is held at VDD or VSS even when the signal line CA(1) is deactivated (here, supplied with the potential VSS) as long as the sense amplifier is activated.

Next, the word line WL(1) in the first row which is a selected row is activated, so that the transistor 162 of the memory cell 170(1,1) is turned on. Here, the word line WL(1) is supplied with a potential VDDH which is higher than the potential VDD. As a result, the first terminal of the capacitor 164 of the memory cell 170(1,1) is supplied with VDD. After that, the word line WL(1) is deactivated (here, supplied with the potential VSS), so that the transistor 162 of the memory cell 170(1,1) is turned off. In this manner, data "1" can be written to the memory cell 170(1,1). Furthermore, by turning off the transistor 162 of the memory cell 170(1,1), the potential of the first terminal of the capacitor 164 (or charge accumulated in the capacitor 164) is held.

Note that although the case of writing data "1" is described here, the case of writing data "0" is also similar.

Next, the case where data is read from the memory cell 170(1,1) is described with reference to a timing chart in FIG. 8.

In order to read data from the memory cell 170(1,1), the potential VDD is applied to the signal line φpc, the bit line BLa(1) and the bit line BLb(1) are precharged, and the potential Vpc is applied to the bit line BLa(1) and the bit line BLb(1). Here, the potential Vpc is VDD/2. Then, the potential VSS is applied to the signal line φpc, and thus, precharge is completed.

Next, the word line WL(1) in the first row which is a selected row is activated, so that the transistor 162 of the memory cell 170(1,1) is turned on. Here, the word line WL(1) is supplied with the potential VDDH which is higher than the potential VDD. As a result, charge is redistributed between the bit line BLa(1) and the capacitor 164 of the memory cell 170(1,1), and the potential of the bit line BLa(1) is slightly increased.

Next, the sense amplifier is activated. Here, by changing the potential applied to the signal line φn from VSS to VDD, the potential VL is applied to the n-channel transistor 408 included in the sense amplifier. As a result, the potential of the bit line BLa(1) is slightly higher than that of the bit line BLb(1), and therefore, the sense amplifier amplifies the difference and decreases the potential of the bit line BLb(1) to the potential VL. Subsequently, by changing the potential applied to the signal line φp from VDD to VSS, the potential VH is applied to the p-channel transistor 409 included in the sense amplifier. As a result, the potential of the bit line BLb(1) is equal to the potential VL which is lower than that of the bit line BLa(1), and therefore, the sense amplifier amplifies the difference and increases the potential of the bit line BLa(1) to the potential VH. As a result, the bit line BLa(1) is supplied with the potential VH and the bit line BLb(1) is supplied with the potential VL. In FIG. 8, the potential VH is VDD, and the potential VL is VSS.

Next, the signal line CA(1) in the first column which is a selected column is activated. Here, the signal line CA(1) is supplied with the potential VDD. As a result, the bit line BLa(1) and the bit line BLb(1) are electrically connected to the signal line IOa and the signal line IOb, respectively, which are electrically connected to the read circuit, the write circuit, and the latch circuit group of the fifth driver circuit 215. Thus, the potentials of the bit line BLa(1) and the bit line BLb(1) are read.

In this manner, data is read from the memory cell 170(1,1).

After the data stored in the memory cell 170(1,1) is read out to the read circuit, the write circuit, and the latch circuit group, the signal line CA(1) is deactivated (here, supplied with the potential VSS), so that the bit line BLa(1) and the bit line BLb(1) are electrically disconnected from the signal line IOa and the signal line IOb. Then, the word line WL(1) is deactivated (here, supplied with the potential VSS), so that the transistor 162 of the memory cell 170(1,1) is turned off. At this time, data "1" is stored again in the memory cell 170(1,1). After that, the sense amplifier may be deactivated by changing the potential applied to the signal line φn from VDD to VSS and changing the potential applied to the signal line φp from VSS to VDD. The bit line BLa(1) and the bit line BLb(1) may be precharged by applying the potential VDD to the signal line φpc.

In the above manner, data "1" can be read from the memory cell 170(1,1).

Note that although the case of reading data "1" from the memory cell 170(1,1) is described here, a read operation in the case of reading data "0" is also similar. In that case, charge is redistributed between the bit line BLa(1) and the capacitor 164 of the memory cell 170(1,1), and the potential of the bit line BLa(1) is slightly decreased. The sense amplifier amplifies the difference, decreases the potential of the bit line BLa(1) to the potential VL, and increases the potential of the bit line BLb(1) to the potential VH.

What is described above is the circuit configuration of the memory cell array and the driving method thereof.

According to one embodiment of the present invention, a plurality of memory cell arrays 201 is stacked with the use of multilevel interconnection. For example, in the circuit diagram illustrated in FIG. 6, the memory cell arrays 201 may be divided into a region driven by the first driver circuit 211 and the third driver circuit 213 (a first memory cell array), a region driven by the first driver circuit 211 and the fourth driver circuit 214 (a second memory cell array), a region driven by the second driver circuit 212 and the third driver circuit 213 (a third memory cell array), and a region driven by the second driver circuit 212 and the fourth drive circuit 214 (a fourth memory cell array), and the first to fourth memory cell arrays may be stacked to overlap. Such a dividing structure of the memory cell array 201 corresponds to the structure illustrated in the schematic view in FIG. 3F. An example in which regions driven by the same combination of driver circuits of the first to fourth driver circuits 211 to 214 are formed in the same layer is described, but it is not limited thereto. Memory cells driven by the same combination of driver circuits can be formed in different layers.

Next, an example of a method for arranging peripheral circuit stacked to overlap with a memory cell array will be described.

<Arrangement of Driver Circuit>

Figure 2B:
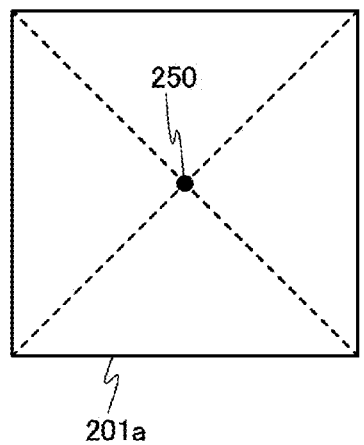

FIG. 2A is a block diagram of the peripheral circuit 210 in the lower portion of the memory device illustrated in FIG. 1, and FIG. 2B illustrates the symmetry with respect to a center point 250 of the memory cell array 201a. FIG. 2A illustrates the case where the peripheral circuit 210 is provided under the memory cell array 201a.

The peripheral circuit 210 illustrated in FIG. 2A includes the first driver circuit 211, the second driver circuit 212, the third driver circuit 213, the fourth driver circuit 214, the fifth driver circuit 215, the controller 218, the address buffer 221, and the I/O buffer 220. The first driver circuit 211 includes the column decoder 217a and the sense amplifier group 216a, and the second driver circuit 212 includes the column decoder 217b and the sense amplifier group 216b. The third driver circuit 213 and the fourth driver circuit 214 include a row decoder 223a and a row decoder 223b, respectively. The fifth driver circuit 215 includes a write circuit, a read circuit, and a latch circuit group. The controller 218 includes a mode register 219.

As a substrate where the peripheral circuit 210 illustrated in FIG. 2A is provided, a semiconductor substrate including a Group 14 element, such as silicon, germanium, silicon germanium, or silicon carbide, a compound semiconductor substrate, such as gallium arsenide or indium phosphide, an SOI substrate, or the like can be used, for example. Note that the term "SOI substrate" generally means a substrate where a silicon layer is provided over an insulating surface. In this specification and the like, the term "SOI substrate" also means a substrate where a semiconductor layer containing a material other than silicon is provided over an insulating surface. Moreover, the SOI substrate can be a substrate having a structure in which a semiconductor layer is provided over an insulating substrate such as a glass substrate, with an insulating layer provided therebetween. It is preferable to form the peripheral circuit 210 using any of the above-described substrates because the peripheral circuit 210 can be made to operate at high speed.

The address buffer 221 outputs a row address signal to the row decoder 223a and the row decoder 223b, or a column address signal to the column decoder 217a and the column decoder 217b, according to a variety of control signals on an input of an address signal ADR from the outside. The row decoder 223a and the row decoder 223b select a row specified by a row address according to the input row address signal. The column decoder 217a and the column decoder 217b select a column specified by a column address according to the input column address signal.

The sense amplifier groups 216a and 216b are electrically connected to bit lines BL, and detect and amplify the potentials of the bit lines BL.

The fifth driver circuit 215 includes the read circuit, the write circuit, and the latch circuit group, and is electrically connected to the sense amplifier groups 216a and 216b. The read circuit receives an output signal of a sense amplifier of a column specified by a column address as an input signal, and reads out data stored in a memory cell. The write circuit outputs a signal corresponding to data to be written to a bit line BL of a column specified by a column address. The latch circuit group stores data read from a memory cell or data to be written to a memory cell.

The I/O buffer 220 receives data which is input from the outside through a data signal line, and outputs data to the write circuit and the latch circuit group of the fifth driver circuit 215. In addition, the I/O buffer 220 receives data which is stored in the read circuit and the latch circuit group, and outputs data to the outside.

The controller 218 includes a command decoder, the mode register 219, and the like and receives a variety of control signals (e.g., /CS, /RAS, /CAS, and /WE). The command decoder decodes a command that is input by means of the variety of control signals. The mode register 219 is a register for setting an operation mode of a semiconductor device. Data is written to the mode register 219 according to a command and supplied with data to be written thereto by means of an address signal. The controller 218 generates a variety of control signals based on an output of the command decoder, and outputs the control signals to a variety of circuits.

Here, the first driver circuit 211 and the second driver circuit 212 are arranged so as to be symmetrical with respect to the center point 250 of the memory cell array 201a. The third driver circuit 213 and the fourth driver circuit 214 are arranged so as to be symmetrical with respect to the center point 250 of the memory cell array 201a. At this time, the first to fourth circuits 211 to 214 are arranged so that a direction in which circuit elements for different rows are disposed in the third driver circuit 213 and the fourth driver circuit 214 (the horizontal direction in FIG. 2A) and a direction in which circuit elements for different columns are disposed in the first driver circuit 211 and the second driver circuit 212 (the vertical direction in FIG. 2A) cross each other, for example, are perpendicular to each other. In an embodiment of the present invention, "being symmetrical with respect to a point" means being in a positional relation as in the arrangement of the first driver circuit 211 and the second driver circuit 212 illustrated in FIG. 1 and FIG. 2A, where the first driver circuit 211 overlaps with the second driver circuit 212 by rotating 180 degrees with respect to the center point 250. Note that "being symmetrical with respect to a point" does not necessarily mean "being completely symmetrical with respect to a point" but "being substantially symmetrical with respect to a point".

As illustrated in FIG. 1 and FIG. 2A, a column decoder and a row decoder are divided and arranged in the peripheral circuit 210, so that an area of the peripheral circuit 210 can be reduced. Further, the column decoder and the row decoder are divided and arranged in the peripheral circuit 210, so that the peripheral circuit 210 can be provided under the memory cell array 201a, leading to downsizing of a memory device. In particular, when the area of the memory cell array 201a is substantially equal to the area of the peripheral circuit 210, a wasted region can be eliminated, so that the area and size of a memory device can be decreased. Further, when the area of the peripheral circuit 210 is smaller than or equal to the area of the memory cell array 201a, an increase in the circuit area due to the peripheral circuit 210 can be suppressed, so that the area and size of a memory device can be decreased. In the case where the area of the peripheral circuit 210 is much smaller than the area of the memory cell array 201a, the scale of the peripheral circuit 210 may be increased to improve its function as for kinds of interfaces or commands of a memory device. Although description is made using the column decoder and the row decoder, it is not limited to the column decoder and the row decoder. When a circuit which is required to be provided from one end to the other end along with a memory cell array, that is, a circuit which is required to be provided to each row of a memory cell array or a circuit which is required to be provided to each column of a memory cell array, has a configuration similar to the configuration of the above column decoder or row decoder, the above effect can be obtained.

Note that although FIG. 2A illustrates the case where the peripheral circuit 210 is provided directly under the memory cell array 201a, the peripheral circuit 210 does not need to be provided directly under the memory cell array 201a. However, in order to decrease the area and size of the memory device, it is preferable that the peripheral circuit 210 including the first to fourth driver circuits 211 to 214 and the like be provided directly under the memory cell array 201a.

FIGS. 4A to 4C illustrate arrangements of the first to fourth driver circuits 211 to 214. Note that for easy understanding, circuits other than the first to fourth driver circuits 211 to 214 are not illustrated in FIGS. 4A to 4C.

The number of wirings which electrically connect the first driver circuit 211 and the memory cell array (the memory cell array 201a or the memory cell array 201b in FIG. 1) may be different from the number of wirings which electrically connect the second driver circuit 212 and the memory cell array (the memory cell array 201a or the memory cell array 201b in FIG. 1) (see FIGS. 4A and 4B). In other words, the area of the first driver circuit 211 may be different from the area of the second driver circuit 212.

However, it is preferable that the number of wirings which electrically connect the first drive circuit 211 and the memory cell array (the memory cell array 201a or the memory cell array 201b in FIG. 1) be equal to the number of wirings which electrically connect the second driver circuit 212 and the memory cell array (the memory cell array 201a or the memory cell array 201b in FIG. 1). Accordingly, the number of address signal lines connected to the first driver circuit 211 or the second driver circuit 212 can be reduced. As a result, the scale of the circuit can be reduced, leading to a decrease in the area and size of a memory device.

Further, when the number of wirings which electrically connect the first driver circuit 211 and the memory cell array (the memory cell array 201a or the memory cell array 201b in FIG. 1) is equal to the number of wirings which electrically connect the second driver circuit 212 and the memory cell array (the memory cell array 201a or the memory cell array 201b in FIG. 1) and the first driver circuit 211 and the second driver circuit 212 are arranged so as to be substantially symmetrical with respect to the center point of the memory cell array 201a, variation in parasitic resistance or parasitic capacitance of a wiring such as a bit line or a word line can be reduced, leading to stable operation.

Although the first driver circuit 211 and the second driver circuit 212 are described here, a similar effect can be obtained with the third driver circuit 213 and the fourth driver circuit 214.

FIG. 1 and FIG. 2A illustrate the case where the number of each of the first to fourth driver circuits 211 to 214 is one; FIG. 4C illustrates the case where each of the first to fourth driver circuits 211 to 214 is divided into two.

As illustrated in FIG. 4C, a first driver circuit 211a and a second driver circuit 212a are arranged so as to be symmetrical with respect to the center point 250 of the memory cell array 201a, and a first driver circuit 211b and a second driver circuit 212b are arranged so as to be symmetrical with respect to the center point 250 of the memory cell array 201a. Similarly, a third driver circuit 213a and a fourth driver circuit 214a are arranged so as to be symmetrical with respect to the center point 250 of the memory cell array 201a, and a third driver circuit 213b and a fourth driver circuit 214b are arranged so as to be symmetrical with respect to the center point 250 of the memory cell array 201a.

The first driver circuit 211 and the second driver circuit 212 are each divided and the divided first driver circuits 211 are arranged so as to be symmetrical to the divided second driver circuits 212 with respect to the center point of the memory cell array 201a. The third driver circuit 213 and the fourth driver circuit 214 are each divided and the divided third driver circuits 213 are arranged so as to be symmetrical to the divided fourth driver circuits 214 with respect to the center point of the memory cell array 201a. Accordingly, a wasted region can be eliminated, and therefore, the area of the peripheral circuit 210 can be decreased. Furthermore, the peripheral circuit 210 can be provided under the memory cell array 201a. Thus, the size of the memory device can be reduced. Moreover, by making the area of the memory cell array 201a substantially equal to the area of the peripheral circuit 210, a wasted region can be eliminated. Thus, the area and size of the memory device can be reduced.

Note that although FIG. 4C illustrates the case where each of the first to fourth driver circuits 211 to 214 is divided into two, an embodiment of the present invention is not limited to this example. Each of the first to fourth driver circuits 211 to 214 may be divided into three or more. In any case, with the arrangement in which the first to fourth driver circuits 211 to 214 are arranged so as to be symmetrical with respect to the center point 250 of the memory cell array 201a, the above-described effect can be obtained.

This embodiment can be implemented in appropriate combination with the configurations described in the other embodiments.

(Embodiment 2)

In this embodiment, a structure and a manufacturing method of a memory device according to an embodiment of the present invention will be described with reference to FIGS. 9A and 9B, FIGS. 10A and 10B, FIGS. 11A and 11B, FIGS. 12A to 12D, FIGS. 13A to 13E, FIGS. 14A to 14D, and FIGS. 16A and 16B.

<Cross-sectional Structure of Memory Device>

Figure 9A:
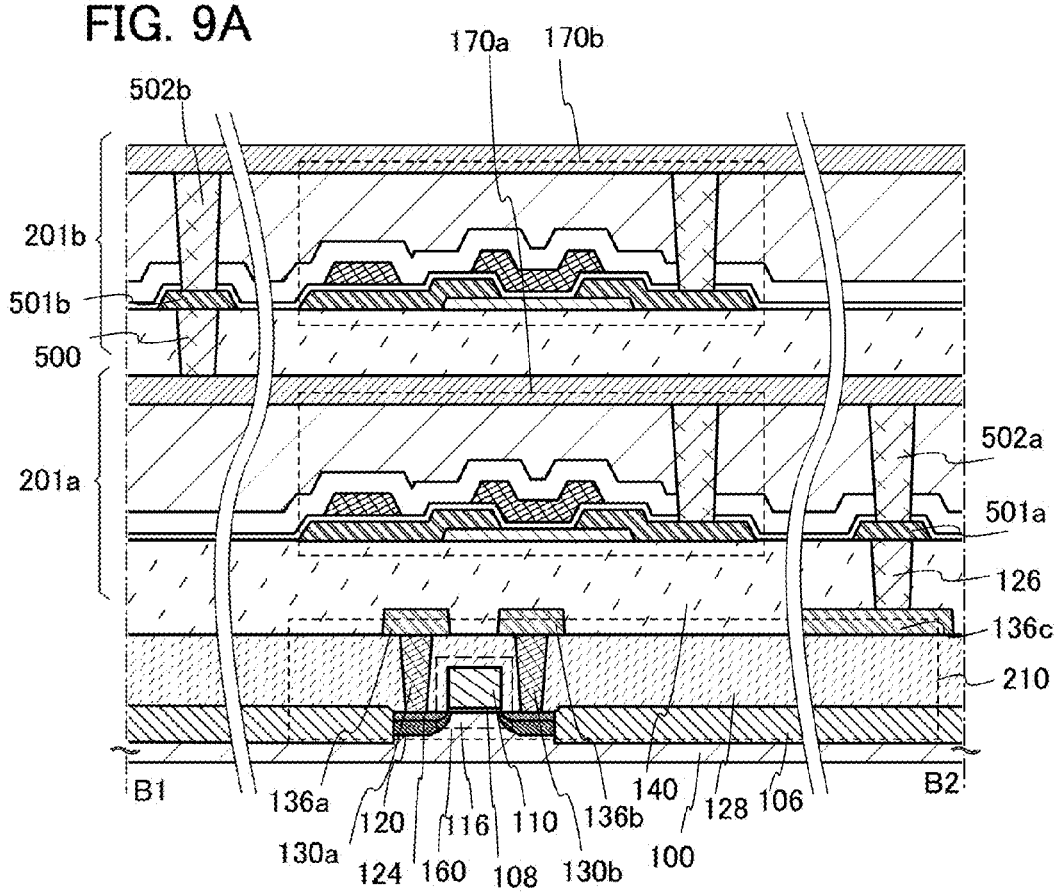
FIGS. 9A and 9B are cross-sectional views illustrating a structure of a memory device.
Figure 9B:
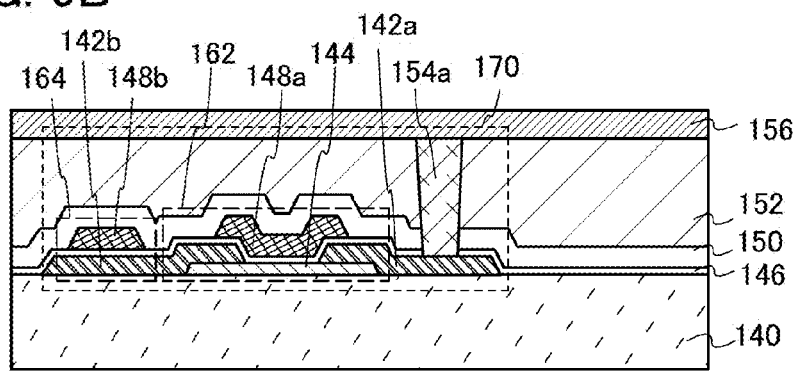
Figure 16A:
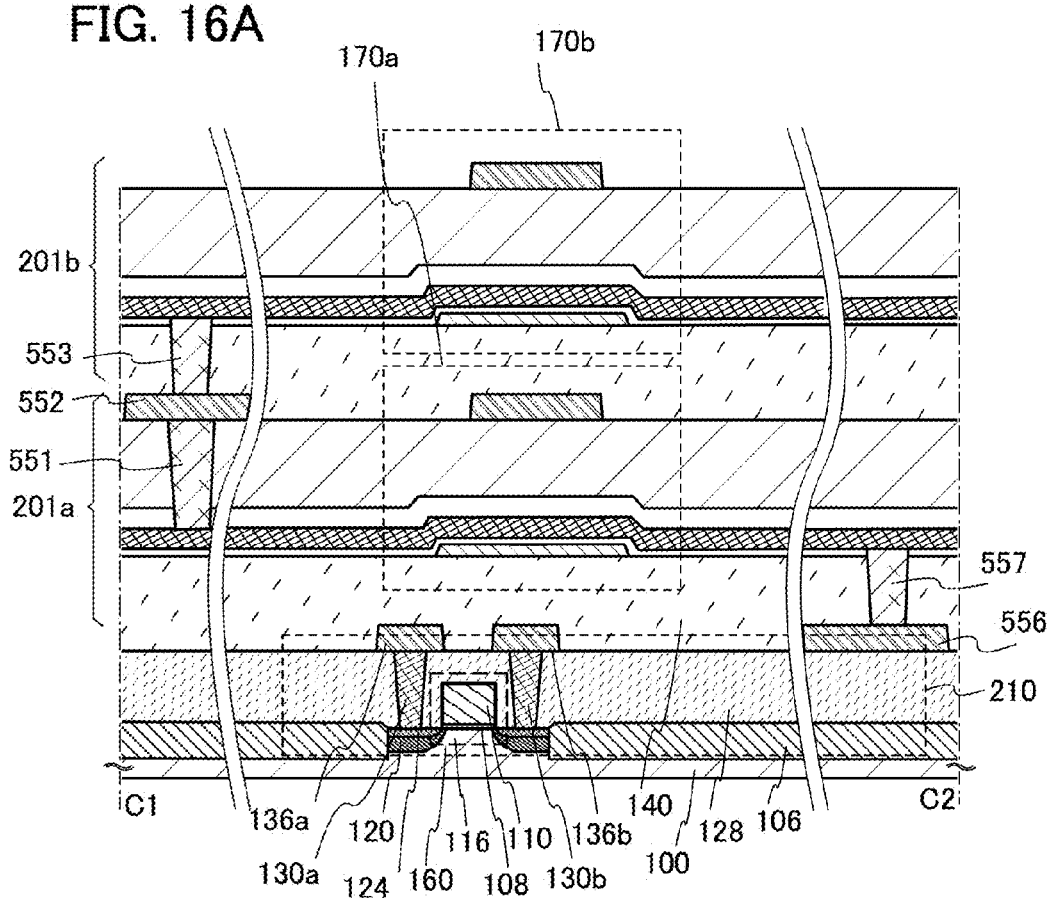
FIGS. 16A and 16B are cross-sectional views illustrating a structure of a memory device.
Figure 16B:
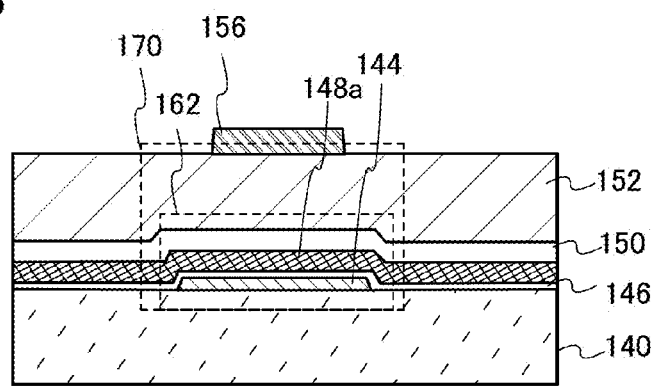

FIG. 9A and FIG. 16A are cross-sectional views of a memory device. In FIG. 9A, a cross section B1-B2 is parallel to the channel length direction of a transistor. In FIG. 16A, a cross section C1-C2 is parallel to the channel width direction of a transistor. The memory device illustrated in FIG. 9A and FIG. 16A includes the memory cell array 201a and the memory cell array 201b in the upper portion and the peripheral circuit 210 in the lower portion. A memory cell 170a included in the memory cell array 201a and a memory cell 170b included in the memory cell array 201b are illustrated as an example of the plurality of memory cells included in the memory cell array 201a and the memory cell array 201b. FIG. 9B and FIG. 16B illustrate structures of the memory cell 170a and the memory cell 170b in FIG. 9A and FIG. 16A (referred to as a structure of the memory cell 170) in detail, respectively. The memory cell 170a and the memory cell 170b can have a similar structure. The memory cell array 201a and the memory cell array 201b in the upper portion each include the transistor 162 in which an oxide semiconductor is used for a channel formation region, and the peripheral circuit 210 in the lower portion includes a transistor 160 in which a semiconductor material other than an oxide semiconductor is used for a channel formation region. Note that Embodiment 1 can be referred to for the details of the memory cell array 201a and the memory cell array 201b which are provided in the upper portion of the memory device and the peripheral circuit 210. Although a structure in which two memory cell arrays (the memory cell array 201a and the memory cell array 201b) are stacked is illustrated as an example in FIG. 9A and FIG. 16A, the number of memory cell arrays to be stacked is not limited to this.

Either an n-channel transistor or a p-channel transistor can be used as the transistor 160 and the transistor 162. Here, both the transistor 160 and the transistor 162 are n-channel transistors in the following description. The technical feature of an embodiment of the present invention is to use a semiconductor material with which off-state current can be sufficiently decreased, such as an oxide semiconductor, for a channel formation region of the transistor 162 so that data can be held. Therefore, it is not necessary to limit a specific structure of the memory device, such as a material of the memory device or a structure of the memory device, to the structure described here.

The transistor 160 includes a channel formation region 116 provided in a substrate 100 including a semiconductor material (such as silicon); impurity regions 120 provided such that the channel formation region 116 is sandwiched therebetween; metal compound regions 124 in contact with the impurity regions 120; a gate insulating layer 108 provided over the channel formation region 116; a gate electrode 110 provided over the gate insulating layer 108; and a source or drain electrode 130a and a source or drain electrode 130b electrically connected to the metal compound regions 124. In addition, an insulating layer 128 is provided so as to cover the transistor 160. The source or drain electrode 130a and the source or drain electrode 130b are electrically connected to the metal compound regions 124 through openings formed in the insulating layer 128. Over the insulating layer 128, an electrode 136a is formed in contact with the source or drain electrode 130a, and an electrode 136b is formed in contact with the source or drain electrode 130b.

Further, an element isolation insulating layer 106 is formed over the substrate 100 so as to surround the transistor 160, and the insulating layer 128 is formed over the transistor 160. Note that in order to realize higher integration, the transistor 160 preferably has a structure without a sidewall insulating layer as illustrated in FIG. 9A. On the other hand, in the case where characteristics of the transistor 160 have priority, a sidewall insulating layer may be provided on a side surface of the gate electrode 110, and the impurity regions 120 may include a region having a different impurity concentration in a region overlapping with the sidewall insulating layer.

The transistor 162 includes an oxide semiconductor layer 144 provided over the insulating layer 128 and the like; an electrode 142a and an electrode 142b which are electrically connected to the oxide semiconductor layer 144; a gate insulating layer 146 covering the oxide semiconductor layer 144, the electrode 142a, and the electrode 142b; and an electrode 148a provided over the gate insulating layer 146 so as to overlap with the oxide semiconductor layer 144. The electrode 148a serves as a gate electrode of the transistor 162. One of the electrode 142a and the electrode 142b serves as a drain electrode of the transistor 162 and the other serves as a source electrode.

Here, an oxide semiconductor layer used for a transistor, such as the oxide semiconductor layer 144, is preferably an oxide semiconductor layer which is purified by sufficiently removing an impurity such as hydrogen therefrom and then sufficiently supplying oxygen thereto. Specifically, the hydrogen concentration in the oxide semiconductor layer is $5 \times 10^{19}$ atoms/cm$^3$ or less, preferably $5 \times 10^{18}$ atoms/cm$^3$ or less, more preferably $5 \times 10^{17}$ atoms/cm$^3$ or less, for example. Note that the above hydrogen concentration in the oxide semiconductor layer is measured by secondary ion mass spectrometry (SIMS). The concentration of carriers in the oxide semiconductor layer, in which hydrogen is reduced to a sufficiently low concentration and defect states in an energy gap due to oxygen deficiency are reduced by sufficiently supplying oxygen as described above, is less than $1 \times 10^{12}$/cm$^3$, preferably less than $1 \times 10^{11}$/cm$^3$, more preferably less than $1.45 \times 10^{10}$/cm$^3$. For example, the off-state current (per unit channel width (1 μm), here) at room temperature (25° C.) is 100 zA (1 zA (zeptoampere) is $1 \times 10^{-21}$ A) or less, preferably 10 zA or less. In this manner, by using an i-type (intrinsic) or substantially i-type oxide semiconductor, a transistor (the transistor 162) which has extremely favorable off-state current characteristics can be obtained.

Further, it is preferable that the concentration of an alkali metal and an alkaline earth metal in the oxide semiconductor layer 144 be sufficiently reduced. As for the concentration of an alkali metal or an alkaline earth metal measured by SIMS, for example, the concentration of Na is $5 \times 10^{16}$ cm$^{-3}$ or lower, preferably $1 \times 10^{16}$ cm$^{-3}$ or lower, more preferably $1 \times 10^{15}$ cm$^{-3}$ or lower; the concentration of Li is $5 \times 10^{15}$ cm$^{-3}$ or lower, preferably $1 \times 10^{15}$ cm$^{-3}$ or lower; or the concentration of K is $5 \times 10^{15}$ cm$^{-3}$ or lower, preferably $1 \times 10^{15}$ cm$^{-3}$ or lower.

Note that it has been pointed out that an oxide semiconductor is insensitive to impurities, there is no problem when a considerable amount of metal impurities is contained in the film, and therefore, soda-lime glass which contains a large amount of alkali metal such as sodium and is inexpensive can also be used (Kamiya, Nomura, and Hosono, "Carrier Transport Properties and Electronic Structures of Amorphous Oxide Semiconductors: The present status", *KOTAI BUTSURI (SOLID STATE PHYSICS)*, 2009, Vol. 44, pp. 621-633). But such consideration is not appropriate. An alkali metal and an alkaline earth metal are adverse impurities for the oxide semiconductor and are preferably contained as little as possible. An alkali metal, in particular, Na diffuses into an oxide and becomes Na$^+$ when an insulating film in contact with the oxide semiconductor is an oxide. In addition, Na cuts a bond between metal and oxygen or enters the bond in the oxide semiconductor. As a result, deterioration of transistor characteristics (e.g., the shift of a threshold value to the negative side (causing the transistor to be normally on) or a decrease in mobility) is caused. In addition, this also causes variation in the characteristics. Such a problem is significant especially in the case where the hydrogen concentration in the oxide semiconductor is extremely low. Therefore, the concentration of an alkali metal is strongly required to set to the above value in the case where the hydrogen concentration in the oxide semiconductor is lower than or equal to $5 \times 10^{19}$ cm$^{-3}$, particularly lower than or equal to $5 \times 10^{18}$ cm$^{-3}$.

Note that the oxide semiconductor layer 144 may exhibit slight (weak) p-type conductivity by adding an impurity imparting p-type conductivity such as tin (Sn) to the oxide semiconductor layer 144. The oxide semiconductor layer which is purified as described above becomes i-type (intrinsic) or substantially i-type, so that the oxide semiconductor layer 144 which exhibits weak p-type conductivity can be obtained by adding a small amount of an impurity for controlling valence electrons. Thus, the threshold voltage of the transistor 162 can be slightly shifted toward the positive side. Accordingly, the transistor 162 is prevented from becoming normally on and off-state current can be further reduced. Alternatively, in order to prevent the transistor 162 from becoming normally on, a second gate electrode may be provided on a surface of the oxide semiconductor layer 144 of the transistor 162, which is opposite to the surface provided with the gate electrode (the electrode 148a), with an insulating layer provided therebetween so that the threshold voltage is controlled by the second gate electrode.

Although the oxide semiconductor layer processed in an island shape is used for the transistor 162 in order to suppress leakage among elements due to miniaturization, an oxide semiconductor layer not processed in an island shape may be used. When an oxide semiconductor layer is not processed in an island shape, the oxide semiconductor layer can be prevented from being contaminated by etching during processing.

A capacitor 164 includes the electrode 142b, the gate insulating layer 146, and a conductive layer 148b. That is, the electrode 142b functions as one electrode of the capacitor 164, and the conductive layer 148b functions as the other electrode of the capacitor 164. With such a structure, capacitance can be sufficiently secured. When the oxide semiconductor layer 144 and the gate insulating layer 146 are stacked, insulation between the electrode 142b and the conductive layer 148b can be sufficiently secured. Furthermore, in the case where no capacitor is needed, a structure in which the capacitor 164 is not provided is also possible.

Note that in the transistor 162 and the capacitor 164, the electrode 142a and the electrode 142b preferably have tapered end portions. When the electrode 142a and the electrode 142b have tapered end portions, coverage of the electrode 142a and the electrode 142b with the gate insulating layer 146 can be improved and disconnection of the gate insulating layer 146 can be prevented. Here, the taper angle is in the range of 30° to 60°, for example. Note that the "taper angle" means an angle formed by the side surface and the bottom surface of a layer having a tapered shape (for example, the electrode 142a) when observed from a cross section thereof (a plane perpendicular to the substrate surface).

An insulating layer 150 and an insulating layer 152 are provided over the transistor 162 and the capacitor 164. An electrode 154a is provided in an opening formed in the gate insulating layer 146, the insulating layer 150, the insulating layer 152, and the like, and a wiring 156 which is electrically connected to the electrode 154a is formed over the insulating layer 152. The wiring 156 is a wiring for electrically connecting one memory cell to another memory cell in each memory cell array (memory cell arrays arranged in the same layer), and can be a bit line, for example. Further, the electrode 148a is a wiring which extends in a direction of C1-C2 and electrically connects one memory cell to another memory cell in each memory cell array (memory cell arrays arranged in the same layer), and can be a word line, for example (see FIG. 16A). Although not illustrated, the conductive layer 148b is a wiring which extends in a direction of C1-C2 and electrically connects one memory cell to another memory cell in each memory cell array (memory cell arrays arranged in the same layer), and can be a capacitor line, for example.

The wiring 156 included in the memory cell array 201a is electrically connected to an electrode 136c through an electrode 502a, an electrode 501a, and an electrode 126. Thus, the peripheral circuit 210 in the lower layer and a bit line of the memory cell array 201a in the upper layer can be electrically connected to each other. Although the case where the electrode 501a is electrically connected to the electrode 136c through the electrode 126 is illustrated in FIG. 9A, it is not limited thereto. After an opening reaching the electrode 136c is provided in the insulating layer 140 under the memory cell array 201a, the electrode 501a is formed, whereby the electrode 501a and the electrode 136c may be in direct contact with each other.

The electrode 148a is electrically connected to an electrode 556 through an electrode 557. Thus, the peripheral circuit 210 in the lower layer and a word line of the memory cell array 201a in the upper layer can be electrically connected to each other. Although the case where the electrode 148a is electrically connected to the electrode 556 through the electrode 557 is illustrated in FIG. 16A, it is not limited thereto. After an opening reaching the electrode 556 is provided in the insulating layer 140 under the memory cell array 201a, the electrode 148a is formed, whereby the electrode 148a and the electrode 556 may be in direct contact with each other.

Although not illustrated, like the word line of the memory cell array 201a, the conductive layer 148b serving as a capacitor line can also be electrically connected to the peripheral circuit 210 in the lower layer.

Next, a method for electrically connecting wirings of a plurality of memory cell arrays is described.

The case where the bit line included in the memory cell array 201a is electrically connected to the bit line included in the memory cell array 201b is described with reference to FIG. 9A.

The wiring 156 serving as the bit line included in the memory cell array 201a and the wiring 156 serving as the bit line included in the memory cell array 201b are electrically connected to each other through an electrode 500, an electrode 501b, and an electrode 502b. In FIG. 9A, after an opening reaching the wiring 156 of the memory cell array 201a is formed in the insulating layer 140 under the memory cell array 201b, the electrode 501b may be formed, whereby the electrode 501b and the wiring 156 of the memory cell array 201a may be in direct contact with each other.

Although an example in which the position where an electrode for electrically connecting the bit line of the memory cell array 201a to the peripheral circuit 210 is formed and the position where an electrode for electrically connecting the bit line of the memory cell array 201a to the bit line of the memory cell array 201b are greatly different in the plane layout is illustrated in FIG. 9A, it is not limited thereto. Bit lines of a plurality of memory cell arrays can be connected at various positions. For example, an electrode for electrically connecting the bit line of the memory cell array 201a to the bit line of the memory cell array 201b may be formed to overlap with an electrode for electrically connecting the bit line of the memory cell array 201a to the peripheral circuit 210. In the case where three or more memory cell arrays are stacked to overlap, connection positions of bit lines of the plurality of memory cell arrays may overlap with one another, for example. With a planar layout in which connection positions overlap with one another, an increase in the element area due to a contact region can be prevented. In other words, the degree of integration of the memory device can be increased.

The case where the word line included in the memory cell array 201a is electrically connected to the word line included in the memory cell array 201b is described with reference to FIG. 16A.

The electrode 148a serving as the word line included in the memory cell array 201a and the electrode 148a serving as the word line included in the memory cell array 201b are electrically connected to each other through an electrode 551, an electrode 552, and an electrode 553. In FIG. 16A, after an opening reaching the electrode 552 of the memory cell array 201a is formed in the insulating layer 140 under the memory cell array 201b, the electrode 148a of the memory cell array 201b may be formed, whereby the electrode 148a of the memory cell array 201b and the electrode 552 of the memory cell array 201a may be in direct contact with each other.

Although an example in which the position where an electrode for electrically connecting the word line of the memory cell array 201a to the peripheral circuit 210 is formed and the position where an electrode for electrically connecting the word line of the memory cell array 201a to the word line of the memory cell array 201b are greatly different in the plane layout is illustrated in FIG. 16A, it is not limited thereto. Word lines of a plurality of memory cell arrays can be connected at various positions. For example, an electrode for electrically connecting the word line of the memory cell array 201a to the word line of the memory cell array 201b may be formed to overlap with an electrode for electrically connecting the word line of the memory cell array 201a to the peripheral circuit 210. In the case where three or more memory cell arrays are stacked to overlap, connection positions of word lines of the plurality of memory cell arrays may overlap with one another, for example. With a planar layout in which connection positions overlap with one another, an increase in the element area due to a contact region can be prevented. In other words, the degree of integration of the memory device can be increased.

Although not illustrated, capacitor lines of the plurality of memory cell arrays can be electrically connected to each other in a manner similar to that of the word lines.

In the memory device illustrated in FIG. 9A and FIG. 16A, the insulating layer 140 is provided between the memory cell array 201a in the upper portion and the peripheral circuit 210 in the lower portion. The feature of an embodiment of the present invention is that a plurality of memory cell array is stacked. Therefore, it is desirable that the surface of the insulating layer 140 and the surface of the insulating layer 152 be planarized by CMP or the like.

The transistor 160 includes a semiconductor material other than an oxide semiconductor in a channel formation region. The semiconductor material other than an oxide semiconductor may be, for example, silicon, germanium, silicon germanium, silicon carbide, gallium arsenide, or the like and is preferably a single crystal semiconductor. Alternatively, an organic semiconductor material or the like may be used. A transistor including such a semiconductor material can operate at sufficiently high speed. Therefore, a transistor including a material other than an oxide semiconductor can favorably realize a variety of circuits (e.g., a logic circuit or a driver circuit) which needs to operate at high speed.

On the other hand, the transistor 162 includes an oxide semiconductor material in a channel formation region. A transistor including an oxide semiconductor material disclosed in this specification and the like can realize an extremely small off-state current. Owing to this feature, the memory cell 170 can hold stored data for an extremely long time. In other words, refresh operation becomes unnecessary or the frequency of the refresh operation can be extremely lowered, which leads to a sufficient reduction in power consumption. Moreover, stored data can be held for a long period even when power is not supplied. Further, when a normally-off (enhancement) transistor is used as the transistor 162, and power is not supplied, a ground potential may be input to the gate of the transistor 162. With that structure, the transistor 162 can remain off and stored data can be kept held even when power is not supplied.

Further, the memory cell 170 does not require high voltage for writing data and does not have the problem of deterioration of elements. For example, unlike a conventional nonvolatile memory, it is not necessary to inject and extract electrons into and from a floating gate, and thus a problem such as deterioration of a gate insulating layer does not arise at all. That is, the memory cell 170 does not have a limitation on the number of times data can be rewritten, which is a problem of a conventional nonvolatile memory, and the reliability thereof is drastically improved. Furthermore, since data is written by turning on or off the transistor 162, high-speed operation can be easily realized. Additionally, there is an advantage in that operation for erasing data is not needed.

A memory device having a novel feature can be realized by being provided with both a peripheral circuit such as a driver circuit including a transistor including a material other than an oxide semiconductor (in other words, a transistor capable of operating at sufficiently high speed) and a memory circuit including a transistor including an oxide semiconductor (in a broader sense, a transistor whose off-state current is sufficiently small).

A driver circuit and a control circuit included in the peripheral circuit 210 illustrated in FIG. 9 are arranged as illustrated in FIG. 1 and FIGS. 2A and 2B. Accordingly, the area and size of the memory device can be decreased.

<Cross-sectional Structure and Planar Structure of Memory Cell>

Figure 10A:
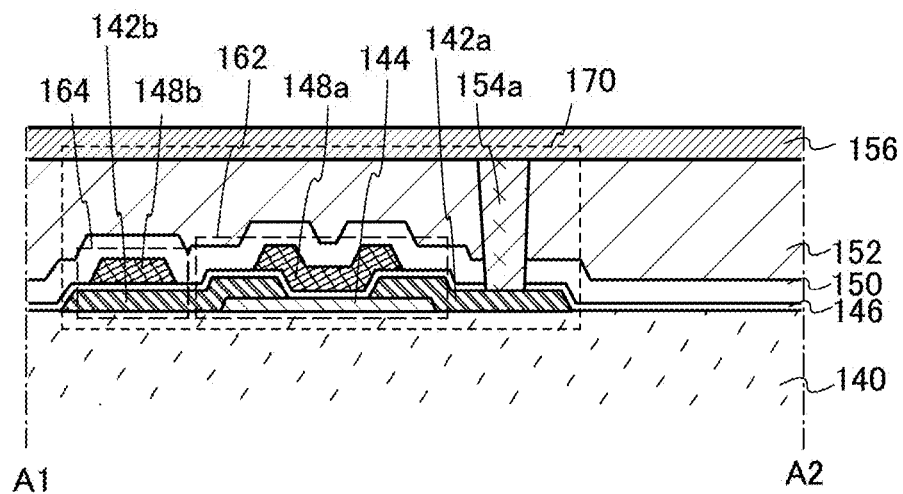
FIGS. 10A and 10B are respectively a cross-sectional view and a top view illustrating a structure of a memory cell.
Figure 10B:
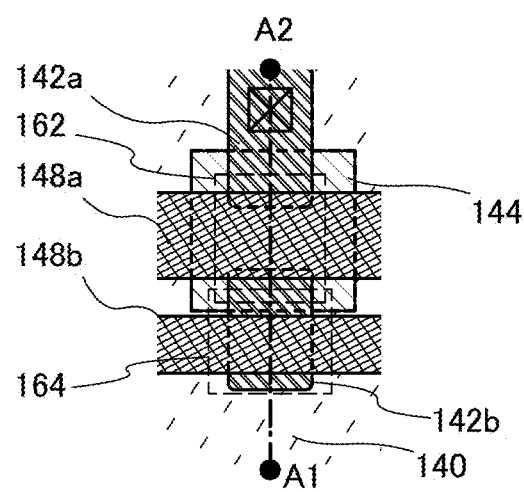

FIGS. 10A and 10B illustrate an example of a structure of the memory cell. FIG. 10A is a cross-sectional view of the memory cell, and FIG. 10B is a plan view of the memory cell. Here, FIG. 10A corresponds to a cross section along line A1-A2 in FIG. 10B. The memory cell illustrated in FIGS. 10A and 10B includes the transistor 162 including an oxide semiconductor. The transistor 162 including an oxide semiconductor can hold charge for a long time owing to its characteristics. Note that the memory cell illustrated in FIGS. 10A and 10B corresponds to the circuit diagram of the memory cell illustrated in FIG. 5.

Since the structure of the memory cell illustrated in FIGS. 10A and 10B is similar to the structure illustrated in FIG. 9B or FIG. 16B, the same portions are denoted by the same reference numerals and description is omitted.

FIGS. 11A and 11B, FIGS. 12A to 12D, FIGS. 17A to 17D, and FIGS. 18A to 18D each illustrate an example of a structure of a memory cell which is different from that in FIGS. 10A and 10B.

Figure 11A:
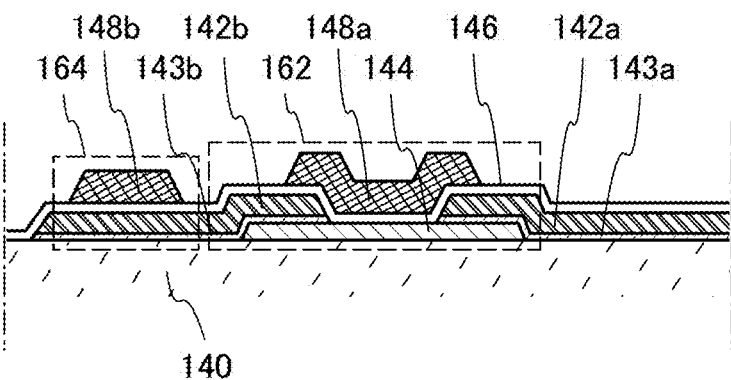
FIGS. 11A and 11B are cross-sectional views each illustrating a structure of a memory cell.

In a transistor 162 illustrated in FIG. 11A, oxide conductive layers 143a and 143b serving as source and drain regions are provided between the oxide semiconductor layer 144 and the electrodes 142a and 142b. By providing the oxide conductive layers 143a and 143b serving as source and drain regions between the oxide semiconductor layer 144 and the electrodes 142a and 142b, the resistance of the source and drain regions can be decreased and the transistor 162 can be made to operate at high speed. By stacking the oxide semiconductor layer 144, the oxide conductive layers, and the source or drain electrodes, the withstand voltage of the transistor 162 can be increased. A capacitor 164 includes the oxide conductive layer 143b, the electrode 142b, the gate insulating layer 146, and the conductive layer 148b.

Figure 11B:
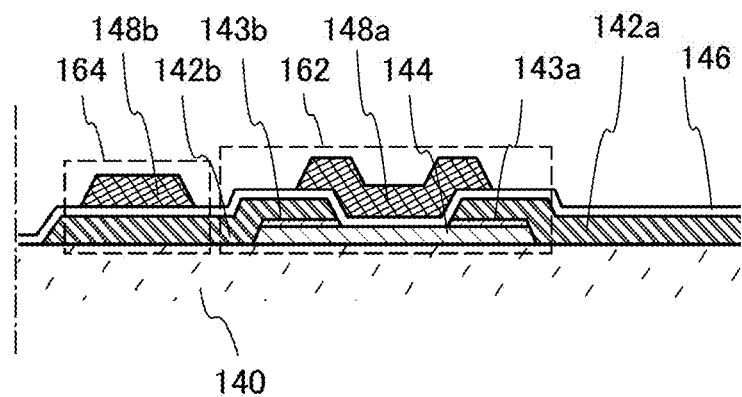

A transistor 162 illustrated in FIG. 11B is similar to the transistor 162 in FIG. 11A in that the oxide conductive layers 143a and 143b serving as source or drain regions are provided between the oxide semiconductor layer 144 and the electrodes 142a and 142b. In the transistor 162 illustrated in FIG. 11A, the oxide conductive layers 143a and 143b are in contact with the upper and side surfaces of the oxide semiconductor layer 144. On the other hand, in the transistor 162 illustrated in FIG. 11B, the oxide conductive layers 143a and 143b are in contact with the upper surface of the oxide semiconductor layer 144. Even in the case of such a structure, the resistance of the source or drain regions can be decreased and the transistor 162 can be operated at high speed. By stacking the oxide semiconductor layer 144, the oxide conductive layers, and the source or drain electrodes, the withstand voltage of the transistor 162 can be increased. The description of FIGS. 10A and 10B or the like can be referred to for the structure of a capacitor 164.

Figure 12A:
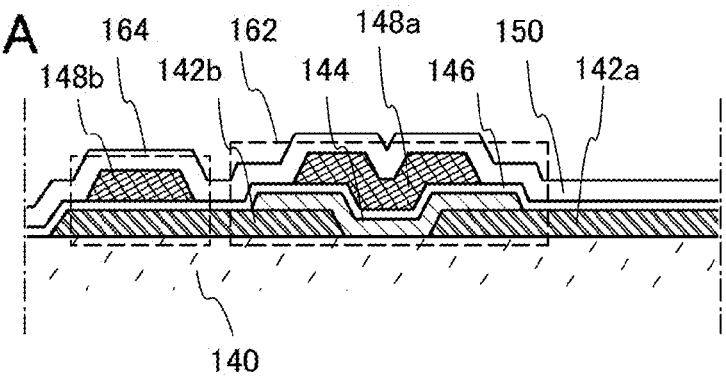
FIGS. 12A to 12D are cross-sectional views each illustrating a structure of a memory cell.

A transistor 162 illustrated in FIG. 12A is similar to the transistor 162 illustrated in FIGS. 10A and 10B in that the electrodes 142a and 142b, the oxide semiconductor layer 144, the gate insulating layer 146, and the electrode 148a are provided over the insulating layer 140. A difference between the transistor 162 illustrated in FIG. 12A and the transistor 162 illustrated FIGS. 10A and 10B is the position where the oxide semiconductor layer 144 and the electrodes 142a and 142b are electrically connected to each other. In other words, in the transistor 162 illustrated in FIGS. 10A and 10B, at least part of the upper surface of the oxide semiconductor layer 144 is in contact with the electrodes 142a and 142b as a result of forming the electrodes 142a and 142b after forming the oxide semiconductor layer 144. On the other hand, in the transistor 162 illustrated in FIG. 12A, part of the upper surfaces of the electrodes 142a and 142b is in contact with the oxide semiconductor layer 144. The description of FIGS. 10A and 10B or the like can be referred to for the structure of a capacitor 164.

Figure 12B:
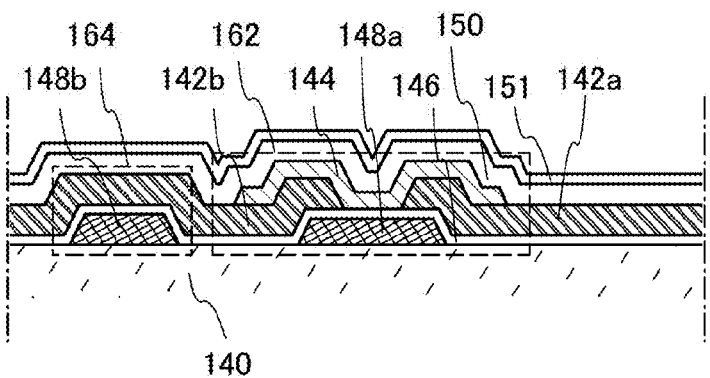
Figure 12C:
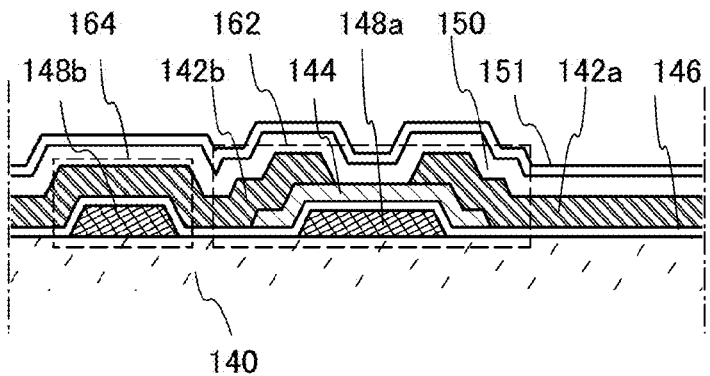

Although FIGS. 10A and 10B, FIGS. 11A and 11B, and FIG. 12A illustrate top-gate transistors, bottom-gate transistors may be used. FIGS. 12B and 12C illustrate bottom-gate transistors.

In a transistor 162 illustrated in FIG. 12B, the electrode 148a is provided over the insulating layer 140; the gate insulating layer 146 is provided over the electrode 148a; the electrodes 142a and 142b are provided over the gate insulating layer 146; and the oxide semiconductor layer 144 is provided over the gate insulating layer 146 and the electrodes 142a and 142b so as to overlap with the gate electrode 148a. A capacitor 164 includes the conductive layer 148b, the gate insulating layer 146, and the electrode 142b which are provided over the insulating layer 140.

An insulating layer 150 and an insulating layer 151 are provided over the transistor 162 and the capacitor 164. The insulating layer 152 in FIG. 10A is provided over the insulating layer 151.

A transistor 162 illustrated in FIG. 12C is similar to the transistor 162 illustrated in FIG. 12B in that the electrode 148a, the gate insulating layer 146, the electrodes 142a and 142b, and the oxide semiconductor layer 144 are provided over the insulating layer 140. A difference between the transistor 162 illustrated in FIG. 12C and the transistor 162 illustrated FIG. 12B is the position of contact between the oxide semiconductor layer 144 and the electrodes 142a and 142b. In other words, in the transistor 162 illustrated in FIG. 12B, at least part of the lower surface of the oxide semiconductor layer 144 is in contact with the electrodes 142a and 142b as a result of forming the oxide semiconductor layer 144 after forming the electrodes 142a and 142b. On the other hand, in the transistor 162 illustrated in FIG. 12C, part of the lower surfaces of the electrodes 142a and 142b is in contact with the oxide semiconductor layer 144. The description of FIG. 12B can be referred to for the structure of a capacitor 164 or the like.

Figure 12D:
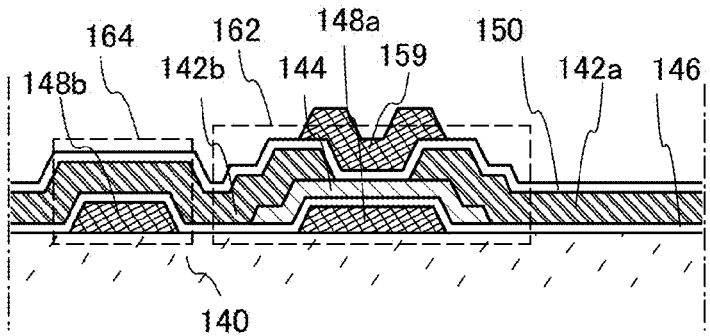

Moreover, the transistor 162 may have a dual-gate structure including two gate electrodes positioned above and below a channel formation region with gate insulating layers provided therebetween. FIG. 12D illustrates a dual-gate transistor.

The transistor 162 illustrated in FIG. 12D is similar to the transistor 162 illustrated in FIG. 12B in that the electrode 148a, the gate insulating layer 146, the electrodes 142a and 142b, and the oxide semiconductor layer 144 are provided over the insulating layer 140. In FIG. 12D, additionally, the insulating layer 150 is provided so as to cover the electrodes 142a and 142b and the oxide semiconductor layer 144, and a conductive layer 159 is provided over the insulating layer 150 so as to overlap with the oxide semiconductor layer 144. The insulating layer 150 functions as a second gate insulating layer of the transistor 162, and the conductive layer 159 functions as a second gate electrode of the transistor 162. With such a structure, in a bias-temperature stress test (hereinafter referred to as a BT test) for examining reliability of the transistor 162, the amount of change in threshold voltage of the transistor 162 through the BT test can be reduced. The potential of the conductive layer 159 may be the same as or different from that of the electrode 148a. The potential of the conductive layer 159 may be GND or 0 V, or the conductive layer 159 may be in a floating state.

Although the structure in which the capacitor 164 includes the electrode 148b, the gate insulating layer 146, and the electrode 142b is illustrated in FIGS. 11A and 11B and FIGS. 12A to 12D, it is not limited thereto. The capacitor 164 is provided so as to overlap with the transistor 162, whereby the area of a memory cell can be reduced. Thus, memory capacity per unit area of the memory device can be increased. Further, in the case where parasitic capacitance is generated in capacitance between wirings, it can be used instead of the capacitor 164.

Figure 17A:
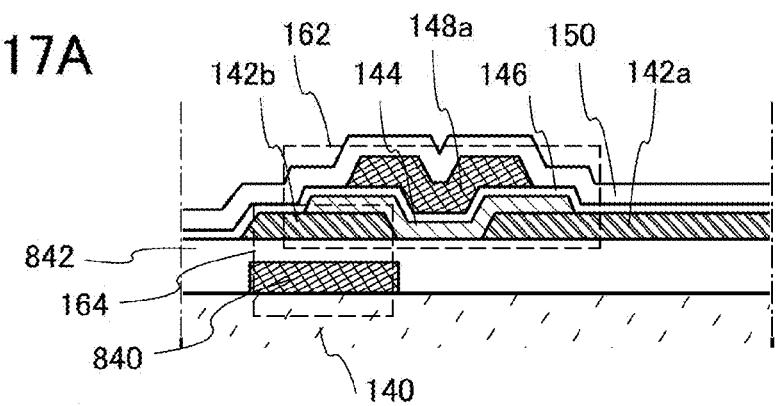
FIGS. 17A to 17D are cross-sectional views each illustrating a structure of a memory cell.

For example, as illustrated in FIG. 17A, the capacitor 164 can include the electrode 142b, an insulating layer 842, and an electrode 840 which overlaps with the electrode 142b with the insulating layer 842 provided therebetween. Note that in FIG. 17A, other structures are similar to those in FIG. 12A.

Figure 17B:
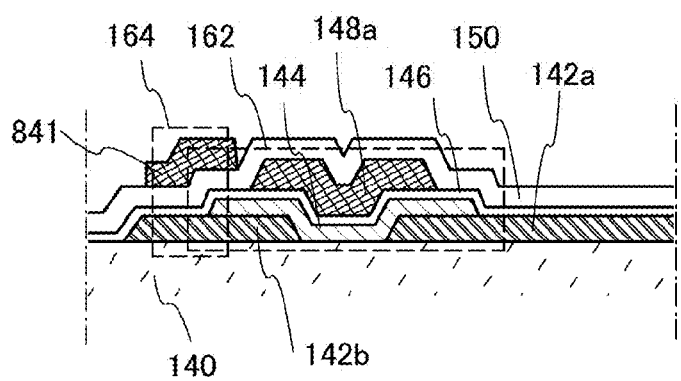

For example, as illustrated in FIG. 17B, the capacitor 164 can include the electrode 142b, the insulating layer 150, the gate insulating layer 146, and an electrode 841 which overlaps with the electrode 142b with the insulating layer 150 and the gate insulating layer 146 provided therebetween. Note that in FIG. 17B, other structures are similar to those in FIG. 12A. Note that in FIG. 17B, it is preferable that the electrode 841 and the electrode 148a be provided so as not to overlap with each other.

Figure 17C:
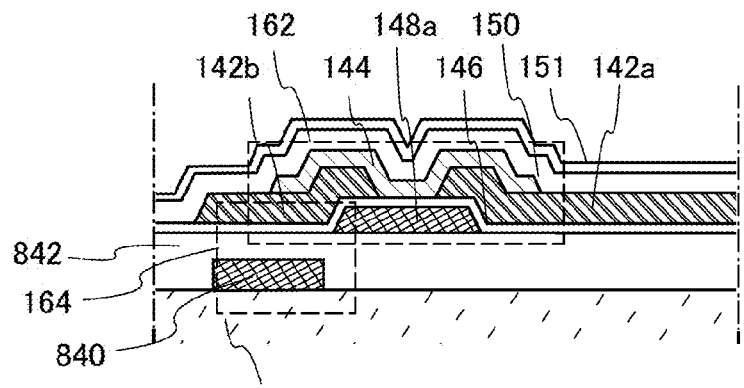

For example, as illustrated in FIG. 17C, the capacitor 164 can include the electrode 142b, the insulating layer 842, the gate insulating layer 146, and the electrode 840 which overlaps with the electrode 142b with the insulating layer 842 and the gate insulating layer 146 provided therebetween. Note that in FIG. 17C, other structures are similar to those in FIG. 12B. Note that in FIG. 17C, it is preferable that the electrode 840 and the electrode 148a be provided so as not to overlap with each other.

Figure 17D:
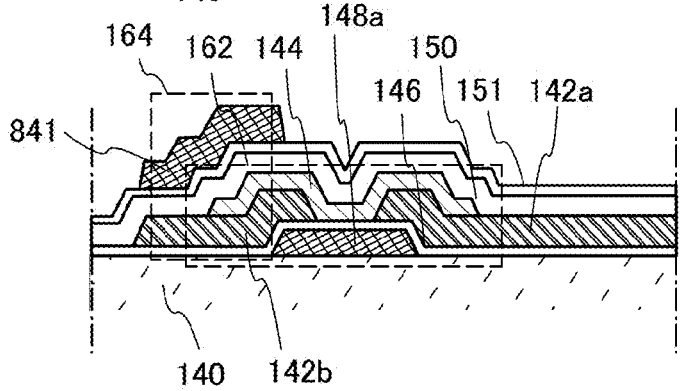

For example, as illustrated in FIG. 17D, the capacitor 164 can include the electrode 142b, the insulating layer 150, the insulating layer 151, and the electrode 841 which overlaps with the electrode 142b with the insulating layer 150 and the insulating layer 151 provided therebetween. Note that in FIG. 17D, other structures are similar to those in FIG. 12B. Although an example in which both the insulating layer 150 and the insulating layer 151 are used as dielectric layers of the capacitor 164 is illustrated in FIG. 17D, it is not limited thereto. Only the insulating layer 150 may be used as a dielectric layer of the capacitor 164.

Figure 18A:
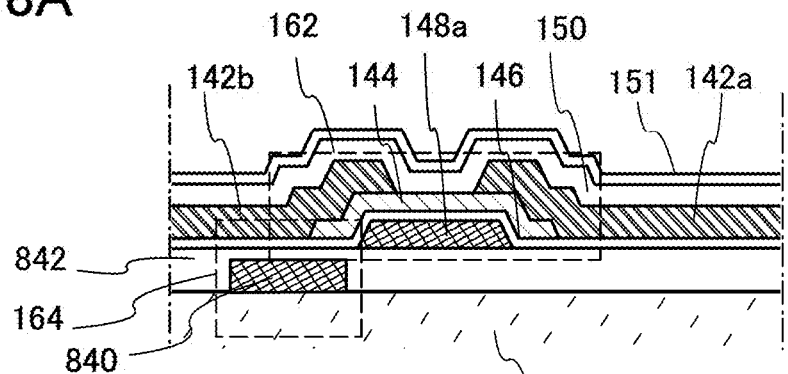
FIGS. 18A to 18D are cross-sectional views each illustrating a structure of a memory cell.

For example, as illustrated in FIG. 18A, the capacitor 164 can include the electrode 142b, the insulating layer 842, the gate insulating layer 146, and the electrode 840 which overlaps with the electrode 142b with the insulating layer 842 and the gate insulating layer 146 provided therebetween. Note that in FIG. 18A, other structures are similar to those in FIG. 12C. Note that in FIG. 18A, it is preferable that the electrode 840 and the electrode 148a be provided so as not to overlap with each other.

Figure 18B:
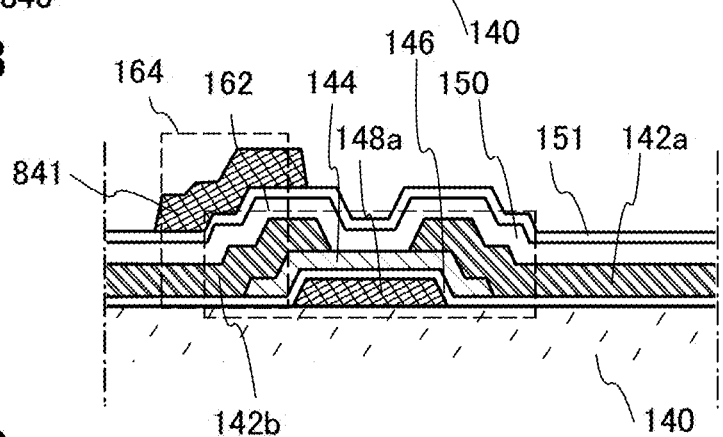

For example, as illustrated in FIG. 18B, the capacitor 164 can include the electrode 142b, the insulating layer 150, the insulating layer 151, and the electrode 841 which overlaps with the electrode 142b with the insulating layer 150 and the insulating layer 151 provided therebetween. Note that in FIG. 18B, other structures are similar to those in FIG. 12C. Although an example in which both the insulating layer 150 and the insulating layer 151 are used as dielectric layers of the capacitor 164 is illustrated in FIG. 18B, it is not limited thereto. Only the insulating layer 150 may be used as a dielectric layer of the capacitor 164.

Figure 18C:
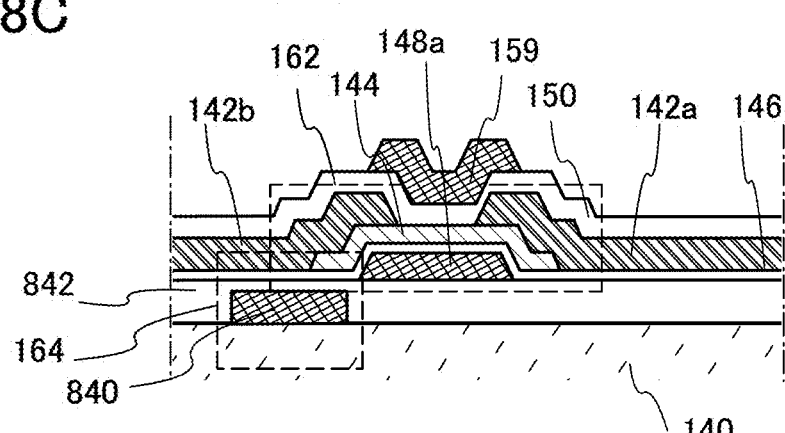

For example, as illustrated in FIG. 18C, the capacitor 164 can include the electrode 142b, the insulating layer 842, the gate insulating layer 146, and the electrode 840 which overlaps with the electrode 142b with the insulating layer 842 and the gate insulating layer 146 provided therebetween. Note that in FIG. 18C, other structures are similar to those in FIG. 12D. Note that in FIG. 18C, it is preferable that the electrode 840 and the electrode 148a be provided so as not to overlap with each other.

Figure 18D:
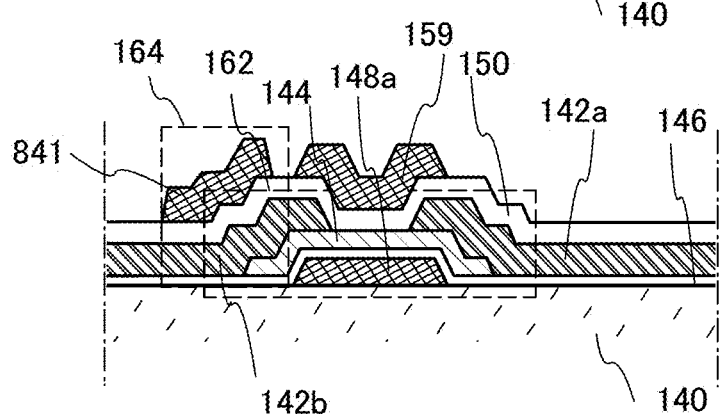

For example, as illustrated in FIG. 18D, the capacitor 164 can include the electrode 142b, the insulating layer 150, and the electrode 841 which overlaps with the electrode 142b with the insulating layer 150 provided therebetween. Note that in FIG. 18D, other structures are similar to those in FIG. 12D.

Note that any of the structures of the capacitor 164 of the memory cell illustrated in FIGS. 17A to 17D and FIGS. 18A to 18D can be applied to the structures of the memory cells illustrated in FIGS. 11A and 11B.

Figure 37A:
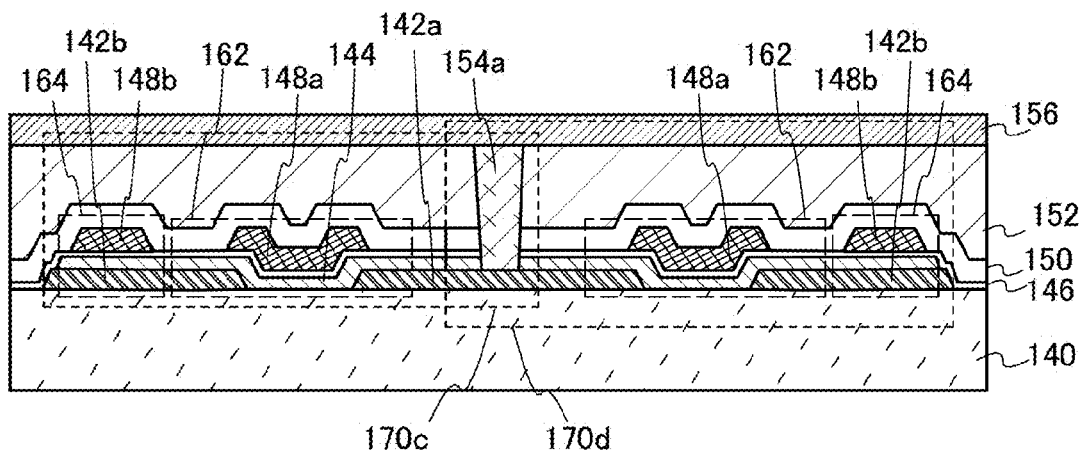
FIGS. 37A and 37B are cross-sectional views each illustrating a structure of a memory device.
Figure 37B:
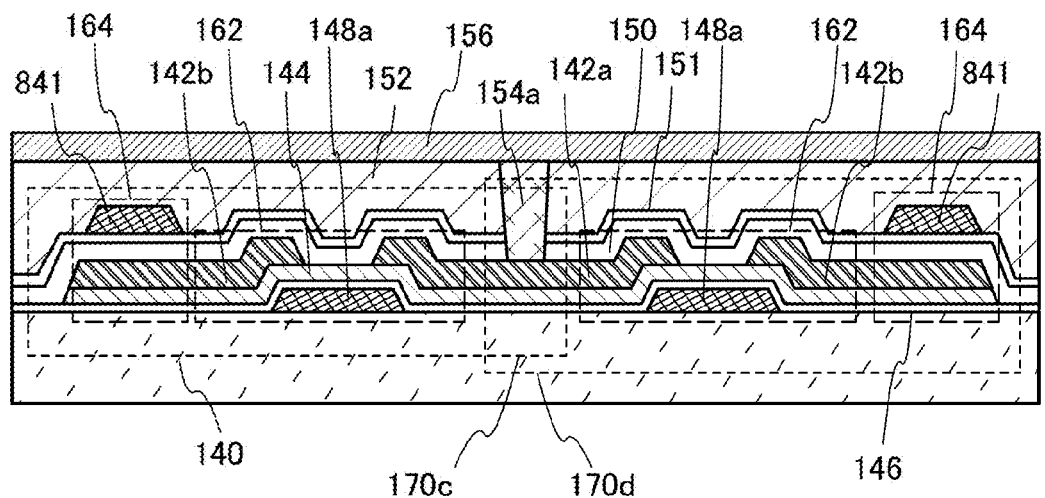

As illustrated in FIGS. 37A and 37B, the electrode 154a can be shared between two adjacent memory cells 170c and 170d. When the electrode 154a (and the opening which is provided with the electrode) is shared between the two adjacent memory cells, higher integration of a memory cell array can be achieved.

In the memory cell 170c and the memory cell 170d in FIG. 37A, each of which includes a transistor 162 having a structure similar to that of the transistor 162 illustrated in FIG. 12A and a capacitor 164 having a structure in which the oxide semiconductor layer 144 is also included as its dielectric layer in addition to the structure of the capacitor illustrated in FIG. 12A, the electrode 154a for electrically connecting the wiring 156 serving as a bit line and a source or a drain of the transistor 162 is shared.

In the memory cell 170c and the memory cell 170d in FIG. 37B, each of which includes a transistor 162 having a structure similar to that of the transistor 162 illustrated in FIG. 18B and a capacitor 164 having a structure similar to that of the capacitor 164 illustrated in FIG. 18B, the electrode 154a for electrically connecting the wiring 156 serving as a bit line and a source or a drain of the transistor 162 is shared.

Figure 19A:
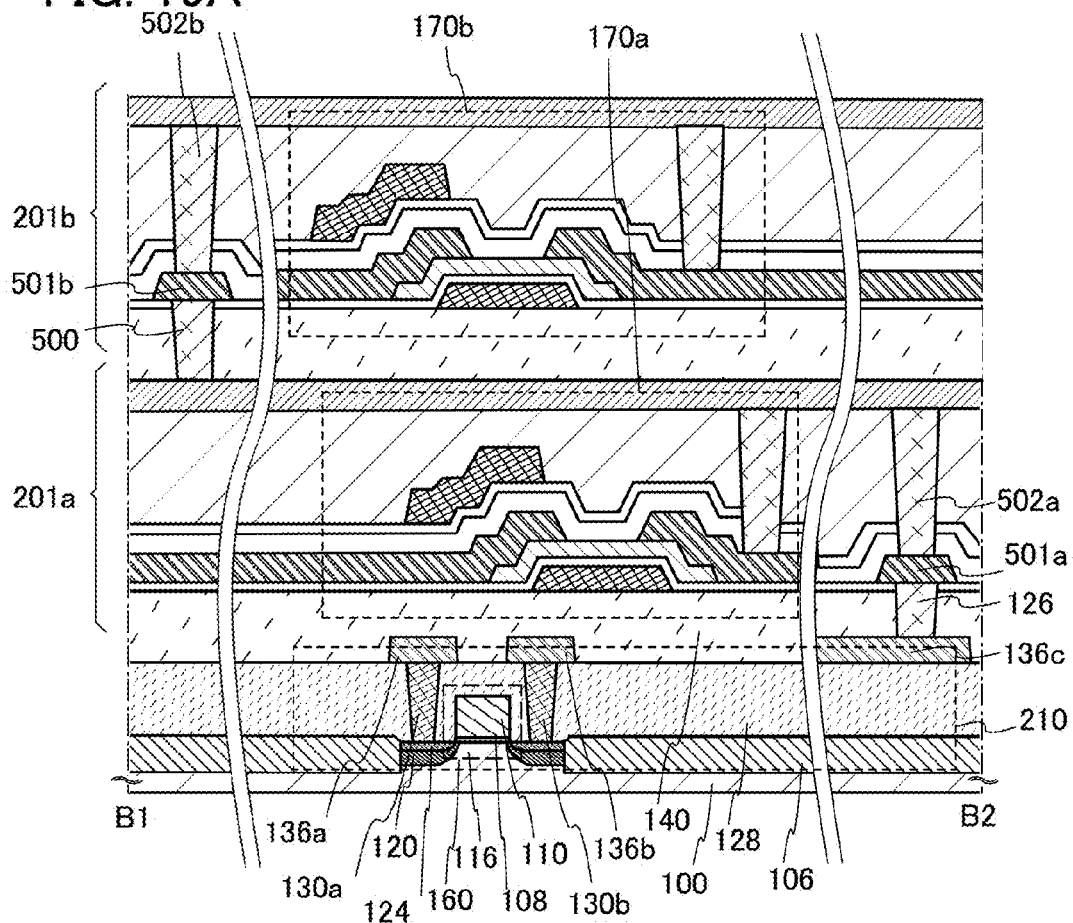
FIGS. 19A and 19B are cross-sectional views illustrating a structure of a memory device.
Figure 19B:
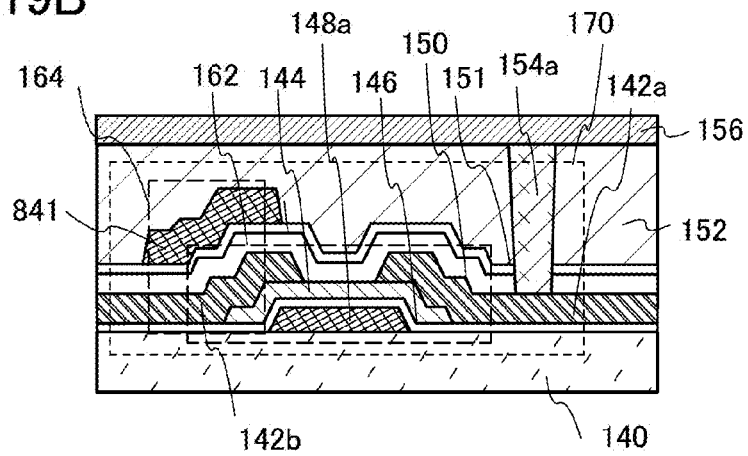

Further, an example in which the memory cell illustrated in FIG. 18B is used as the memory cell 170 in the structure of the memory device illustrated in FIGS. 9A and 9B is illustrated in FIGS. 19A and 19B. In FIGS. 19A and 19B, the same portions as those in FIGS. 9A and 9B and FIG. 18B are denoted by the same reference numerals and description is omitted. In the memory cell illustrated in FIG. 18B, the area of a memory cell can be reduced. Therefore, in the memory device illustrated in FIGS. 19A and 19B, memory capacity per unit area can be increased.

Note that memory cells to be stacked are not limited to the memory cell illustrated in FIG. 18B; memory cells having any of structures illustrated in FIGS. 17A to 17D and FIGS. 18A to 18D can be used. Alternatively, a memory cell may have a structure in which a structure of a capacitor is different from those illustrated in FIGS. 17A to 17D and FIGS. 18A to 18D.

<Method for Manufacturing Memory Cell Array>

Next, a method for manufacturing a memory cell array is described with reference to FIGS. 13A to 13E. Although one memory cell is illustrated as an example in FIGS. 13A to 13E, a plurality of memory cells can be manufactured at the same time to form a memory cell array. Further, by repeating the method similar to that illustrated in FIGS. 13A to 13E, a plurality of memory cell arrays stacked to be multilayered can be formed.

Figure 13A:
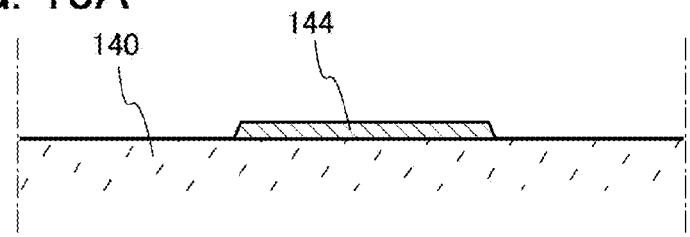
FIGS. 13A to 13E illustrate a method for manufacturing a memory cell.

First, the oxide semiconductor layer 144 is formed by forming an oxide semiconductor layer over the insulating layer 140 and then by processing the oxide semiconductor layer (see FIG. 13A).

The insulating layer 140 is formed using a material including an inorganic insulating material such as silicon oxide, silicon oxynitride, silicon nitride oxide, silicon nitride, or aluminum oxide. It is preferable to use a low dielectric constant (low-k) material for the insulating layer 140 because capacitance due to overlap of electrodes or wirings can be sufficiently reduced. Note that a porous insulating layer with any of the above materials may be employed as the insulating layer 140. A porous insulating layer has a lower dielectric constant than an insulating layer with high density, and thus allows a further reduction in capacitance generated by electrodes or wirings. Alternatively, the insulating layer 140 can be formed using an organic insulating material such as polyimide or acrylic. The insulating layer 140 can be formed to have a single-layer structure or a stacked-layer structure using the above-described material. In this embodiment, the case of using silicon oxide for the insulating layer 140 is described.

An oxide semiconductor used for the oxide semiconductor layer 144 preferably contains at least indium (In) or zinc (Zn). It is particularly preferable that In and Zn be contained. As a stabilizer for reducing change in electrical characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or more lanthanoids which include lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

For the oxide semiconductor layer 144, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide containing In, Ga, and Zn as its main components and there is no particular limitation on the ratio of In:Ga:Zn. Further, a metal element in addition to In, Ga, and Zn may be contained.

The oxide semiconductor layer 144 may be formed using a material represented by the chemical formula, $InMO_3(ZnO)_m$ (m>0, where m is not an integer). Note that M represents one or more metal elements selected from Ga, Fe, Mn, and Co. Alternatively, a material represented by $In_3SnO_5(ZnO)_n$ (n>0, where n is an integer) may be used as an oxide semiconductor.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, the composition is not limited to those described above, and a material having an appropriate composition may be used in accordance with necessary semiconductor characteristics (such as mobility, threshold voltage, and variation). In order to obtain necessary semiconductor characteristics, it is preferable that the carrier density, the impurity concentration, the defect density, the atomic ratio of a metal element to oxygen, the interatomic distance, the density, and the like be set as appropriate.

For example, with the In—Sn—Zn-based oxide, a high mobility can be relatively easily obtained. However, the mobility can be increased by reducing the defect density in the bulk also in the case of using the In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \le r^2$, and r may be 0.05, for example. The same applies to other oxides.

The oxide semiconductor layer 144 may be either single crystal or non-single-crystal. In the latter case, the oxide semiconductor layer 144 may be either amorphous or polycrystalline. Further, the oxide semiconductor may have either an amorphous structure including a crystalline portion or a non-amorphous structure.

An amorphous oxide semiconductor can have a flat surface with relative ease; therefore, when a transistor is manufactured with the use of the oxide semiconductor, interface scattering can be reduced, and relatively high mobility can be obtained with relative ease.

In a crystalline oxide semiconductor, defects in the bulk can be further reduced and when a surface flatness is improved, mobility higher than that of an amorphous oxide semiconductor can be obtained. In order to improve the surface flatness, the oxide semiconductor is preferably formed over a flat surface. Specifically, the oxide semiconductor is preferably formed over a surface with an average surface roughness ($R_a$) of less than or equal to 1 nm, preferably less than or equal to 0.3 nm, more preferably less than or equal to 0.1 nm.

Note that $R_a$ is obtained by three-dimensionally expanding centerline average roughness that is defined by JIS B 0601 so as to be able to be applied to a surface. $R_a$ can be expressed as an "average value of the absolute values of deviations from a reference surface to a specific surface" and is defined by the following formula.

$$R_a = \frac{1}{S_0} \int_{y_1}^{y_2} \int_{x_1}^{x_2} |f(x, y) - Z_0| dx dy \quad \text{[Formula 1]}$$

Note that, in the above formula, $S_0$ represents the area of a measurement surface (a rectangular region which is defined by four points represented by the coordinates $(x_1, y_1)$, $(x_1, y_2)$, $(x_2, y_1)$, and $(x_2, y_2)$), and $Z_0$ represents average height of a measurement surface. $R_a$ can be measured using an atomic force microscope (AFM).

The thickness of the oxide semiconductor layer 144 is preferably greater than or equal to 3 nm and less than or equal to 30 nm. This is because the transistor might be normally on when the oxide semiconductor layer is too thick (e.g., when the thickness is greater than or equal to 50 nm).

The oxide semiconductor layer 144 is preferably formed by a method in which impurities such as hydrogen, water, a hydroxyl group, or hydride do not enter the oxide semiconductor layer 144. For example, the oxide semiconductor layer can be formed by a sputtering method or the like.

In this embodiment, the oxide semiconductor layer 144 is formed by a sputtering method with the use of an In—Ga—Zn—O-based oxide target.

As an In—Ga—Zn—O-based oxide target, for example, an oxide target having a composition ratio of $In_2O_3:Ga_2O_3:ZnO=1:1:1$ [molar ratio] can be used. Note that it is not necessary to limit the material and the composition ratio of the target to the above. For example, an oxide target having a composition ratio of $In_2O_3:Ga_2O_3:ZnO=1:1:2$ [molar ratio] can be used.

Further, in the case where an In—Sn—Zn-based oxide which is referred to as ITZO is formed, a target which has an atomic ratio of In:Sn:Zn of 1:2:2, 2:1:3, 1:1:1, 20:45:35, or the like is used.

The filling rate of the oxide target is greater than or equal to 90% and less than or equal to 100%, preferably greater than or equal to 95% and less than or equal to 99.9%. This is because, with the use of the metal oxide target with a high filling rate, a dense oxide semiconductor layer can be formed.

A film formation atmosphere may be a rare gas (typically, argon) atmosphere, an oxygen atmosphere, or a mixed atmosphere containing a rare gas and oxygen. An atmosphere of a high-purity gas from which impurities such as hydrogen, water, a hydroxyl group, or hydride are sufficiently removed is preferable, in order to prevent hydrogen, water, a hydroxyl group, hydride, or the like from entering the oxide semiconductor layer.

For example, the oxide semiconductor layer 144 can be formed as follows.

First, the substrate is held in a film formation chamber which is kept under reduced pressure, and is then heated so that the substrate temperature reaches a temperature higher than 200° C. and lower than or equal to 500° C., preferably higher than 300° C. and lower than or equal to 500° C., more preferably higher than or equal to 350° C. and lower than or equal to 450° C.

Then, a high-purity gas from which impurities such as hydrogen, water, a hydroxyl group, or hydride are sufficiently removed is introduced into the film formation chamber from which remaining moisture is being removed, and the oxide semiconductor layer is formed over the substrate with the use of the target. To remove moisture remaining in the film formation chamber, an entrapment vacuum pump such as a cryopump, an ion pump, or a titanium sublimation pump is desirably used as an evacuation unit. Further, an evacuation unit may be a turbo pump provided with a cold trap. In the film formation chamber which is evacuated with a cryopump, for example, impurities such as hydrogen, water, a hydroxyl group, or hydride (preferably, also a compound containing a carbon atom) are removed, whereby the concentration of impurities such as hydrogen, water, a hydroxyl group, or hydride in the oxide semiconductor layer formed in the film formation chamber can be reduced.

In the case where the substrate temperature is low (for example, lower than or equal to 100° C.) during film formation, a substance containing a hydrogen atom might enter the oxide semiconductor; thus, it is preferable that the substrate be heated at a temperature in the above range. When the oxide semiconductor layer is formed with the substrate heated at the temperature described above, since the substrate temperature is high, hydrogen bonds are cut by heat and a substance containing a hydrogen atom is less likely to be taken into the oxide semiconductor layer. Therefore, when the oxide semiconductor layer is formed with the substrate heated at the temperature described above, the concentration of impurities such as hydrogen, water, a hydroxyl group, or hydride in the oxide semiconductor layer can be sufficiently reduced. Moreover, damage due to sputtering can be reduced.

As an example of film formation conditions, the following conditions are employed: the distance between the substrate and the target is 60 mm; the pressure is 0.4 Pa; the direct-current (DC) power is 0.5 kW; the substrate temperature is 400° C.; and the film formation atmosphere is an oxygen atmosphere (the proportion of the oxygen flow rate is 100%). Note that a pulse direct-current power source is preferable because powder substances (also referred to as particles or dust) generated in film formation can be reduced and the film thickness can be uniform.

Note that before the oxide semiconductor layer is formed by a sputtering method, powder substances (also referred to as particles or dust) attached to a formation surface of the oxide semiconductor layer are preferably removed by reverse sputtering in which an argon gas is introduced and plasma is generated. The reverse sputtering refers to a method in which voltage is applied to a substrate to generate plasma in the vicinity of the substrate to modify a surface on the substrate side. Note that instead of argon, a gas of nitrogen, helium, oxygen, or the like may be used.

The oxide semiconductor layer 144 is formed by processing an oxide semiconductor layer. The oxide semiconductor layer can be processed by forming a mask having a desired shape over the oxide semiconductor layer and by etching the oxide semiconductor layer. The mask may be formed by a method such as photolithography. Alternatively, a method such as an inkjet method may be used to form the mask. For the etching of the oxide semiconductor layer, either dry etching or wet etching may be employed. It is needless to say that both of them may be employed in combination.

After that, heat treatment (first heat treatment) may be performed on the oxide semiconductor layer 144. The heat treatment can further remove the substance containing a hydrogen atom from the oxide semiconductor layer 144. The heat treatment is performed in an inert gas atmosphere at a temperature higher than or equal to 250° C. and lower than or equal to 700° C., preferably higher than or equal to 450° C. and lower than or equal to 600° C., or lower than a strain point of the substrate. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is set to 6N (99.9999%) or more, preferably 7N (99.99999%) or more (i.e., the impurity concentration is 1 ppm or less, preferably 0.1 ppm or less).

For example, after an object to be processed is introduced into an electric furnace including a resistance heater or the like, the heat treatment can be performed at 450° C. for one hour in a nitrogen atmosphere. The oxide semiconductor layer 144 is not exposed to the air during the heat treatment so that entry of water or hydrogen can be prevented.

Impurities are reduced by the heat treatment, so that a transistor with extremely excellent characteristics can be realized.

Note that the oxide semiconductor layer 144 may exhibit slight (weak) p-type conductivity by adding an impurity imparting p-type conductivity such as tin (Sn) to the oxide semiconductor layer 144. The oxide semiconductor layer 144 which exhibits weak p-type conductivity can be obtained by adding a small amount of an impurity for controlling valence electrons to the oxide semiconductor layer 144 which is purified as described above. Thus, the threshold voltage of the transistor 162 can be slightly shifted toward the positive side. Accordingly, the transistor 162 is prevented from becoming normally on and off-state current can be further reduced.

The above heat treatment can also be referred to as dehydration treatment, dehydrogenation treatment, or the like because it has the effect of removing hydrogen, water, or the like. The heat treatment can be performed, for example, before the oxide semiconductor layer is processed into an island shape or after the gate insulating film is formed. Such dehydration treatment or dehydrogenation treatment may be conducted once or plural times.

Figure 13B:
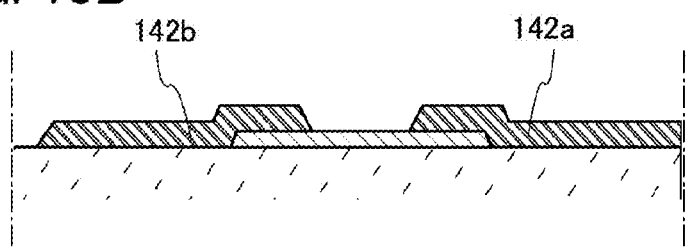

Next, the electrodes 142a and 142b are formed by forming a conductive layer used for forming source and drain electrodes (including a wiring formed using the same layer as the source and drain electrodes) over the oxide semiconductor layer 144 and the like and by processing the conductive layer (see FIG. 13B).

The conductive layer can be formed by a PVD method or a CVD method. As a material of the conductive layer, an element selected from aluminum, chromium, copper, tantalum, titanium, molybdenum, and tungsten, an alloy including any of these elements as a component, or the like can be used. A material including one of manganese, magnesium, zirconium, beryllium, neodymium, and scandium or a combination of a plurality of these elements may be used.

The conductive layer may have a single-layer structure or a stacked-layer structure including two or more layers. For example, the conductive layer may have a single-layer structure of a titanium film or a titanium nitride film, a single-layer structure of an aluminum film including silicon, a two-layer structure in which a titanium film is stacked over an aluminum film, a two-layer structure in which a titanium film is stacked over a titanium nitride film, a three-layer structure in which a titanium film, an aluminum film, and a titanium film are stacked in this order, or the like. Note that in the case where the conductive layer has a single-layer structure of a titanium film or a titanium nitride film, there is an advantage that the conductive layer can be easily processed into the electrodes 142a and 142b having tapered shapes.

The conductive layer may be formed using a conductive metal oxide. As the conductive metal oxide, indium oxide ($In_2O_3$), tin oxide ($SnO_2$), zinc oxide (ZnO), indium oxide-tin oxide alloy ($In_2O_3$—$SnO_2$, which is abbreviated to ITO in some cases), indium oxide-zinc oxide alloy ($In_2O_3$—ZnO), or any of these metal oxide materials including silicon or silicon oxide can be used.

The conductive layer is preferably etched such that the electrodes 142a and 142b are formed to have tapered end portions. Here, the taper angle is in the range of 30° to 60°, for example. When the electrodes 142a and 142b are formed by etching so as to have tapered end portions, coverage of the electrodes 142a and 142b with the gate insulating layer 146 which is formed later can be improved and disconnection of the gate insulating layer 146 can be prevented.

The channel length (L) of the transistor in the upper portion is determined by a distance between lower edge portions of the electrode 142a and the electrode 142b. Note that for light exposure for forming a mask in the case of manufacturing a transistor with a channel length (L) of less than 25 nm, light exposure is preferably performed with extreme ultraviolet rays whose wavelength is several nanometers to several tens of nanometers, which is extremely short. The resolution of light exposure with extreme ultraviolet rays is high and the focal depth is large. For these reasons, the channel length (L) of the transistor to be formed later can be set in the range of 10 nm to 1000 nm (1 μm), and the circuit can operate at higher speed. In addition, power consumption of the memory device can be reduced by miniaturization.

Figure 13C:
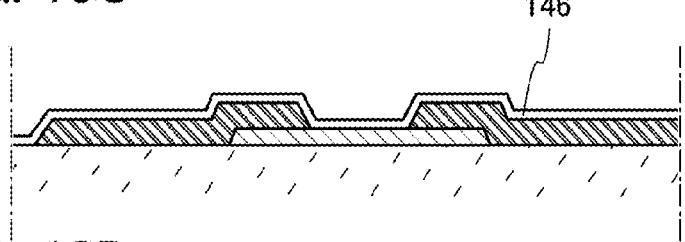

Next, the gate insulating layer 146 is formed so as to cover the electrodes 142a and 142b and to be in contact with part of the oxide semiconductor layer 144 (see FIG. 13C).

The gate insulating layer 146 can be formed by a CVD method, a sputtering method, or the like. The gate insulating layer 146 is preferably formed so as to contain silicon oxide, silicon nitride, silicon oxynitride, gallium oxide, aluminum oxide, tantalum oxide, hafnium oxide, yttrium oxide, hafnium silicate ($HfSi_xO_y$ ($x>0$, $y>0$)), hafnium silicate (Hf-$Si_xO_y$ ($x>0$, $y>0$)) to which nitrogen is added, hafnium aluminate ($HfAl_xO_y$ ($x>0$, $y>0$)) to which nitrogen is added, or the like. The gate insulating layer 146 may have a single-layer structure or a stacked-layer structure in which these materials are combined. There is no particular limitation on the thickness of the gate insulating layer 146; the thickness is preferably small in order to ensure the operation of the transistor when the memory device is miniaturized. For example, in the case of using silicon oxide, the thickness can be in the range of 1 nm to 100 nm, preferably 10 nm to 50 nm.

When the gate insulating layer is thin as described above, gate leakage due to a tunneling effect or the like becomes a problem. In order to solve the problem of gate leakage, the gate insulating layer 146 may be formed using a high dielectric constant (high-k) material such as hafnium oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added. The use of a high-k material for the gate insulating layer 146 makes it possible to increase the thickness in order to suppress gate leakage as well as ensuring electrical properties. Note that a stacked-layer structure of a film including a high-k material and a film including any of silicon oxide, silicon nitride, silicon oxynitride, silicon nitride oxide, aluminum oxide, and the like may also be employed.

Further, the insulating layer in contact with the oxide semiconductor layer 144 (in this embodiment, the insulating layer 140 and the gate insulating layer 146) may be formed using an insulating material containing a Group 13 element and oxygen. Many oxide semiconductor materials contain a Group 13 element, and thus, an insulating material containing a Group 13 element works well with the oxide semiconductor. By using such an insulating material for the insulating layer in contact with the oxide semiconductor, an interface with the oxide semiconductor layer can be kept in a favorable state.

Here, an insulating material containing a Group 13 element refers to an insulating material containing one or more Group 13 elements. As an example of the insulating material containing a Group 13 element, gallium oxide, aluminum oxide, aluminum gallium oxide, gallium aluminum oxide, or the like can be given. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, in the case of forming a gate insulating layer in contact with an oxide semiconductor layer containing gallium, a material containing gallium oxide may be used for a gate insulating layer, so that favorable characteristics can be kept at the interface between the oxide semiconductor layer and the gate insulating layer. When the oxide semiconductor layer and the insulating layer containing gallium oxide are provided in contact with each other, pile-up of hydrogen at the interface between the oxide semiconductor layer and the insulating layer can be suppressed, for example. Note that a similar effect can be obtained in the case where an element belonging to the same group as a constituent element of the oxide semiconductor is used for an insulating layer. For example, it is effective to form an insulating layer with the use of a material containing aluminum oxide. Note that aluminum oxide has a property of not easily transmitting water. Thus, it is preferable to use a material containing aluminum oxide in terms of preventing entry of water into the oxide semiconductor layer.

The insulating material of the insulating layer in contact with the oxide semiconductor layer 144 is preferably made to contain oxygen in a proportion higher than that in the stoichiometric proportion by heat treatment in an oxygen atmosphere or by oxygen doping. "Oxygen doping" refers to adding oxygen into a bulk. Note that the term "bulk" is used in order to clarify that oxygen is added not only to a surface of a thin film but also to the inside of the thin film. In addition, "oxygen doping" includes oxygen plasma doping in which oxygen plasma is added to a bulk. The oxygen doping may be performed by an ion implantation method or an ion doping method.

For example, in the case where the insulating layer in contact with the oxide semiconductor layer 144 is formed using gallium oxide, the composition of gallium oxide can be set to be $Ga_2O_x$ (x=3+α, 0<α<1) by heat treatment in an oxygen atmosphere or by oxygen doping. In the case where the insulating layer in contact with the oxide semiconductor layer 144 is formed using aluminum oxide, the composition of aluminum oxide can be set to be $Al_2O_x$ (x=3+α, 0<α<1) by heat treatment in an oxygen atmosphere or by oxygen doping. In the case where the insulating layer in contact with the oxide semiconductor layer 144 is formed using gallium aluminum oxide (aluminum gallium oxide), the composition of gallium aluminum oxide (aluminum gallium oxide) can be set to be $Ga_xAl_{2-x}O_{3-\alpha}$ (0<x<2, 0<α<1) by heat treatment in an oxygen atmosphere or by oxygen doping.

By oxygen doping or the like, an insulating layer which has a region where the proportion of oxygen is higher than that in the stoichiometric proportion can be formed. When the insulating layer having such a region is in contact with the oxide semiconductor layer, excess oxygen in the insulating layer is supplied to the oxide semiconductor layer, and oxygen deficiency in the oxide semiconductor layer or at an interface between the oxide semiconductor layer and the insulating layer can be reduced. Thus, the oxide semiconductor layer can be an i-type or substantially i-type oxide semiconductor.

Note that the insulating layer having a region where the proportion of oxygen is higher than that in the stoichiometric proportion may be applied to the insulating layer 140 serving as a base film for the oxide semiconductor layer 144 instead of the gate insulating layer 146, or may be applied to both the gate insulating layer 146 and the base insulating layer 140.

After the gate insulating layer 146 is formed, second heat treatment is preferably performed in an inert gas atmosphere or an oxygen atmosphere. The temperature of the heat treatment is set in the range of 200° C. to 450° C., preferably 250° C. to 350° C. For example, the heat treatment may be performed at 250° C. for one hour in a nitrogen atmosphere. By the second heat treatment, variation in electrical characteristics of the transistor can be reduced. Further, in the case where the gate insulating layer 146 includes oxygen, oxygen can be supplied to the oxide semiconductor layer 144 to cover oxygen deficiency in the oxide semiconductor layer 144, so that an i-type (intrinsic semiconductor) or substantially i-type oxide semiconductor layer can also be formed.

Note that the second heat treatment is performed in this embodiment after the gate insulating layer 146 is formed; there is no limitation on the timing of the second heat treatment. For example, the second heat treatment may be performed after the gate electrode is formed. Alternatively, the first heat treatment and the second heat treatment may be performed in succession, the first heat treatment may also serve as the second heat treatment, or the second heat treatment may also serve as the first heat treatment.

By performing at least one of the first heat treatment and the second heat treatment as described above, the oxide semiconductor layer 144 can be purified so as to contain a substance including a hydrogen atom as little as possible.

Figure 13D:
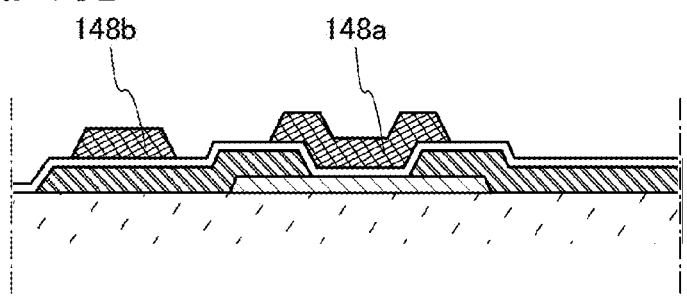

Next, a conductive layer for forming a gate electrode (including a wiring formed using the same layer as the gate electrode) is formed and is processed, so that the electrode 148a and the conductive layer 148b are formed (see FIG. 13D).

The electrode 148a and the conductive layer 148b can be formed using a metal material such as molybdenum, titanium, tantalum, tungsten, aluminum, copper, neodymium, or scandium, or an alloy material containing any of these materials as its main component. Note that the electrode 148a and the conductive layer 148b may have a single-layer structure or a stacked-layer structure.

Figure 13E:
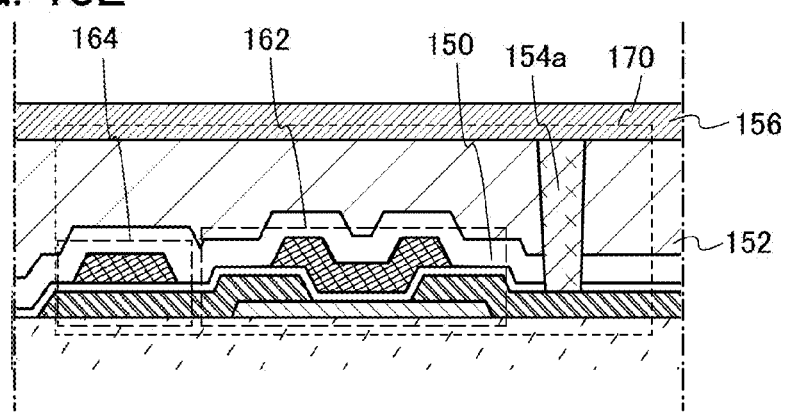

Then, the insulating layer 150 is formed over the gate insulating layer 146, the electrode 148a, and the conductive layer 148b (see FIG. 13E). The insulating layer 150 can be formed by a PVD method, a CVD method, or the like. The insulating layer 150 can be formed using a material including an inorganic insulating material such as silicon oxide, silicon oxynitride, silicon nitride, hafnium oxide, gallium oxide, or aluminum oxide. Note that the insulating layer 150 is preferably formed using a low dielectric constant material or a low dielectric constant structure (such as a porous structure). This is because when the insulating layer 150 has a low dielectric constant, capacitance generated between wirings, electrodes, or the like can be reduced and operation at higher speed can be achieved. Note that although the insulating layer 150 has a single-layer structure in this embodiment, an embodiment of the disclosed invention is not limited to this example. The insulating layer 150 may have a stacked-layer structure including two or more layers.

Next, the insulating layer 152 is formed over the insulating layer 150 (see FIG. 13E). The feature of an embodiment of the present invention is that a plurality of memory cells is stacked. Therefore, it is desirable that the surface of the insulating layer 152 be planarized by CMP or the like.

Next, an opening reaching the electrode 142a is formed in the gate insulating layer 146, the insulating layer 150, and the insulating layer 152. An electrode 154a is formed in the opening. Then, the wiring 156 in contact with the electrode 154a is formed over the insulating layer 152 (see FIG. 13E). The opening is formed by selective etching with a mask or the like.

The wiring 156 is formed by forming a conductive layer by a PVD method or a CVD method and then by patterning the conductive layer. As a material of the conductive layer, an element selected from aluminum, chromium, copper, tantalum, titanium, molybdenum, and tungsten, an alloy including any of these elements as a component, or the like can be used. A material including one of manganese, magnesium, zirconium, beryllium, neodymium, and scandium or a combination of a plurality of these elements may be used.

Specifically, the electrode 154a can be formed in such a manner that a thin titanium film (about 5 nm) is formed in a region including the opening of the insulating layer 150 and the insulating layer 152 by a PVD method and then an aluminum film is formed so as to be embedded in the opening, for example. Here, the titanium film formed by a PVD method functions to reduce an oxide film (e.g., a natural oxide film) formed on a surface where the titanium film is formed, and to decrease the contact resistance with a lower electrode or the like (here, the electrode 142a). In addition, hillock of the aluminum film can be prevented. A copper film may be formed by a plating method after the formation of a barrier film of titanium, titanium nitride, or the like.

Through the above process, the transistor 162 including the purified oxide semiconductor layer 144 and the capacitor 164 are completed (see FIG. 13E).

Here, in a structure in which a memory cell is stacked over the memory cell illustrated in FIG. 13E, the insulating layer 140 is formed so as to cover the wiring 156. Then, an opening is formed in the insulating layer 140, and the electrode 500 in FIG. 9A or the electrode 553 in FIG. 16A is formed. After that, by repeating the manufacturing method illustrated in FIGS. 13A to 13E, a structure in which a plurality of memory cells is stacked can be realized.

The insulating layer 140 can be formed by a PVD method, a CVD method, or the like. The insulating layer 140 can be formed so as to have a single-layer structure or a stacked-layer structure using a material including an inorganic insulating material such as silicon oxide, silicon oxynitride, silicon nitride, hafnium oxide, gallium oxide, or aluminum oxide or a material including an organic material such as polyimide or acrylic.

Note that the electrode 501a and the electrode 501b illustrated in FIG. 9A can be manufactured in a manner similar to that of the electrode 142a and the electrode 142b. The electrode 502a and the electrode 502b illustrated in FIG. 9A can be manufactured in a manner similar to that of the electrode 154a.

Note that the electrode 552 illustrated in FIG. 16A can be manufactured in a manner similar to that of the wiring 156. The electrode 551 illustrated in FIG. 16A can be manufactured in a manner similar to that of the electrode 154a.

Note that in the case of forming the transistor 162 and the capacitor 164 illustrated in FIG. 12A, the electrodes 142a and 142b are formed over the insulating layer 140, and the oxide semiconductor layer 144 is formed over the insulating layer 140 and the electrodes 142a and 142b. Then, the gate insulating layer 146 is formed over the electrodes 142a and 142b and the oxide semiconductor layer 144. After that, over the gate insulating layer 146, the gate electrode 148a is formed so as to overlap with the oxide semiconductor layer 144, and the conductive layer 148b is formed so as to overlap with the electrode 142b.

In the case of forming the transistor 162 and the capacitor 164 illustrated in FIG. 12B, the electrode 148a and the conductive layer 148b are formed over the insulating layer 140, and the gate insulating layer 146 is formed over the insulating layer 140, the electrode 148a, and the conductive layer 148b. Then, the electrodes 142a and 142b are formed over the gate insulating layer 146. After that, the oxide semiconductor layer 144 is formed over the gate insulating layer 146 so as to overlap with the electrode 148a; thus, the transistor 162 and the capacitor 164 are completed. Note that the insulating layer 150 and the insulating layer 151 may be formed so as to cover the transistor 162 and the capacitor 164. For example, the insulating layer 150 preferably contains oxygen in a proportion higher than that in the stoichiometric proportion by heat treatment in an oxygen atmosphere or by oxygen doping, and the insulating layer 151 preferably hardly allows water or hydrogen to pass through. This is because when the insulating layer 151 hardly allows water or hydrogen to pass through, it is possible to prevent water or hydrogen from entering the oxide semiconductor layer 144, and when the insulating layer 150 contains oxygen in a proportion higher than that in the stoichiometric proportion, it is possible to form the oxide semiconductor layer 144 which is i-type or substantially i-type by filling oxygen vacancies in the oxide semiconductor layer 144.

In the case of forming the transistor 162 and the capacitor 164 illustrated in FIG. 12C, the electrode 148a and the conductive layer 148b are formed over the insulating layer 140, and the gate insulating layer 146 is formed over the insulating layer 140, the electrode 148a, and the conductive layer 148b. Then, the oxide semiconductor layer 144 is formed over the gate insulating layer 146 so as to overlap with the electrode 148a. After that, the electrodes 142a and 142b are formed over the oxide semiconductor layer 144; thus, the transistor 162 and the capacitor 164 are completed. Note that the description of FIG. 12B can be referred to for the insulating layer 150 and the insulating layer 151.

In the case of forming the transistor 162 and the capacitor 164 illustrated in FIG. 12D, the electrode 148a and the conductive layer 148b are formed over the insulating layer 140, and the gate insulating layer 146 (in FIG. 12D, the first gate insulating layer) is formed over the insulating layer 140, the electrode 148a (in FIG. 12D, the first gate electrode), and the electrode layer 148. Then, the oxide semiconductor layer 144 is formed over the gate insulating layer 146 so as to overlap with the electrode 148a, and the electrodes 142a and 142b are formed over the oxide semiconductor layer 144. After that, the insulating layer 150 (in FIG. 12D, the second gate insulating layer) is formed over the oxide semiconductor layer 144 and the electrodes 142a and 142b, and the conductive layer 159 (in FIG. 12D, the second gate electrode) is formed so as to overlap with the oxide semiconductor layer 144. Thus, the transistor 162 and the capacitor 164 are completed. Note that the description of the material and the manufacturing method of the electrode 148a can be referred to for the material and the manufacturing method of the conductive layer 159.

Next, methods for manufacturing the transistors 162 and the capacitors 164 illustrated in FIGS. 11A and 11B will be described.

A method for manufacturing the transistor 162 and the capacitor 164 illustrated in FIG. 11A will be described.

First, the oxide semiconductor layer 144 is formed over the insulating layer 140, and an oxide conductive layer and a conductive layer are stacked over the insulating layer 140 and the oxide semiconductor layer 144.

As a method for forming the oxide conductive layer, a sputtering method, a vacuum evaporation method (an electron beam evaporation method or the like), an arc discharge ion plating method, or a spray method is used. As a material of the oxide conductive layer, zinc oxide, zinc aluminum oxide, zinc aluminum oxynitride, zinc gallium oxide, indium tin oxide, or the like can be used. In addition, any of the above materials may contain silicon oxide. Note that the description of the conductive layer used for forming the electrodes 142a and 142b can be referred to for the film formation method and the material of the conductive layer.

Next, the electrodes 142a and 142b and the oxide conductive layers 143a and 143b are formed by forming a mask over the conductive layer and selectively etching the conductive layer and the oxide conductive layer.

Note that when etching treatment for the conductive layer and the oxide conductive layer is performed, etching conditions (e.g., type of an etching agent, the concentration of an etching agent, and etching time) are adjusted as appropriate in order to prevent excessive etching of the oxide semiconductor layer.

Next, the gate insulating layer 146 is formed over the electrodes 142a and 142b and the oxide semiconductor layer 144. After that, over the gate insulating layer 146, the electrode 148a is formed so as to overlap with the oxide semiconductor layer 144, and the conductive layer 148b is formed so as to overlap with the electrode 142b.

Through the above steps, the transistor 162 and the capacitor 164 are completed (see FIG. 11A).

In the case of manufacturing the transistor 162 and the capacitor 164 illustrated in FIG. 11B, an oxide semiconductor layer and an oxide conductive layer are stacked and are processed in one photolithography step, so that an island-shaped oxide semiconductor layer and an island-shaped oxide conductive layer are formed. Next, the oxide conductive layers 143a and 143b serving as source and drain regions are formed by forming the electrodes 142a and 142b over the island-shaped oxide conductive layer and then by etching the island-shaped oxide conductive layer using the electrodes 142a and 142b as masks.

Next, the gate insulating layer 146 is formed over the electrodes 142a and 142b and the oxide semiconductor layer 144. After that, over the gate insulating layer 146, the electrode 148a is formed so as to overlap with the oxide semiconductor layer 144, and the conductive layer 148b is formed so as to overlap with the electrode 142b.

Through the above steps, the transistor 162 and the capacitor 164 are completed (see FIG. 11B).

In each of the transistors 162 described in this embodiment, the oxide semiconductor layer 144 is purified and thus contains hydrogen at a concentration of $5 \times 10^{19}$ atoms/cm$^3$ or less, preferably $5 \times 10^{18}$ atoms/cm$^3$ or less, more preferably $5 \times 10^{17}$ atoms/cm$^3$ or less. In addition, the carrier density of the oxide semiconductor layer 144 is, for example, less than $1 \times 10^{12}$/cm$^3$, preferably less than $1.45 \times 10^{10}$/cm$^3$, which is sufficiently lower than the carrier density of a general silicon wafer (approximately $1 \times 10^{14}$/cm$^3$). In addition, the off-state current of the transistor 162 is sufficiently small. For example, the off-state current (per unit channel width (1 μm), here) of the transistor 162 at room temperature (25° C.) is 100 zA (1 zA (zeptoampere) is $1 \times 10^{-21}$ A) or less, preferably 10 zA or less.

The concentration of an alkali metal or an alkaline earth metal is sufficiently decreased in the oxide semiconductor layer 144. The concentration of an alkali metal or an alkaline earth metal is decreased to such a degree that, for example, the concentrations of Na is $5 \times 10^{16}$ cm$^{-3}$ or less, preferably $1 \times 10^{16}$ cm$^{-3}$ or less, more preferably $1 \times 10^{15}$ cm$^{-3}$ or less, the concentration of Li is $5 \times 10^{15}$ cm$^{-3}$ or less, preferably $1 \times 10^{15}$ cm$^{-3}$ or less, and the concentration of K is $5 \times 10^{15}$ cm$^{-3}$ or less, preferably $1 \times 10^{15}$ cm$^{-3}$ or less.

In this manner, by using the oxide semiconductor layer 144 which is purified and is intrinsic, it becomes easy to sufficiently reduce the off-state current of the transistor 162. With the use of such a transistor 162 as described above, a memory device in which stored data can be held for an extremely long time can be provided.

The configurations, methods, and the like described in this embodiment can be combined as appropriate with any of the configurations, methods, and the like described in the other embodiments.

(Embodiment 3)

One embodiment of an oxide semiconductor layer which can be used for a channel formation region of the transistor 162 in the above embodiments will be described with reference to FIGS. 14A to 14D.

The oxide semiconductor layer of this embodiment has a stacked structure including a first crystalline oxide semiconductor layer and a second crystalline oxide semiconductor layer which is over the first crystalline oxide semiconductor layer and has a larger thickness than the first crystalline oxide semiconductor layer.

A first oxide semiconductor film with a thickness greater than or equal to 1 nm and less than or equal to 10 nm is formed over an insulating layer 140.

In this embodiment, an oxide insulating layer with a thickness greater than or equal to 50 nm and less than or equal to 600 nm is formed as the insulating layer 140 by a PCVD method or a sputtering method. For example, a single layer selected from a silicon oxide film, a gallium oxide film, an aluminum oxide film, a silicon oxynitride film, an aluminum oxynitride film, and a silicon nitride oxide film or a stack of any of these films can be used.

The first oxide semiconductor film is formed by a sputtering method, and the substrate temperature in the film formation by a sputtering method is set to be higher than or equal to 200° C. and lower than or equal to 400° C. In this embodiment, the first oxide semiconductor film is formed to a thickness of 5 nm in an oxygen atmosphere, an argon atmosphere, or an atmosphere including argon and oxygen under conditions where a target for an oxide semiconductor (a target for an In—Ga—Zn—O-based oxide semiconductor ($In_2O_3$:$Ga_2O_3$:ZnO=1:1:2 [molar ratio])) is used, the distance between the substrate and the target is 170 mm, the substrate temperature is 250° C., the pressure is 0.4 Pa, and the direct-current (DC) power is 0.5 kW.

Next, first heat treatment is performed under a condition where the atmosphere of a chamber in which the substrate is set is an atmosphere of nitrogen or dry air. The temperature of the first heat treatment is higher than or equal to 400° C. and lower than or equal to 750° C. Through the first heat treatment, a first crystalline oxide semiconductor layer 145a is formed (see FIG. 14A).

Although it depends on the temperature of the first heat treatment, the first heat treatment causes crystallization from a film surface and crystal grows from the film surface toward the inside of the film; thus, c-axis aligned crystals are obtained. By the first heat treatment, a large amount of zinc and oxygen gather about the film surface, and one or more layers of graphene-type two-dimensional crystal including zinc and oxygen and having a hexagonal upper plane are formed at the outermost surface; the one or more layers at the outermost surface grow in the thickness direction to form a stack of layers. By increasing the temperature of the heat treatment, crystal growth proceeds from the surface to the inside and further from the inside to the bottom.

By the first heat treatment, oxygen in the insulating layer 140 that is an oxide insulating layer is diffused to an interface between the insulating layer 140 and the first crystalline oxide semiconductor layer 145a or the vicinity of the interface (within ±5 nm from the interface), whereby oxygen deficiencies in the first crystalline oxide semiconductor layer are reduced. Therefore, it is preferable that oxygen be included in (a bulk of) the insulating layer 140 used as a base insulating layer for the first crystalline oxide semiconductor layer or at the interface between the first crystalline oxide semiconductor layer 145a and the insulating layer 140 at an amount that exceeds at least the stoichiometric proportion.

Next, a second oxide semiconductor film with a thickness more than 10 nm is formed over the first crystalline oxide semiconductor layer 145a. The second oxide semiconductor film is formed by a sputtering method, and the substrate temperature in the film formation is set to be higher than or equal to 200° C. and lower than or equal to 400° C. By setting the substrate temperature in the film formation to be higher than or equal to 200° C. and lower than or equal to 400° C., precursors can be arranged in the oxide semiconductor film formed above and in contact with the surface of the first crystalline oxide semiconductor layer, and so-called orderliness can be obtained.

In this embodiment, the second oxide semiconductor film is formed to a thickness of 25 nm in an oxygen atmosphere, an argon atmosphere, or an atmosphere including argon and oxygen under conditions where a target for an oxide semiconductor (a target for an In—Ga—Zn—O-based oxide semiconductor ($In_2O_3$:$Ga_2O_3$:ZnO=1:1:2 [molar ratio])) is used, the distance between the substrate and the target is 170 mm, the substrate temperature is 400° C., the pressure is 0.4 Pa, and the direct-current (DC) power is 0.5 kW.

Next, second heat treatment is performed under a condition where the atmosphere of a chamber in which the substrate is set is an atmosphere of nitrogen or dry air. The temperature of the second heat treatment is higher than or equal to 400° C. and lower than or equal to 750° C. Through the second heat treatment, a second crystalline oxide semiconductor layer 145b is formed (see FIG. 14B). The second heat treatment is performed in a nitrogen atmosphere, an oxygen atmosphere, or a mixed atmosphere of nitrogen and oxygen, whereby the density of the second crystalline oxide semiconductor layer is increased and the number of defects therein is reduced. By the second heat treatment, crystal growth proceeds with the use of the first crystalline oxide semiconductor layer 145a as a nucleus, in the thickness direction, that is, from the bottom to the inside; thus, the second crystalline oxide semiconductor layer 145b is formed.

It is preferable that steps from the formation of the insulating layer 140 to the second heat treatment be successively performed without exposure to the air. The steps from the formation of the insulating layer 140 to the second heat treatment are preferably performed in an atmosphere which is controlled to include little hydrogen and moisture (such as an inert gas atmosphere, a reduced-pressure atmosphere, or a dry-air atmosphere); in terms of moisture, for example, a dry nitrogen atmosphere with a dew point of −40° C. or lower, preferably a dew point of −50° C. or lower may be employed.

Figure 14A:
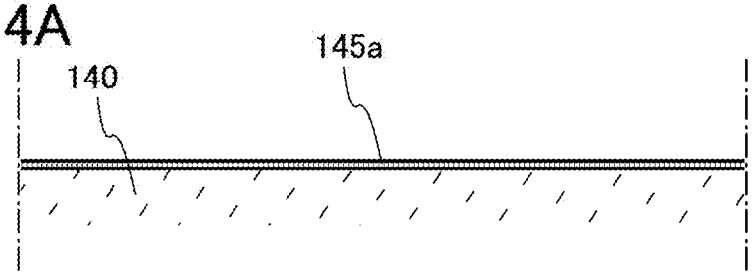
FIGS. 14A to 14D illustrate a method for manufacturing a memory cell.
Figure 14B:
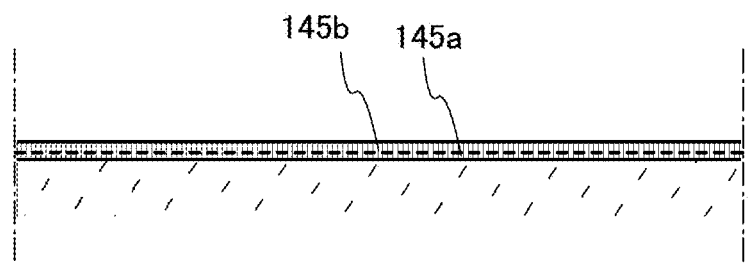
Figure 14C:
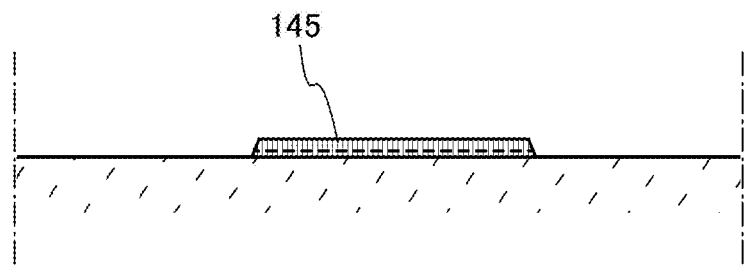

Next, the stack of the oxide semiconductor layers including the first crystalline oxide semiconductor layer 145a and the second crystalline oxide semiconductor layer 145b is processed into an oxide semiconductor layer 145 including a stack of island-shaped oxide semiconductor layers (see FIG. 14C). In FIG. 14C, the interface between the first crystalline oxide semiconductor layer 145a and the second crystalline oxide semiconductor layer 145b is indicated by a dotted line, and the stacked structure of the first crystalline oxide semiconductor layer and the second crystalline oxide semiconductor layer is illustrated; however, the interface is actually not distinct and is illustrated for easy understanding.

The stack of the oxide semiconductor layers can be processed by being etched after a mask having a desired shape is formed over the stack of the oxide semiconductor layers. The mask may be formed by a method such as photolithography. Alternatively, a method such as an inkjet method may be used to form the mask.

For the etching of the stack of oxide semiconductor layers, either wet etching or dry etching may be employed. It is needless to say that both of them may be employed in combination.

A feature of the first crystalline oxide semiconductor layer and the second crystalline oxide semiconductor layer obtained by the above formation method is that these layers have c-axis alignment. Note that the first crystalline oxide semiconductor layer and the second crystalline oxide semiconductor layer comprise an oxide including a crystal with c-axis alignment (also referred to as c-axis aligned crystal (CAAC)), which has neither a single crystal structure nor an amorphous structure. The first crystalline oxide semiconductor layer and the second crystalline oxide semiconductor layer partly include a crystal grain boundary.

Here, an oxide including crystals with c-axis alignment (also referred to as c-axis aligned crystal (CAAC)), which has a triangular or hexagonal atomic arrangement when seen from the direction of an a-b plane, a surface, or an interface will be described. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, an oxide including CAAC means a non-single crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 20A to 20E, FIGS. 21A to 21C, and FIGS. 22A to 22C. In FIGS. 20A to 20E, FIGS. 21A to 21C, and FIGS. 22A to 22C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 20A to 20E, O surrounded by a circle represents tetracoodianate O and O surrounded by a double circle represents tricoodenate O.

Figure 20A:
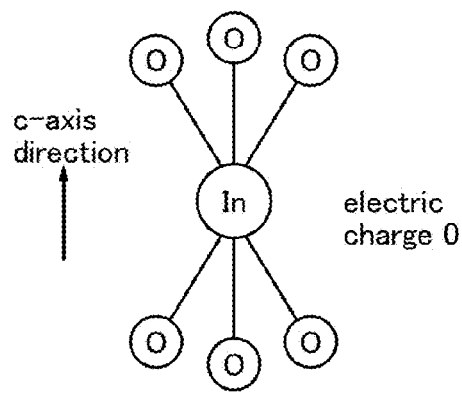
FIGS. 20A to 20E illustrate structures of oxide materials.

FIG. 20A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 20A is actually an octahedral structure, but is illustrated as a planar structure for simplicity. Note that three tetracoordinate O atoms exist in each of an upper half and a lower half in FIG. 20A. In the small group illustrated in FIG. 20A, electric charge is 0.

Figure 20D:
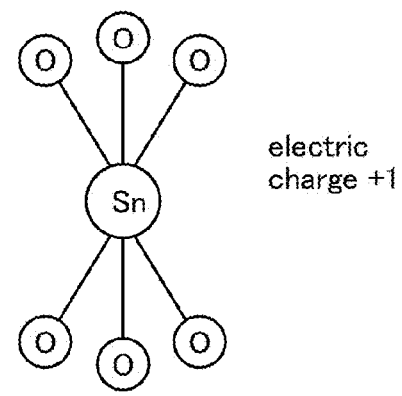
Figure 20B:
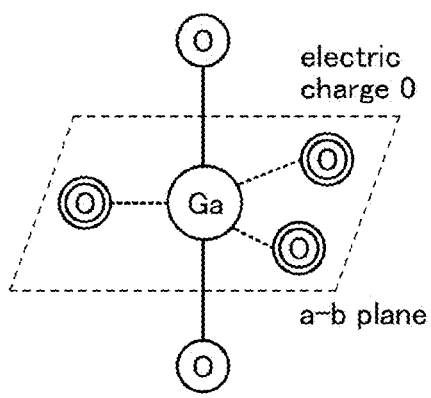

FIG. 20B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 20B. An In atom can also have the structure illustrated in FIG. 20B because an In atom can have five ligands. In the small group illustrated in FIG. 20B, electric charge is 0.

Figure 20E:
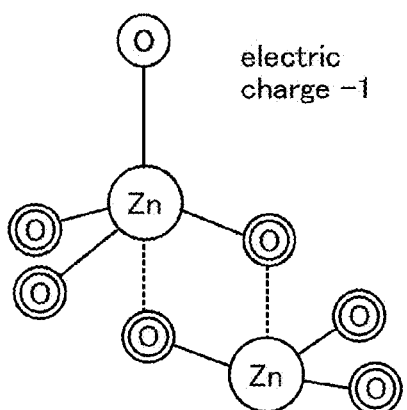
Figure 20C:
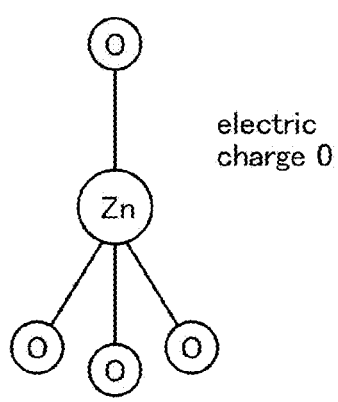

FIG. 20C illustrates a structure including one tetracoordinate Zn atom and four tetracoordinate O atoms proximate to the Zn atom. In FIG. 20C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 20C. In the small group illustrated in FIG. 20C, electric charge is 0.

FIG. 20D illustrates a structure including one hexacoordinate Sn atom and six tetracoordinate O atoms proximate to the Sn atom. In FIG. 20D, three tetracoordinate O atoms exist in each of an upper half and a lower half. In the small group illustrated in FIG. 20D, electric charge is +1.

FIG. 20E illustrates a small group including two Zn atoms. In FIG. 20E, one tetracoordinate O atom exists in each of an upper half and a lower half. In the small group illustrated in FIG. 20E, electric charge is −1.

Here, a plurality of small groups forms a medium group, and a plurality of medium groups forms a large group (also referred to as a unit cell).

Now, a rule of bonding between the small groups will be described. The three O atoms in the upper half with respect to the hexacoordinate In atom in FIG. 20A each have three proximate In atoms in the downward direction, and the three O atoms in the lower half each have three proximate In atoms in the upward direction. The one O atom in the upper half with respect to the pentacoordinate Ga atom in FIG. 20B has one proximate Ga atom in the downward direction, and the one O atom in the lower half has one proximate Ga atom in the upward direction. The one O atom in the upper half with respect to the tetracoordinate Zn atom in FIG. 20C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 21A:
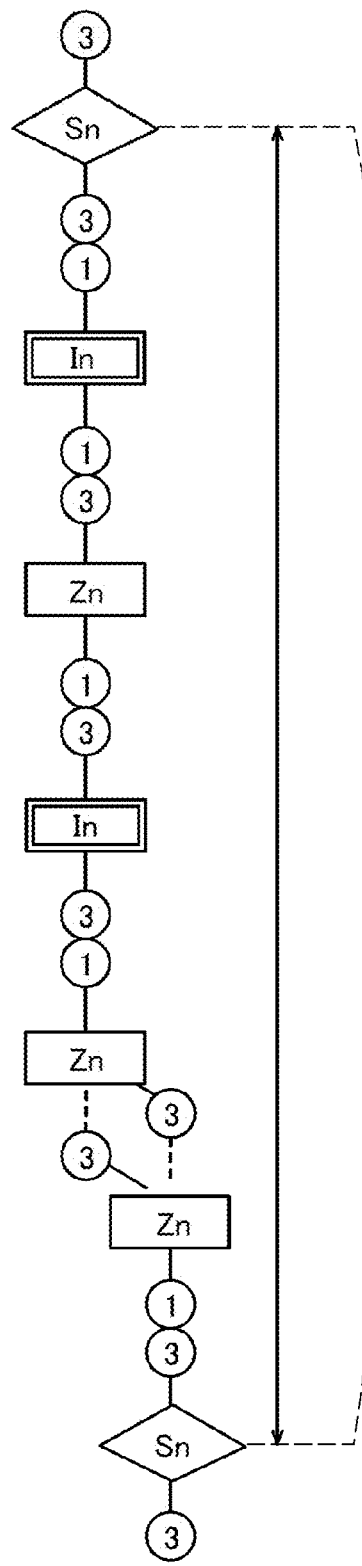
FIGS. 21A to 21C illustrate a structure of an oxide material.
Figure 21B:
Figure 21C:
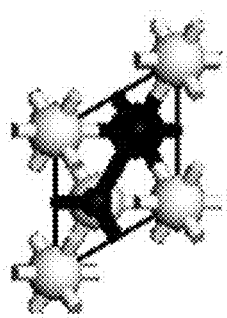

FIG. 21A illustrates a model of a medium group included in a layered structure of an In—Sn—Zn—O-based material. FIG. 21B illustrates a large group including three medium groups. Note that FIG. 21C illustrates an atomic arrangement in the case where the layered structure in FIG. 21B is observed from the c-axis direction.

In FIG. 21A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 21A, one tetracoordinate O atom existing in each of an upper half and a lower half with respect to an In atom is denoted by circled 1. FIG. 21A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 21A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups is bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 20E can be given. For example, with one small group including two Zn atoms, electric charge of one small group including a Sn atom can be cancelled, so that the total electric charge of the layered structure can be 0.

When the large group illustrated in FIG. 21B is repeated, an In—Sn—Zn—O-based crystal (In$_2$SnZn$_3$O$_8$) can be obtained. Note that a layered structure of the obtained In—Sn—Zn—O-based crystal can be expressed as a composition formula, In$_2$SnZn$_2$O$_7$(ZnO)$_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

Figure 22A:
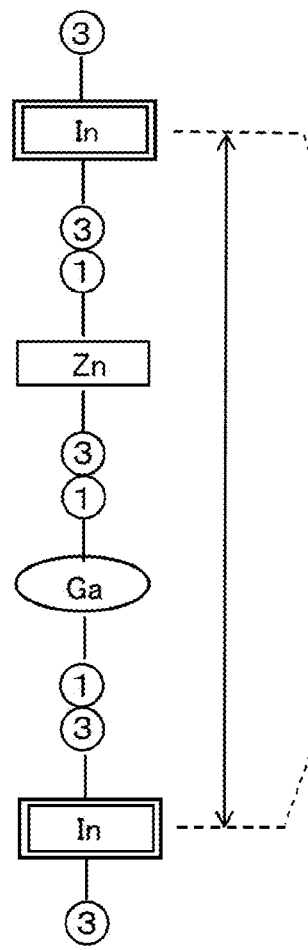
FIGS. 22A to 22C illustrate a structure of an oxide material.

As an example, FIG. 22A illustrates a model of a medium group included in a layered structure of an In—Ga—Zn—O-based material.

In the medium group included in the layered structure of the In—Ga—Zn—O-based material in FIG. 22A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups is bonded, so that a large group is formed.

Figure 22B:
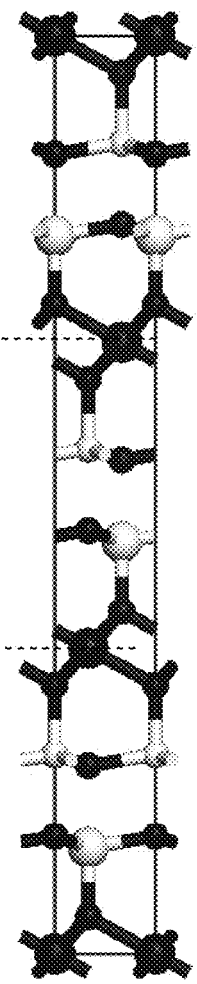
Figure 22C:
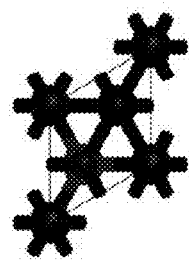

FIG. 22B illustrates a large group including three medium groups. Note that FIG. 22C illustrates an atomic arrangement in the case where the layered structure in FIG. 22B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 22A but also a medium group in which the arrangement of the In atom, the Ga atom, and the Zn atom is different from that in FIG. 22A.

In any case, in order to obtain CAAC, it is important to form hexagonal crystals in an initial stage of deposition of an oxide semiconductor film and to cause crystal growth from the hexagonal crystals as a seed. In order to achieve this, it is preferable that a substrate heating temperature be 100° C. to 500° C., more preferably 200° C. to 400° C., still preferably 250° C. to 300° C. In addition, the deposited oxide semiconductor film is subjected to heat treatment at a temperature higher than the substrate heating temperature in the film formation. Accordingly, microdefects in the film and defects at the interface of stacked layers can be repaired.

Note that the first and second crystalline oxide semiconductor layers are formed using an oxide material containing at least Zn, for example, a four-component metal oxide such as an In—Al—Ga—Zn—O-based material, or an In—Sn—Ga—Zn—O-based material; a three-component metal oxide such as an In—Ga—Zn—O-based material, an In—Al—Zn—O-based material, an In—Sn—Zn—O-based material, a Sn—Ga—Zn—O-based material, an Al—Ga—Zn—O-based material, or a Sn—Al—Zn—O-based material; a two-component metal oxide such as an In—Zn—O-based material, a Sn—Zn—O-based material, an Al—Zn—O-based material, or a Zn—Mg—O-based material; or a Zn—O-based material. In addition, an In—Si—Ga—Zn—O-based material, an In—Ga—B—Zn—O-based material, or an In—B—Zn—O-based material may be used. In addition, the above materials may contain SiO$_2$. Here, for example, an In—Ga—Zn—O-based material means an oxide material containing indium (In), gallium (Ga), and zinc (Zn), and there is no limitation on the composition ratio thereof. Further, the In—Ga—Zn—O-based material may include an element other than In, Ga, and Zn.

Without limitation to the two-layer structure in which the second crystalline oxide semiconductor layer is formed over the first crystalline oxide semiconductor layer, a stacked structure including three or more layers may be formed by repeatedly performing a process of film formation and heat treatment for forming a third crystalline oxide semiconductor layer after the second crystalline oxide semiconductor layer is formed.

Figure 14D:
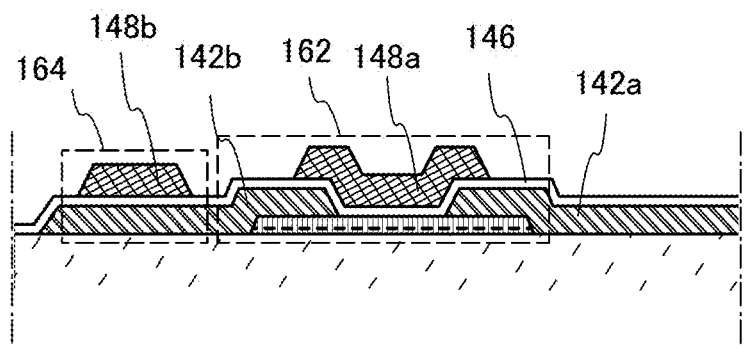

After that, the electrodes 142*a* and 142*b*, the gate insulating layer 146, the electrode 148*a*, and the conductive layer 148*b* are formed; thus, the transistor 162 and the capacitor 164 are completed (see FIG. 14D). Embodiment 2 can be referred to for materials and formation methods of the electrodes 142*a* and 142*b*, the gate insulating layer 146, the electrode 148*a*, and the conductive layer 148*b*.

The oxide semiconductor layer 145 including the stack of the oxide semiconductor layers formed by the above formation method can be used as appropriate for the transistor 162 described in Embodiment 2.

In the transistor 162, in which the stack of the oxide semiconductor layers of this embodiment is used as the oxide semiconductor layer 144, an electric field is not applied from one surface to the other surface of the oxide semiconductor layer and current does not flow in the thickness direction of the stack of the oxide semiconductor layers. The transistor has a structure in which current mainly flows along the interface of the stack of the oxide semiconductor layers; therefore, even when the transistor 162 is irradiated with light or even when a BT stress is applied to the transistor 162, deterioration of transistor characteristics is suppressed or reduced.

By forming the transistor 162 with the use of a stack of a first crystalline oxide semiconductor layer and a second crystalline oxide semiconductor layer, like the oxide semiconductor layer 145, the transistor can have stable electrical characteristics and high reliability.

This embodiment can be implemented in an appropriate combination with the structures described in the other embodiments.

(Embodiment 4)

In this embodiment, application of the memory device described in any of the above embodiments to a semiconductor device such as an electronic device will be described with reference to FIGS. 15A to 15F. In this embodiment, application of the above-described memory device to electronic devices such as a computer, a cellular phone (also referred to as a mobile phone or a mobile phone set), a portable information terminal (including a portable game machine, an audio reproducing device, and the like), a camera such as a digital camera or a digital video camera, electronic paper, and a television set (also referred to as a television or a television receiver) is described.

Figure 15A:
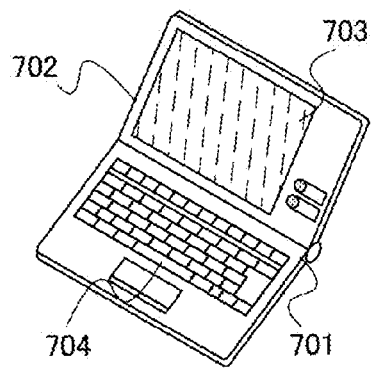
FIGS. 15A to 15F each illustrate a semiconductor device.

FIG. 15A illustrates a notebook personal computer that includes a housing 701, a housing 702, a display portion 703, a keyboard 704, and the like. In at least one of the housings 701 and 702, the memory device described in any of the above embodiments is provided. Therefore, a notebook personal computer in which writing and reading of data are performed at high speed, data is stored for a long time, and power consumption is sufficiently reduced can be realized.

Figure 15D:
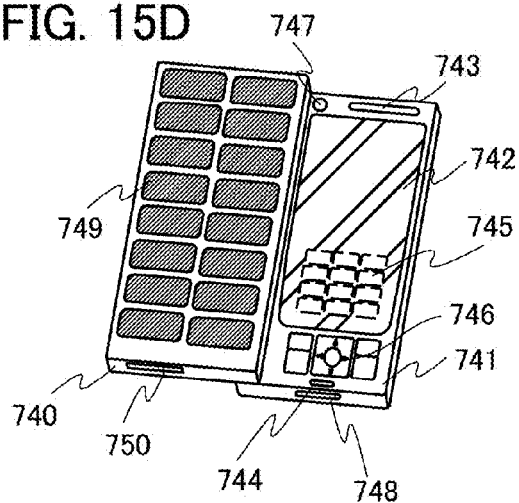
Figure 15B:
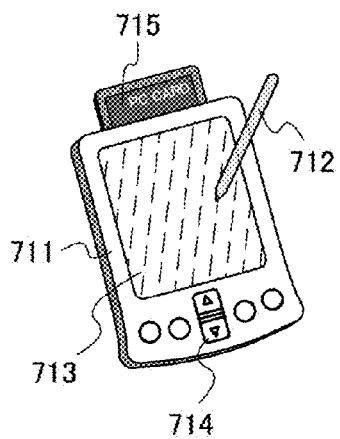

FIG. 15B illustrates a personal digital assistant (PDA). In a main body 711, a display portion 713, an external interface 715, an operation button 714, and the like are provided. Further, a stylus 712 and the like for operation of the personal digital assistant are provided. In the main body 711, the memory device described in any of the above embodiments is provided. Therefore, a personal digital assistant in which writing and reading of data are performed at high speed, data is stored for a long time, and power consumption is sufficiently reduced can be realized.

Figure 15E:
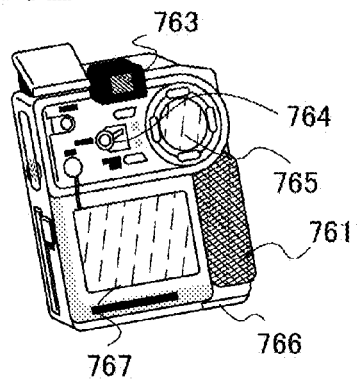
Figure 15C:
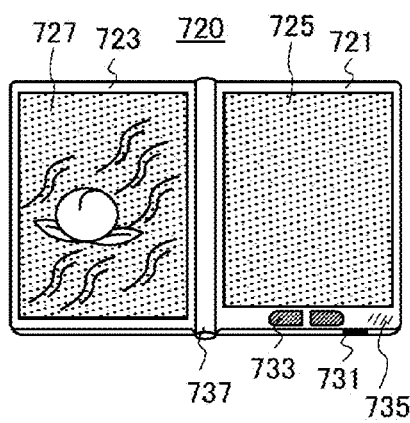

FIG. 15C illustrates an e-book reader 720 mounted with electronic paper, which includes two housings, a housing 721 and a housing 723. The housing 721 and the housing 723 are provided with a display portion 725 and a display portion 727, respectively. The housings 721 and 723 are connected by a hinge portion 737 and can be opened or closed with the hinge portion 737. The housing 721 is provided with a power switch 731, an operation key 733, a speaker 735, and the like. At least one of the housings 721 and 723 is provided with the memory device described in any of the above embodiments. Therefore, an e-book reader in which writing and reading of data are performed at high speed, data is stored for a long time, and power consumption is sufficiently reduced can be realized.

FIG. 15D illustrates a cellular phone which includes two housings, a housing 740 and a housing 741. Moreover, the housings 740 and 741 which are shown unfolded in FIG. 15D can overlap with each other by sliding; thus, the size of the cellular phone can be reduced, which makes the cellular phone suitable for being carried. The housing 741 includes a display panel 742, a speaker 743, a microphone 744, an operation key 745, a pointing device 746, a camera lens 747, an external connection terminal 748, and the like. The housing 740 includes a solar cell 749 for charging the cellular phone, an external memory slot 750, and the like. In addition, an antenna is incorporated in the housing 741. At least one of the housings 740 and 741 is provided with the memory device described in any of the above embodiments. Therefore, a cellular phone in which writing and reading of data are performed at high speed, data is stored for a long time, and power consumption is sufficiently reduced can be realized.

FIG. 15E illustrates a digital camera which includes a main body 761, a display portion 767, an eyepiece 763, an operation switch 764, a display portion 765, a battery 766, and the like. In the main body 761, the memory device described in any of the above embodiments is provided. Therefore, a digital camera in which writing and reading of data are performed at high speed, data is stored for a long time, and power consumption is sufficiently reduced can be realized.

Figure 15F:
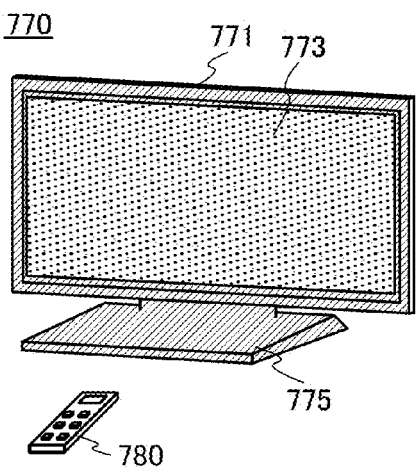

FIG. 15F illustrates a television set 770 which includes a housing 771, a display portion 773, a stand 775, and the like. The television set 770 can be operated with an operation switch of the housing 771 or a remote controller 780. The memory device described in any of the above embodiments is mounted on the housing 771 and the remote controller 780. Therefore, a television set in which writing and reading of data are performed at high speed, data is stored for a long time, and power consumption is sufficiently reduced can be realized.

As described above, the memory device in any of the above embodiments is mounted on each of the electronic devices described in this embodiment. Therefore, electronic devices in which power consumption is reduced can be realized.

(Embodiment 5)

The actually measured field-effect mobility of an insulated gate transistor can be lower than its intrinsic mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically. In this embodiment, the field-effect mobility of an ideal oxide semiconductor without a defect inside the semiconductor is calculated theoretically, and calculation results of characteristics of minute transistors that are manufactured using such an oxide semiconductor are shown.

Assuming that the intrinsic mobility and the measured field-effect mobility of a semiconductor are $\mu_0$ and $\mu$, respectively, and a potential barrier (such as a grain boundary) exists in the semiconductor, the measured field-effect mobility can be expressed as the following formula.

$$\mu = \mu_0 \exp\left(-\frac{E}{kT}\right) \qquad \text{[Formula 2]}$$

Here, E represents the height of the potential barrier, k represents the Boltzmann constant, and T represents the absolute temperature. When the potential barrier is assumed to be attributed to a defect, the height of the potential barrier can be expressed as the following formula according to the Levinson model.

$$E = \frac{e^2 N^2}{8\varepsilon n} = \frac{e^3 N^2 t}{8\varepsilon C_{ox} V_g} \qquad \text{[Formula 3]}$$

Here, e represents the elementary charge, N represents the average defect density per unit area in a channel, $\varepsilon$ represents the dielectric constant of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer. The drain current $I_d$ in a linear region can be expressed as the following formula.

$$I_d = \frac{W \mu V_g V_d C_{ox}}{L} \exp\left(-\frac{E}{kT}\right) \qquad \text{[Formula 4]}$$

Here, L represents the channel length and W represents the channel width, and L and W are each 10 μm. In addition, $V_d$ represents the drain voltage. When dividing both sides of the above equation by $V_g$ and then taking logarithms of both sides, the following formula can be obtained.

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8 k T \varepsilon C_{ox} V_g} \qquad \text{[Formula 5]}$$

The right side of Formula 5 is a function of $V_g$. From the formula, it is found that the defect density N can be obtained from the slope of a line in a graph which is obtained by plotting actual measured values with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1 \times 10^{12}/\text{cm}^2$.

On the basis of the defect density obtained in this manner, or the like, $\mu_0$ can be calculated to be 120 cm²/Vs from Formula 2 and Formula 3. The measured mobility of an In—Sn—Zn oxide including a defect is approximately 35 cm²/Vs. However, assuming that no defect exists inside the semiconductor and at the interface between the semiconductor and an insulating film, the mobility $\mu_0$ of the oxide semiconductor is expected to be 120 cm²/Vs.

Note that even when no defect exists inside a semiconductor, scattering at an interface between a channel and a gate insulating layer affects the transport property of the transistor. In other words, the mobility $\mu_1$ at a position that is distance x away from the interface between the channel and the gate insulating layer can be expressed as the following formula.

$$\frac{1}{\mu_1} = \frac{1}{\mu_0} + \frac{D}{B} \exp\left(-\frac{x}{G}\right) \qquad \text{[Formula 6]}$$

Here, D represents the electric field in the gate direction, and B and G are constants. B and G can be obtained from actual measurement results; according to the above measurement results, B is $4.75 \times 10^7$ cm/s and G is 10 nm (the depth to which the influence of interface scattering reaches). When D is increased (i.e., when the gate voltage is increased), the second term of Formula 6 is increased and accordingly the mobility $\mu_1$ is decreased.

Figure 23:
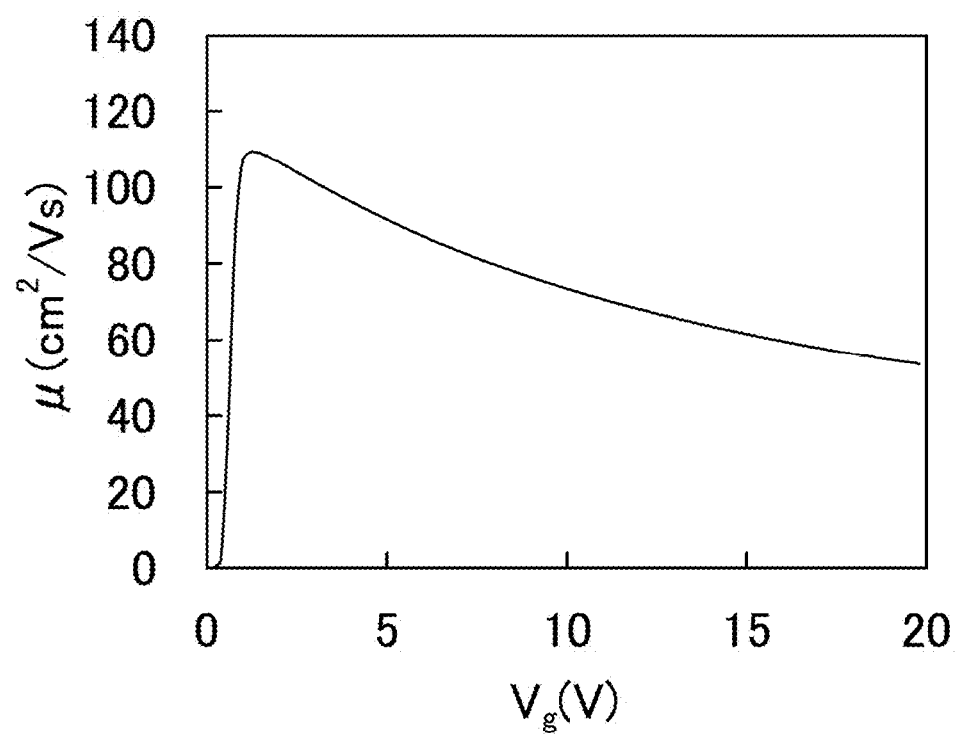
FIG. 23 shows the gate voltage dependence of mobility obtained by calculation.

Calculation results of the mobility $\mu_2$ of a transistor whose channel includes an ideal oxide semiconductor without a defect inside the semiconductor are shown in FIG. 23. For the calculation, device simulation software Sentaurus Device manufactured by Synopsys, Inc. was used, and the band gap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating layer was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 23, the mobility has a peak of more than 100 cm²/Vs at a gate voltage that is a little over 1 V and is decreased as the gate voltage becomes higher because the influence of interface scattering is increased. Note that in order to reduce interface scattering, it is desirable that a surface of the semiconductor layer be flat at the atomic level (atomic layer flatness).

Calculation results of characteristics of minute transistors which are manufactured using an oxide semiconductor having such a mobility are shown in FIGS. 24A to 24C, FIGS. 25A to 25C, and FIGS. 26A to 26C. FIGS. 27A and 27B illustrate cross-sectional structures of the transistors used for the calculation. The transistors illustrated in FIGS. 27A and 27B each include a semiconductor region 8103a and a semiconductor region 8103c which have n⁺-type conductivity in an oxide semiconductor layer. The resistivities of the semiconductor region 8103a and the semiconductor region 8103c are $2 \times 10^{-3}$ Ωcm.

The transistor illustrated in FIG. 27A is formed over a base insulating layer 8101 and an embedded insulator 8102 which is embedded in the base insulating layer 8101 and formed of aluminum oxide. The transistor includes the semiconductor region 8103a, the semiconductor region 8103c, an intrinsic semiconductor region 8103b serving as a channel formation region therebetween, and a gate 8105.

A gate insulating layer 8104 is formed between the gate 8105 and the semiconductor region 8103b. In addition, a sidewall insulator 8106a and a sidewall insulator 8106b are formed on both side surfaces of the gate 8105, and an insulator 8107 is formed over the gate 8105 so as to prevent a short circuit between the gate 8105 and another wiring. The sidewall insulator has a width of 5 nm. A source 8108a and a drain 8108b are provided in contact with the semiconductor region 8103a and the semiconductor region 8103c, respectively. Note that the channel width of this transistor is 40 nm.

The transistor of FIG. 27B is the same as the transistor of FIG. 27A in that it is formed over the base insulating layer 8101 and the embedded insulator 8102 formed of aluminum oxide and that it includes the semiconductor region 8103a, the semiconductor region 8103c, the intrinsic semiconductor region 8103b provided therebetween, the gate 8105 having a width of 33 nm, the gate insulating layer 8104, the sidewall insulator 8106a, the sidewall insulator 8106b, the insulator 8107, the source 8108a, and the drain 8108b.

The transistor illustrated in FIG. 27B is different from the transistor illustrated in FIG. 27A in the conductivity type of semiconductor regions under the sidewall insulator 8106a and the sidewall insulator 8106b. In the transistor illustrated in FIG. 27A, the semiconductor regions under the sidewall insulator 8106a and the sidewall insulator 8106b are part of the semiconductor region 8103a having n⁺-type conductivity and part of the semiconductor region 8103c having n⁺-type conductivity, whereas in the transistor illustrated in FIG. 27B, the semiconductor regions under the sidewall insulator 8106a and the sidewall insulator 8106b are part of the intrinsic semiconductor region 8103b. In other words, in the semiconductor layer of FIG. 27B, a region having a width of $L_{off}$ which overlaps with neither the semiconductor region 8103a (the semiconductor region 8103c) nor the gate 8105 is provided. This region is called an offset region, and the width $L_{off}$ is called an offset length. As is seen from the drawing, the offset length is equal to the width of the sidewall insulator 8106a (the sidewall insulator 8106b).

Figure 24A:
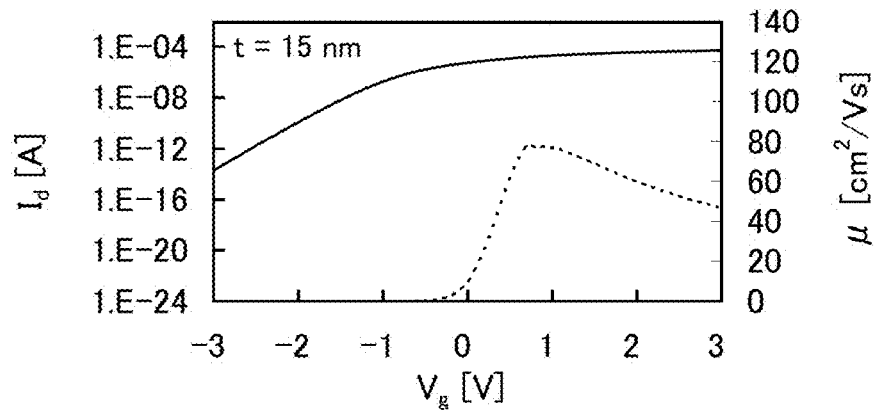
FIGS. 24A to 24C show the gate voltage dependence of drain current and mobility obtained by calculation.
Figure 24B:
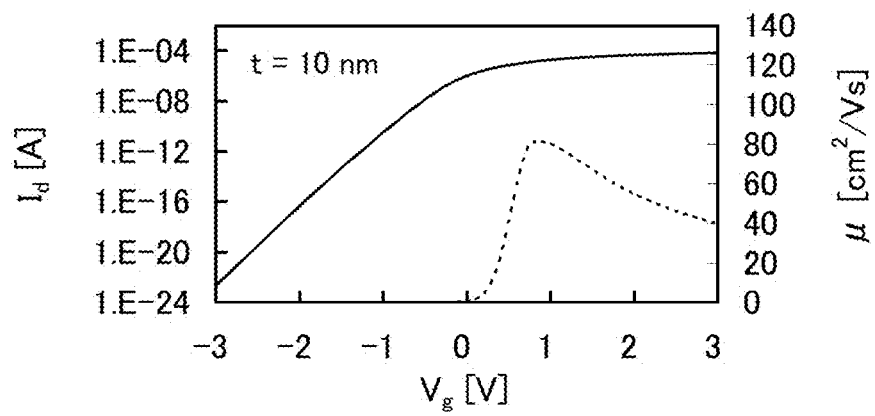
Figure 24C:
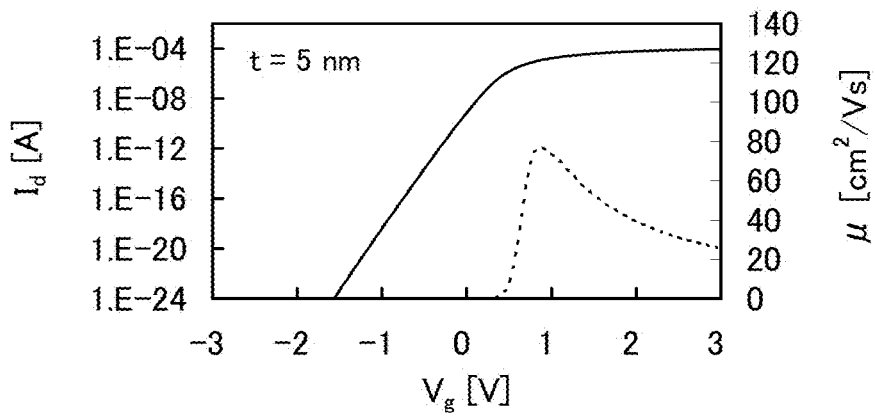

The other parameters used in calculation are as described above. For the calculation, device simulation software Sentaurus Device manufactured by Synopsys, Inc. was used. FIGS. 24A to 24C show the gate voltage ($V_g$: a potential difference between the gate and the source) dependence of the drain current ($I_d$, a solid line) and the mobility (μ, a dotted line) of the transistor having the structure illustrated in FIG. 27A. The drain current $I_d$ is obtained by calculation under the assumption that the drain voltage (a potential difference between the drain and the source) is +1 V and the mobility μ is obtained by calculation under the assumption that the drain voltage is +0.1 V.

FIG. 24A shows the gate voltage dependence of the transistor in the case where the thickness of the gate insulating layer is 15 nm, FIG. 24B shows that of the transistor in the case where the thickness of the gate insulating layer is 10 nm, and FIG. 24C shows that of the transistor in the case where the thickness of the gate insulating layer is 5 nm. As the gate insulating layer is thinner, the drain current $I_d$ (off-state current) particularly in an off state is significantly decreased. In contrast, there is no noticeable change in the peak value of the mobility μ and the drain current $I_d$ in an on state (on-state current). The graphs show that the drain current exceeds 10 μA, which is required in a memory cell and the like, at a gate voltage of around 1 V.

Figure 25A:
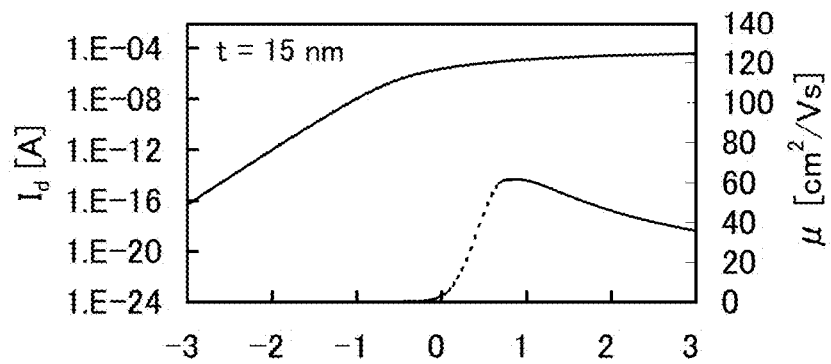
FIGS. 25A to 25C show the gate voltage dependence of drain current and mobility obtained by calculation.
Figure 25B:
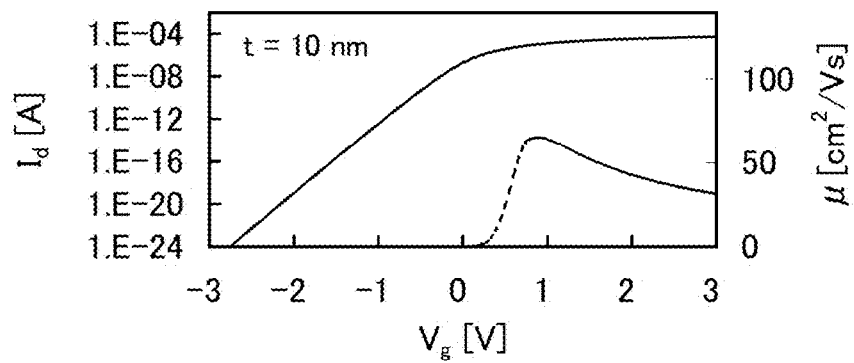
Figure 25C:
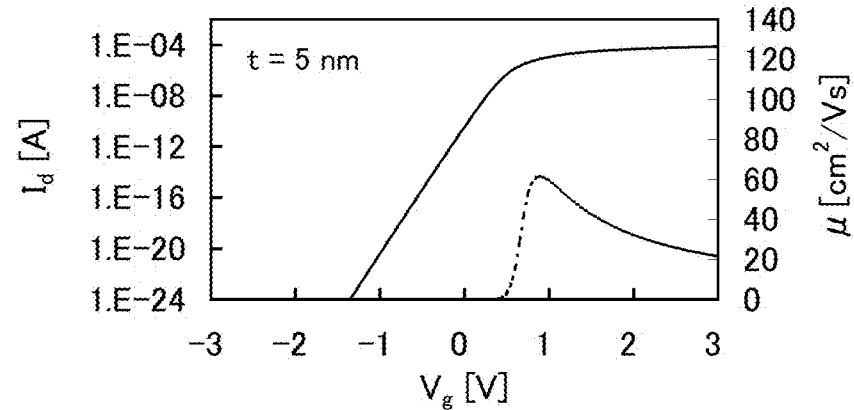

FIGS. 25A to 25C show the gate voltage $V_g$ dependence of the drain current $I_d$ (a solid line) and the mobility μ (a dotted line) of the transistor having the structure illustrated in FIG. 27B where the offset length $L_{off}$ is 5 nm. The drain current $I_d$ is obtained by calculation under the assumption that the drain voltage is +1 V and the mobility μ is obtained by calculation under the assumption that the drain voltage is +0.1 V. FIG. 25A shows the gate voltage dependence of the transistor in the case where the thickness of the gate insulating layer is 15 nm, FIG. 25B shows that of the transistor in the case where the thickness of the gate insulating layer is 10 nm, and FIG. 25C shows that of the transistor in the case where the thickness of the gate insulating layer is 5 nm.

Figure 26A:
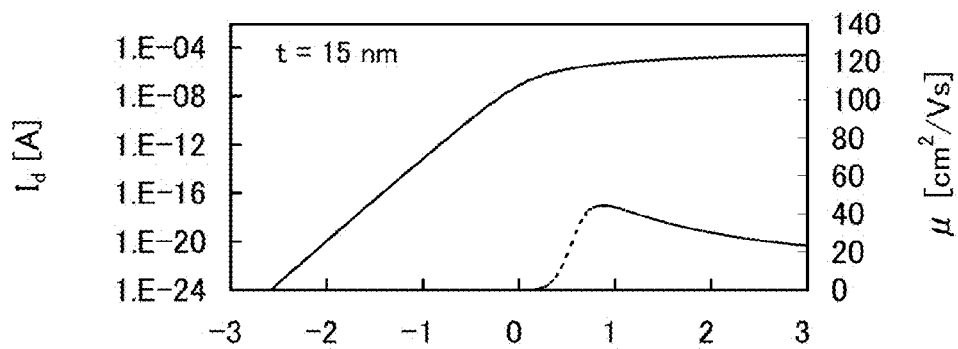
FIGS. 26A to 26C show the gate voltage dependence of drain current and mobility obtained by calculation.
Figure 26B:
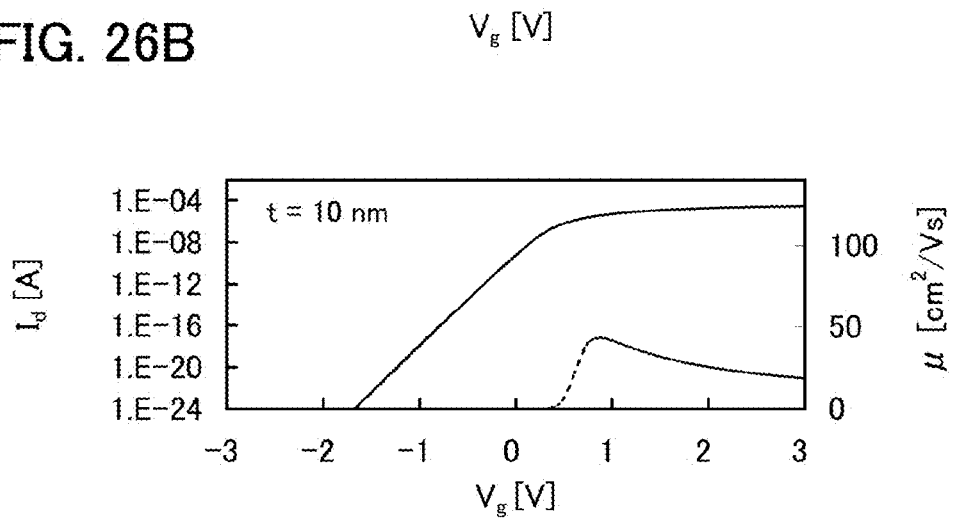
Figure 26C:
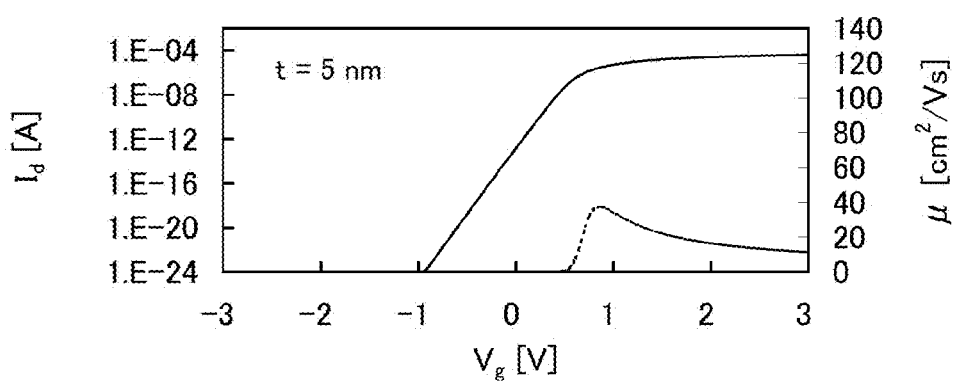
Figure 27A:
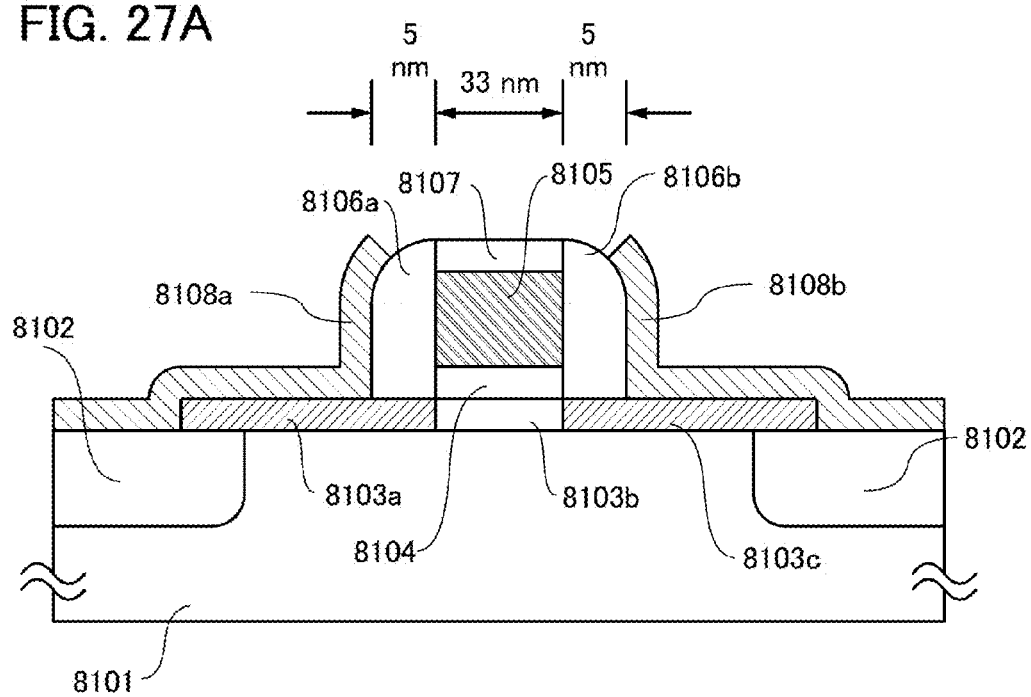
FIGS. 27A and 27B illustrate cross-sectional structures of transistors which are used in calculation.
Figure 27B:
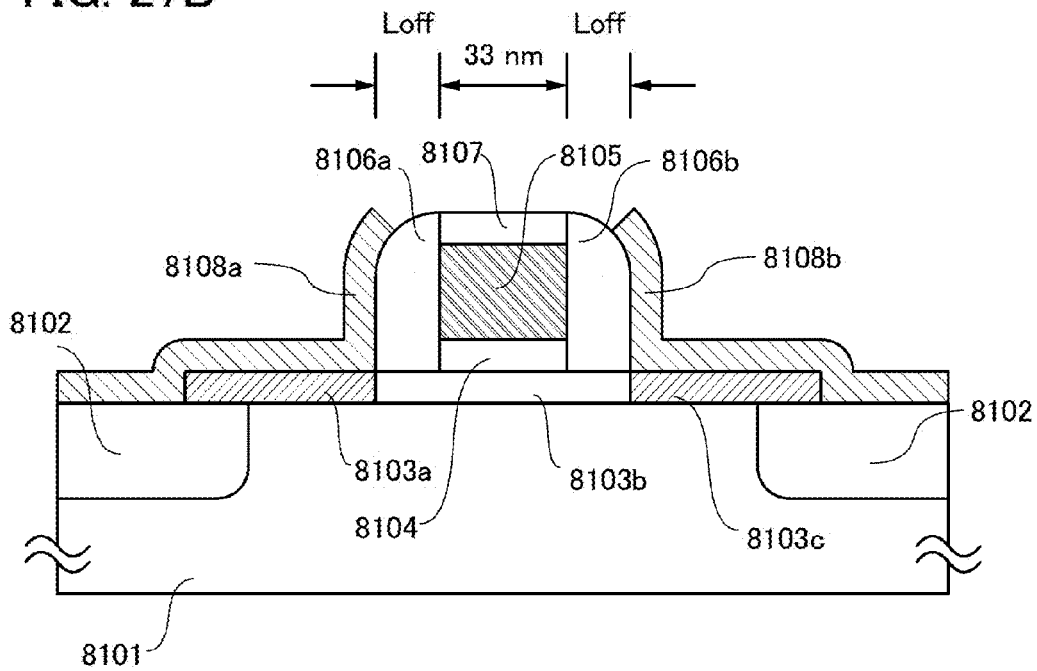

Further, FIGS. 26A to 26C show the gate voltage dependence of the drain current $I_d$ (a solid line) and the mobility μ (a dotted line) of the transistor having the structure illustrated in FIG. 27B where the offset length $L_{off}$ is 15 nm. The drain current $I_d$ is obtained by calculation under the assumption that the drain voltage is +1 V and the mobility μ is obtained by calculation under the assumption that the drain voltage is +0.1 V. FIG. 26A shows the gate voltage dependence of the transistor in the case where the thickness of the gate insulating layer is 15 nm, FIG. 26B shows that of the transistor in the case where the thickness of the gate insulating layer is 10 nm, and FIG. 26C shows that of the transistor in the case where the thickness of the gate insulating layer is 5 nm.

In either of the structures, as the gate insulating layer is thinner, the off-state current is significantly decreased, whereas no noticeable change arises in the peak value of the mobility and the on-state current.

Note that the peak of the mobility μ is approximately 80 cm²/Vs in FIGS. 24A to 24C, approximately 60 cm²/Vs in FIGS. 25A to 25C, and approximately 40 cm²/Vs in FIGS. 26A to 26C; thus, the peak of the mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA, which is required in a memory cell and the like, at a gate voltage of around 1 V.

This embodiment can be implemented by being combined as appropriate with any of the above-described embodiments.

(Embodiment 6)

A transistor in which an oxide semiconductor containing In, Sn, and Zn as main components is used as a channel formation region can have favorable characteristics by depositing the oxide semiconductor while heating a substrate or by performing heat treatment after an oxide semiconductor film is formed. Note that a main component refers to an element included in a composition at greater than or equal to 5 atomic %. In this embodiment, the case where the field effect mobility of the transistor is improved by intentionally heating the substrate after formation of the oxide semiconductor film will be described with reference to FIGS. 28A to 28C, FIGS. 29A and 29B, FIGS. 30A and 30B, FIG. 31, FIG. 32, FIG. 33, and FIGS. 34A and 34B.

By intentionally heating the substrate after formation of the oxide semiconductor film including In, Sn, and Zn as main components, the field-effect mobility of the transistor can be improved. Further, the threshold voltage of the transistor can be positively shifted to make the transistor normally off.

Figure 28A:
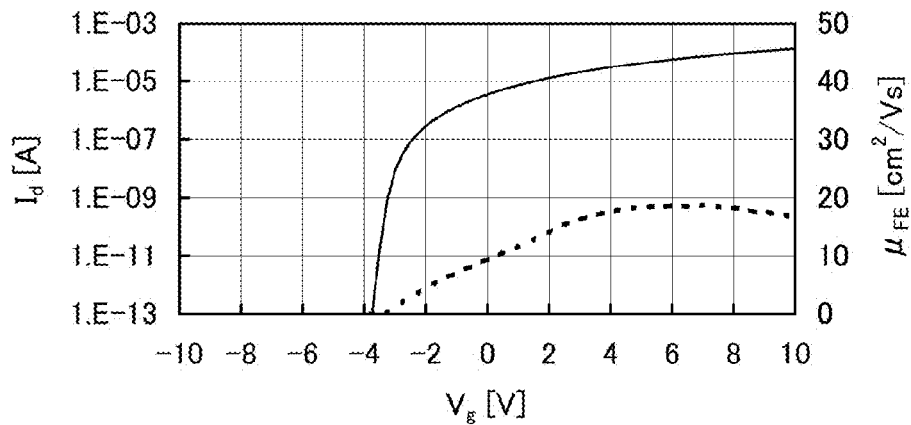
FIGS. 28A to 28C are graphs each showing characteristics of a transistor including an oxide semiconductor film.
Figure 28B:
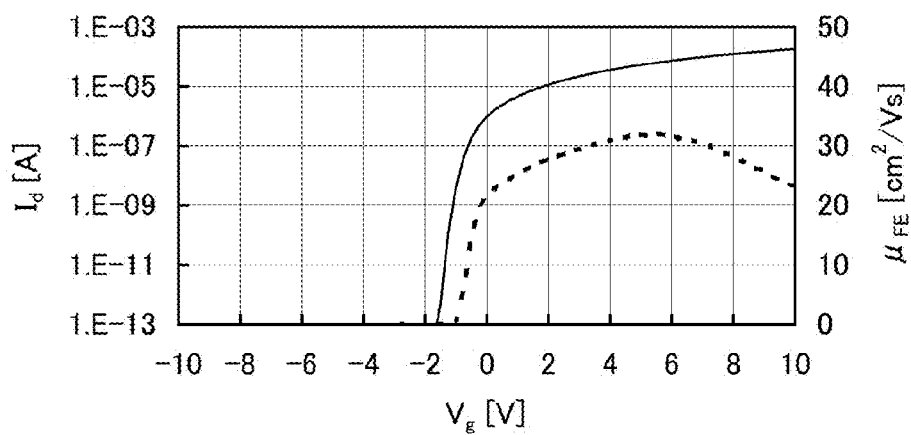
Figure 28C:
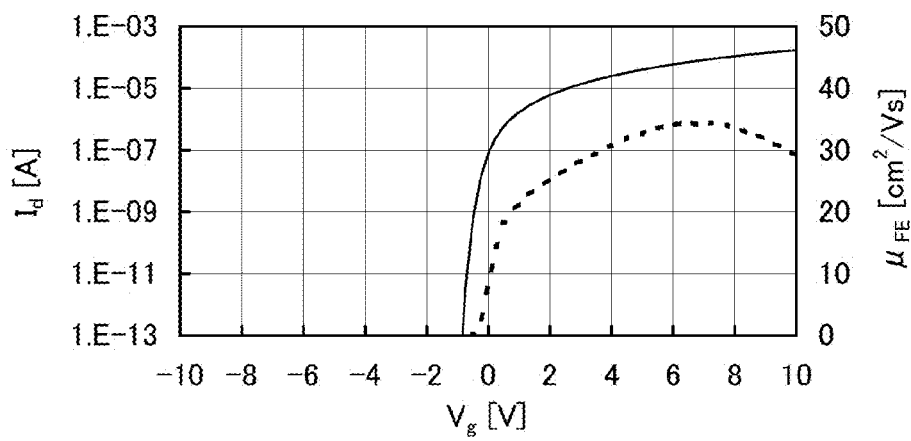

As an example, FIGS. 28A to 28C each show characteristics of a transistor in which an oxide semiconductor film including In, Sn, and Zn as main components and having a channel length L of 3 μm and a channel width W of 10 μm, and a gate insulating film with a thickness of 100 nm are used. Note that $V_d$ was set to 10 V.

FIG. 28A shows characteristics of a transistor whose oxide semiconductor film including In, Sn, and Zn as main components was formed by a sputtering method without heating a substrate intentionally. The field-effect mobility of the transistor is 18.8 cm$^2$/Vsec. On the other hand, when the oxide semiconductor film including In, Sn, and Zn as main components is formed while heating the substrate intentionally, the field-effect mobility can be improved. FIG. 28B shows characteristics of a transistor whose oxide semiconductor film including In, Sn, and Zn as main components was formed while heating a substrate at 200° C. The field-effect mobility of the transistor is 32.2 cm$^2$/Vsec.

The field-effect mobility can be further improved by performing heat treatment after formation of the oxide semiconductor film including In, Sn, and Zn as main components. FIG. 28C shows characteristics of a transistor whose oxide semiconductor film including In, Sn, and Zn as main components was formed by sputtering at 200° C. and then subjected to heat treatment at 650° C. The field-effect mobility of the transistor is 34.5 cm$^2$/Vsec.

The intentional heating of the substrate is expected to have an effect of reducing moisture taken into the oxide semiconductor film during the formation by sputtering. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor can be crystallized by being purified by removal of impurities from the oxide semiconductor. In the case of using such a purified non-single crystal oxide semiconductor, ideally, a field-effect mobility exceeding 100 cm$^2$/Vsec is expected to be realized.

The oxide semiconductor including In, Sn, and Zn as main components may be crystallized in the following manner: oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor film that includes In, Sn, and Zn as main components and is formed without heating a substrate intentionally is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 28A and 28B.

Note that the threshold voltage can also be controlled by changing the ratio of In, Sn, and Zn; when the composition ratio of In, Sn, and Zn is 2:1:3, a normally-off transistor is expected to be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied under a condition of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_g$-$I_d$ characteristics of the transistors were measured at a substrate temperature of 25° C. and $V_{ds}$ of 10 V. Note that $V_{ds}$ refers to a drain voltage (a potential difference between a drain and a source). Then, the substrate temperature was set to 150° C. and $V_{ds}$ was set to 0.1 V. After that, 20 V of $V_g$ was applied so that an electric field intensity applied to gate insulating films was 2 MV/cm, and the condition was kept for one hour. Next, $V_g$ was set to 0 V. Then, $V_g$-$I_d$ characteristics of the transistors were measured at a substrate temperature of 25° C. and $V_{ds}$ of 10 V. This process is called a positive BT test.

In a similar manner, first, $V_g$-$I_d$ characteristics of the transistors were measured at a substrate temperature of 25° C. and $V_{ds}$ of 10 V. Then, the substrate temperature was set at 150° C. and $V_{ds}$ was set to 0.1 V. After that, −20 V of $V_g$ was applied so that an electric field intensity applied to the gate insulating films was −2 MV/cm, and the condition was kept for one hour. Next, $V_g$ was set to 0 V. Then, $V_g$-$I_d$ characteristics of the transistors were measured at a substrate temperature of 25° C. and $V_{ds}$ of 10 V. This process is called a negative BT test.

Figure 29A:
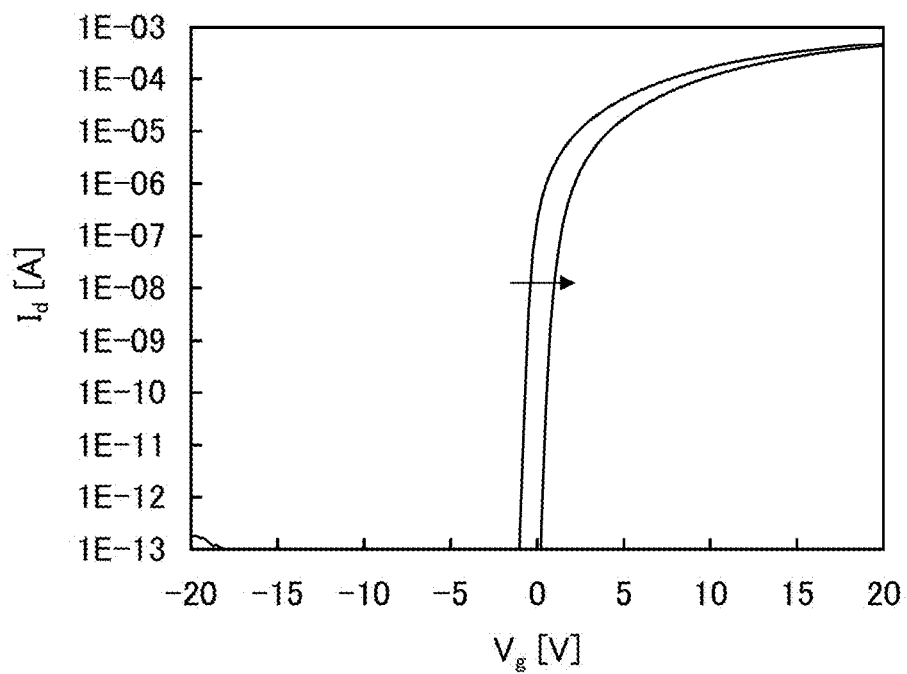
FIGS. 29A and 29B show $V_g$-$I_d$ characteristics after a BT test of a transistor of Sample 1.
Figure 29B:
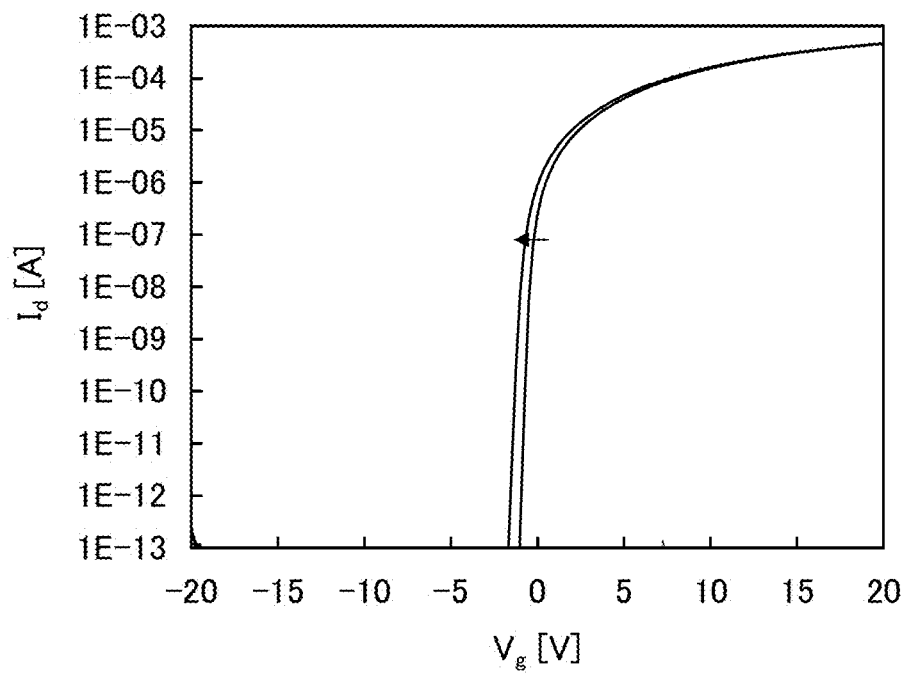
Figure 30A:
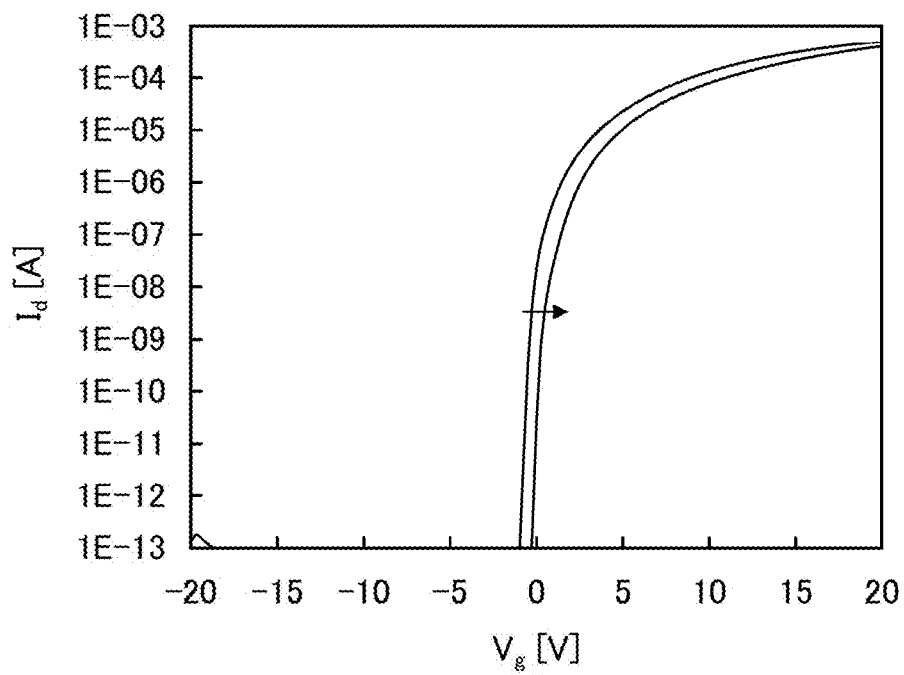
FIGS. 30A and 30B show $V_g$-$I_d$ characteristics after a BT test of a transistor of Sample 2.
Figure 30B:
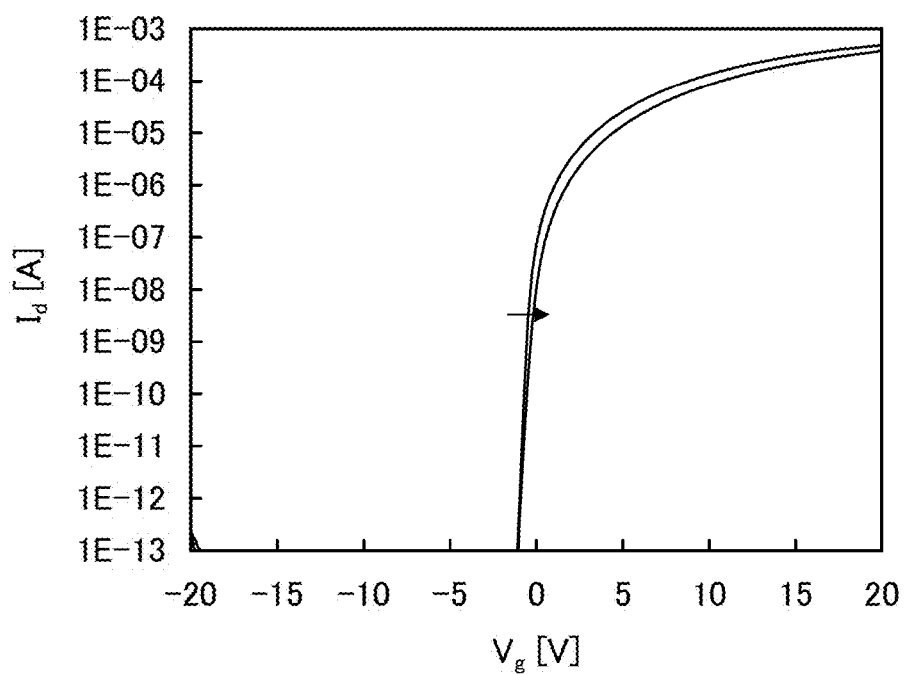

FIGS. 29A and 29B show a result of the positive BT test of Sample 1 and a result of the negative BT test of Sample 1, respectively. FIGS. 30A and 30B show a result of the positive BT test of Sample 2 and a result of the negative BT test of Sample 2, respectively.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a film in contact with the oxide semiconductor; however, when excess oxygen is included in the oxide semiconductor by the heat treatment, oxygen deficiency caused constantly can be compensated for with excess oxygen. The excess oxygen is oxygen existing mainly between lattices. When the concentration of excess oxygen is set to higher than or equal to $1 \times 10^{16}$/cm$^{-3}$ and lower than or equal to $2 \times 10^{20}$/cm$^{-3}$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 31:
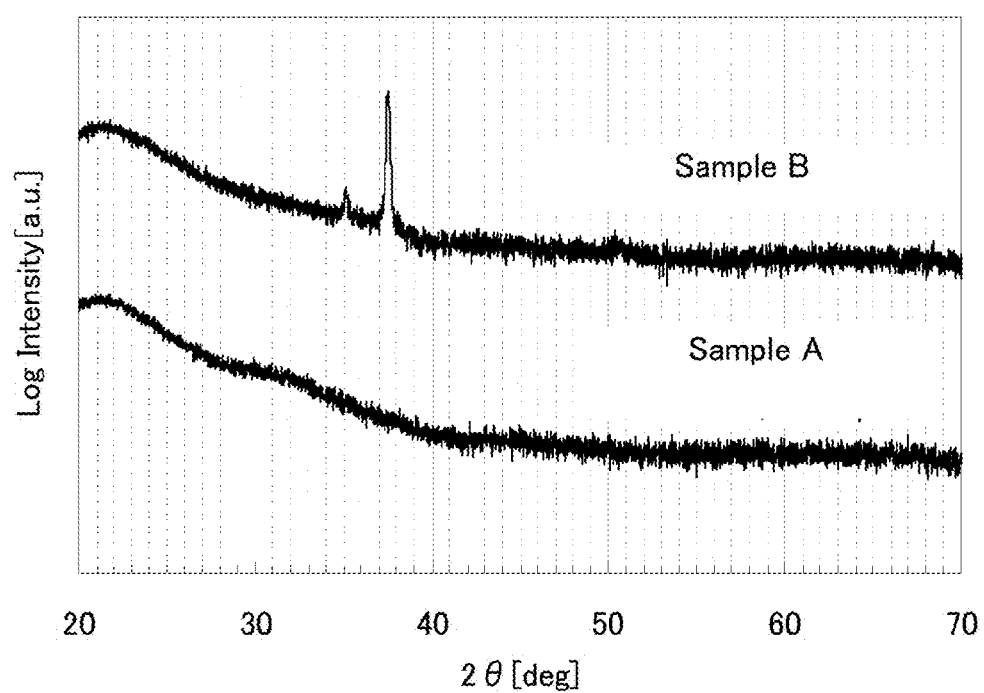
FIG. 31 shows XRD spectra of Sample A and Sample B.

FIG. 31 shows XRD spectra of Sample A and Sample B. No peak derived from crystal was observed in Sample A, whereas peaks derived from crystal were observed when 2θ was around 35 deg. and 37 deg. to 38 deg. in Sample B.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be purified by removing hydrogen serving as a donor impurity from the oxide semiconductor, whereby a normally-off transistor can be obtained. The purification of an oxide semiconductor enables the off-state current of the transistor to be 1 aA/μm or lower. Here, the unit of the off-state current is used to indicate current per micrometer of a channel width.

Figure 32:
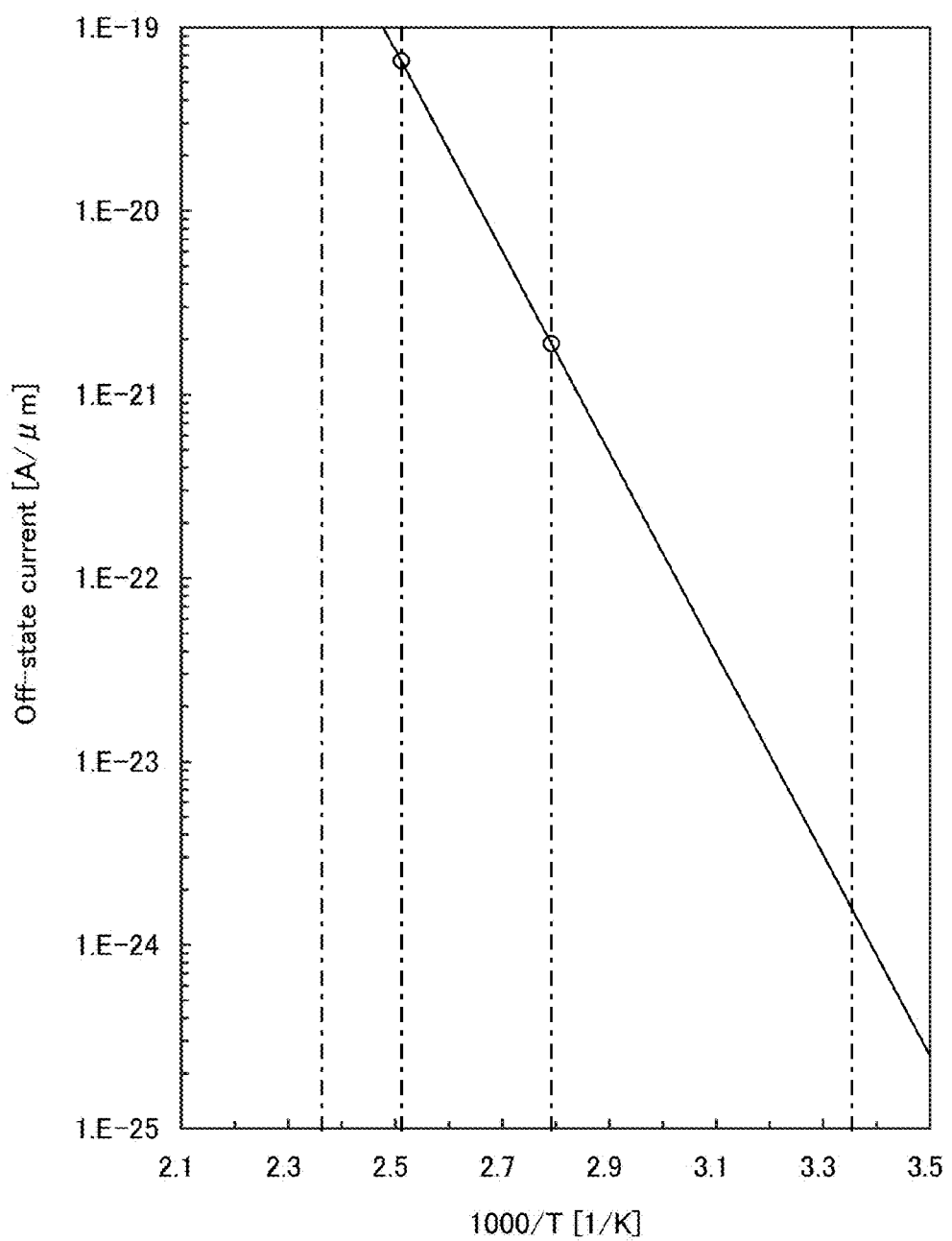
FIG. 32 is a graph showing relation between off-state current and substrate temperature in measurement of a transistor.

FIG. 32 shows a relation between the off-state current of a transistor and the inverse of substrate temperature (absolute temperature) T at measurement. Here, for simplicity, the horizontal axis represents a value (1000/T) obtained by multiplying an inverse of substrate temperature at measurement by 1000.

Specifically, as shown in FIG. 32, the off-state current can be 1 aA/μm ($1 \times 10^{-18}$ A/μm) or lower, 100 zA/μm ($1 \times 10^{-19}$ A/μm) or lower, and 1 zA/μm ($1 \times 10^{-21}$ A/μm) or lower when the substrate temperature is 125° C., 85° C., and room temperature (27° C.), respectively. Preferably, the off-state current can be 0.1 aA/μm ($1 \times 10^{-19}$ A/μm) or lower, 10 zA/μm ($1 \times 10^{-20}$ A/μm) or lower, and 0.1 zA/μm ($1 \times 10^{-22}$ A/μm) or lower at 125° C., 85° C., and room temperature, respectively. The above values of off-state currents are clearly much lower than that of the transistor using Si as a semiconductor film.

Note that in order to prevent hydrogen and moisture from being included in the oxide semiconductor film during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target which is purified so as not to include impurities such as hydrogen and moisture. Although it is possible to remove moisture from a film of an oxide semiconductor including In, Sn, and Zn as main components by heat treatment, a film which does not include moisture originally is preferably formed because moisture is released from the oxide semiconductor including In, Sn, and Zn as main components at a higher temperature than from an oxide semiconductor including In, Ga, and Zn as main components.

The relation between the substrate temperature and electrical characteristics of a transistor formed using Sample B, on which heat treatment at 650° C. was performed after formation of the oxide semiconductor film, was evaluated.

The transistor used for the measurement has a channel length L of 3 μm, a channel width W of 10 μm, Lov of 0 μm, and dW of 0 μm. Note that $V_{ds}$ was set to 10 V. Note that the substrate temperature was −40° C., −25° C., 25° C., 75° C., 125° C., and 150° C. Here, in a transistor, the width of a portion where a gate electrode overlaps with one of a pair of electrodes is referred to as Lov, and the width of a portion of the pair of electrodes, which does not overlap with an oxide semiconductor film, is referred to as dW.

Figure 33:
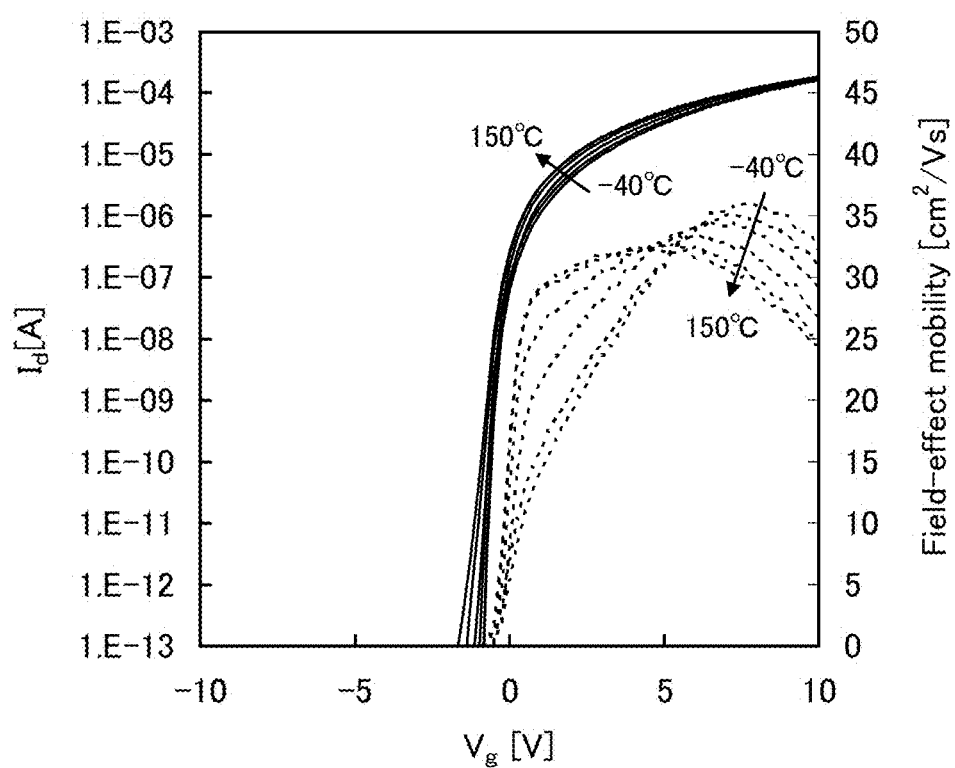
FIG. 33 is a graph showing $V_g$ dependence of $I_d$ and field-effect mobility.
Figure 34A:
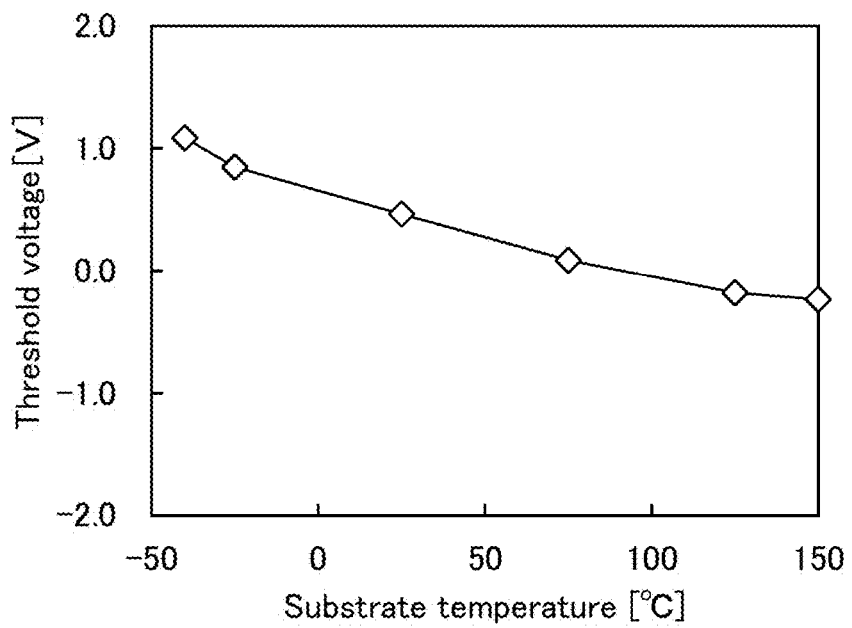
FIG. 34A is a graph showing relation between substrate temperature and threshold voltage.

FIG. 33 shows the $V_g$ dependence of $I_d$ (a solid line) and field-effect mobility (a dotted line). FIG. 34A shows a relation between the substrate temperature and the threshold voltage, and FIG. 34B shows a relation between the substrate temperature and the field-effect mobility.

From FIG. 34A, it is found that the threshold voltage gets lower as the substrate temperature increases. Note that the threshold voltage is decreased from 1.09 V to −0.23 V in the range from −40° C. to 150° C.

Figure 34B:
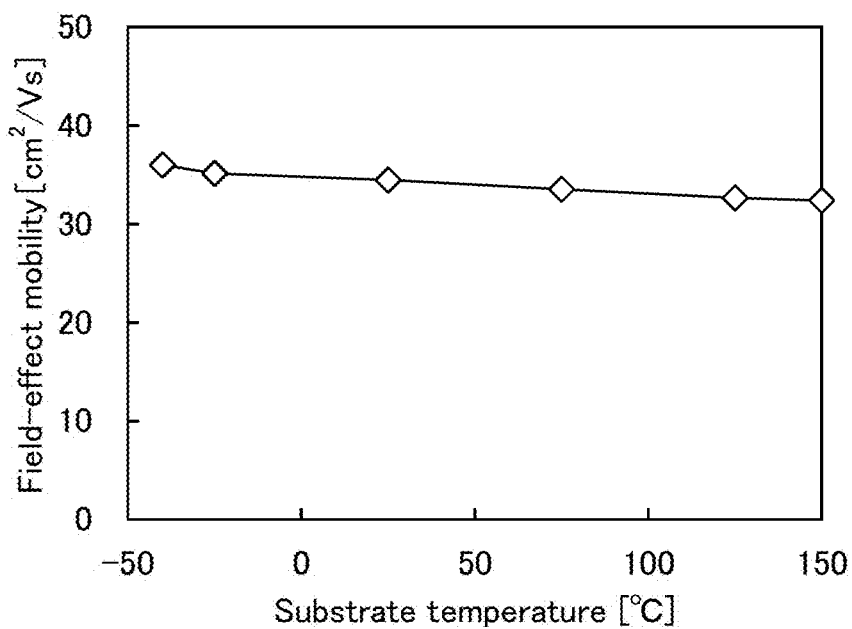
FIG. 34B is a graph showing relation between substrate temperature and field-effect mobility.

From FIG. 34B, it is found that the field-effect mobility gets lower as the substrate temperature increases. Note that the field-effect mobility is decreased from 36 $cm^2$/Vs to 32 $cm^2$/VS in the range from −40° C. to 150° C. Thus, it is found that variation in electrical characteristics is small in the above temperature range.

In a transistor in which such an oxide semiconductor including In, Sn, and Zn as main components is used as a channel formation region, a field-effect mobility of 30 $cm^2$/Vsec or higher, preferably 40 $cm^2$/Vsec or higher, further preferably 60 $cm^2$/Vsec or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electrical characteristics can be ensured in a temperature range needed for operation of a transistor. With such characteristics, an integrated circuit having a novel function can be realized without decreasing the operation speed even when a transistor including an oxide semiconductor is also provided in an integrated circuit formed using a Si semiconductor.

As described above, by intentionally heating a substrate during deposition of an oxide semiconductor including In, Sn, and Zn as main components and/or by performing heat treatment after the deposition, characteristics of a transistor can be improved.

This embodiment can be implemented by being combined as appropriate with any of the above embodiments.

EXAMPLE 1

In this example, an example of a transistor in which an In—Sn—Zn—O film is used as an oxide semiconductor film will be described with reference to FIGS. 35A and 35B and the like.

Figure 35A:
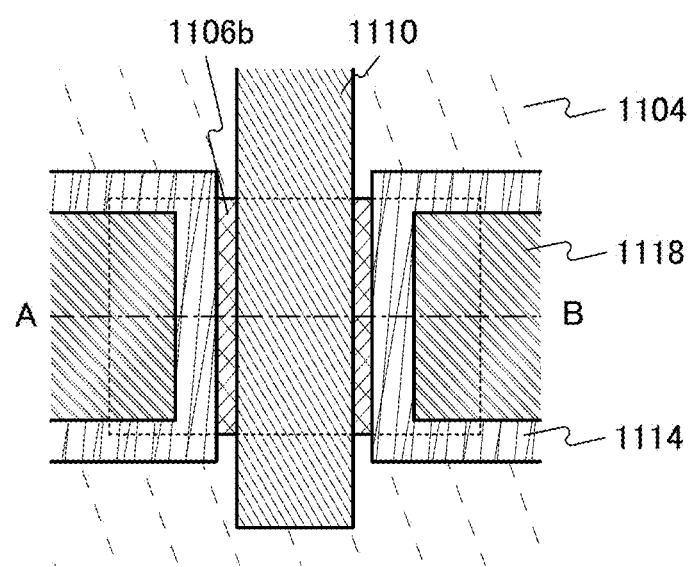
FIGS. 35A and 35B are a top view and a cross-sectional view of a semiconductor device.
Figure 35B:
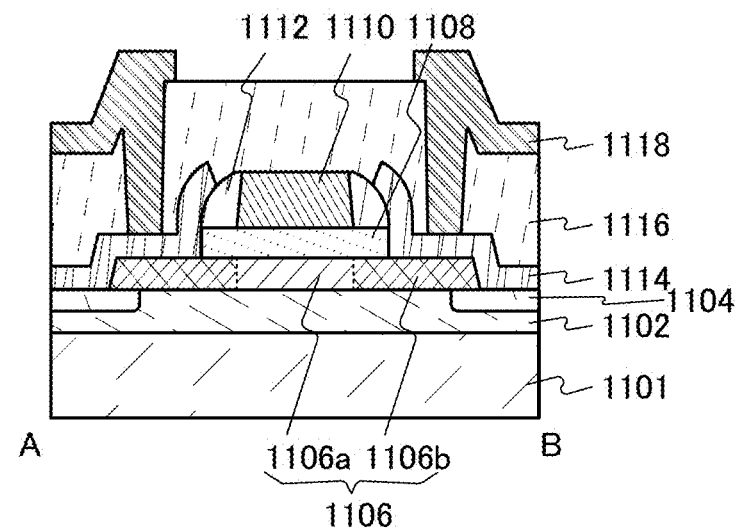

FIGS. 35A and 35B are a top view and a cross-sectional view of a coplanar transistor having a top-gate top-contact structure. FIG. 35A is the top view of the transistor. FIG. 35B illustrates cross section A-B along dashed-dotted line A-B in FIG. 35A.

The transistor illustrated in FIG. 35B includes a substrate 1101; a base insulating layer 1102 provided over the substrate 1101; a protective insulating film 1104 provided in the periphery of the base insulating layer 1102; an oxide semiconductor film 1106 provided over the base insulating layer 1102 and the protective insulating film 1104 and including a high-resistance region 1106a and low-resistance regions 1106b; a gate insulating film 1108 provided over the oxide semiconductor film 1106; a gate electrode 1110 provided to overlap with the oxide semiconductor film 1106 with the gate insulating film 1108 positioned therebetween; a sidewall insulating film 1112 provided in contact with a side surface of the gate electrode 1110; a pair of electrodes 1114 provided in contact with at least the low-resistance regions 1106b; an interlayer insulating film 1116 provided to cover at least the oxide semiconductor film 1106, the gate electrode 1110, and the pair of electrodes 1114; and a wiring 1118 provided to be electrically connected to at least one of the pair of electrodes 1114 through an opening formed in the interlayer insulating film 1116.

Although not illustrated, a protective film may be provided to cover the interlayer insulating film 1116 and the wiring 1118. With the protective film, a minute amount of leakage current generated by surface conduction of the interlayer insulating film 1116 can be reduced and thus the off-state current of the transistor can be reduced.

This example can be implemented by being combined as appropriate with any of the above embodiments.

EXAMPLE 2

In this example, another example of a transistor in which an In—Sn—Zn—O film is used as an oxide semiconductor film will be described.

Figure 36A:
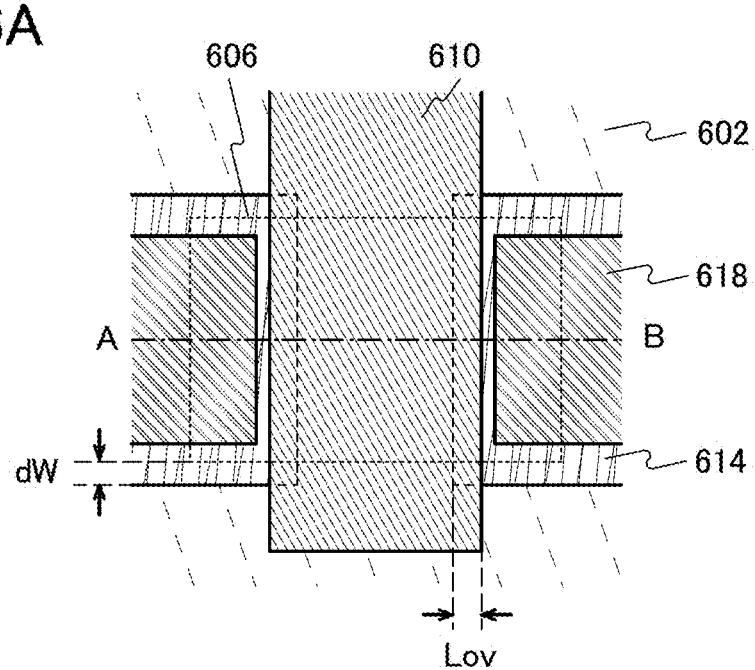
FIGS. 36A and 36B are a top view and a cross-sectional view of a semiconductor device.
Figure 36B:
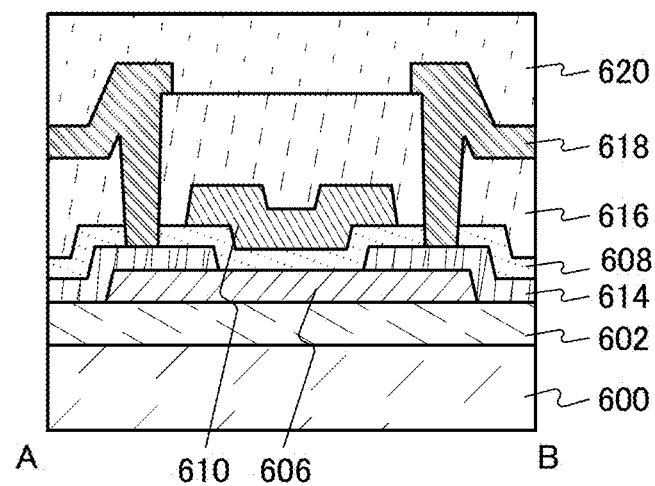

FIGS. 36A and 36B are a top view and a cross-sectional view which illustrate a structure of a transistor manufactured in this example. FIG. 36A is the top view of the transistor. FIG. 36B is a cross-sectional view along dashed-dotted line A-B in FIG. 36A.

The transistor illustrated in FIG. 36B includes a substrate 600; a base insulating layer 602 provided over the substrate 600; an oxide semiconductor film 606 provided over the base insulating layer 602; a pair of electrodes 614 in contact with the oxide semiconductor film 606; a gate insulating film 608 provided over the oxide semiconductor film 606 and the pair of electrodes 614; a gate electrode 610 provided to overlap with the oxide semiconductor film 606 with the gate insulating film 608 positioned therebetween; an interlayer insulating film 616 provided to cover the gate insulating film 608 and the gate electrode 610; wirings 618 electrically connected to the pair of electrodes 614 through openings formed in the gate insulating film 608 and the interlayer insulating film 616; and a protective film 620 provided to cover the interlayer insulating film 616 and the wirings 618.

As the substrate 600, a glass substrate can be used. As the base insulating layer 602, a silicon oxide film can be used. As the oxide semiconductor film 606, an In—Sn—Zn—O film can be used. As the pair of electrodes 614, a tungsten film can be used. As the gate insulating film 608, a silicon oxide film can be used. The gate electrode 610 can have a stacked structure of a tantalum nitride film and a tungsten film. The interlayer insulating film 616 can have a stacked structure of a silicon oxynitride film and a polyimide film. The wirings 618 can each have a stacked structure in which a titanium film, an aluminum film, and a titanium film are formed in this order. As the protective film 620, a polyimide film can be used.

Note that in the transistor having the structure illustrated in FIG. 36A, the width of a portion where the gate electrode 610 overlaps with one of the pair of electrodes 614 is referred to as Lov. Similarly, the width of a portion of the pair of electrodes 614, which does not overlap with the oxide semiconductor film 606, is referred to as dW.

This example can be implemented by being combined as appropriate with any of the above embodiments and example.

EXPLANATION OF REFERENCE

100: substrate, 106: element separation insulating layer, 108: gate insulating layer, 110: gate electrode, 116: channel formation region, 120: impurity region, 124: metal compound region, 126: electrode, 128: insulating layer, 140: insulating layer, 144: oxide semiconductor layer, 145: oxide semiconductor layer, 146: gate insulating layer, 148: electrode layer, 150: insulating layer, 151: insulating layer, 152: insulating layer, 156: wiring, 159: conductive layer, 160: transistor, 162: transistor, 164: capacitor, 170: memory cell, 201: memory cell array, 210: peripheral circuit, 211: driver circuit, 212: driver circuit, 213: driver circuit, 214: driver circuit, 215: driver circuit, 218: controller, 219: mode register, 220: I/O buffer, 221: address buffer, 222: sense amplifier, 250: center point, 401: transistor, 402: transistor, 403: transistor, 404: transistor, 405: transistor, 406: transistor, 407: transistor, 408: transistor, 409: transistor, 410: transistor, 411: transistor, 500: electrode, 551: electrode, 552: electrode, 553: electrode, 556: electrode, 557: electrode, 601: memory cell array, 611: bit line driver circuit, 612: word line driver circuit, 600: substrate, 602: base insulating layer, 604: one pair of electrodes, 606: oxide semiconductor film, 608: gate insulating film, 610: gate electrode, 614: one pair of electrodes, 616: interlayer insulating film, 618: wiring, 620: protective film, 701: housing, 702: housing, 703: display portion, 704: keyboard, 711: main body, 712: stylus, 713: display portion, 714: operation button, 715: external interface, 720: e-book reader, 721: housing, 723: housing, 725: display portion, 727: display portion, 731: power switch, 733: operation key, 735: speaker, 737: hinge portion, 740: housing, 741: housing, 742: display panel, 743: speaker, 744: microphone, 745: operation key, 746: pointing device, 747: camera lens, 748: external connection terminal, 749: solar cell, 750: external memory slot, 761: main body, 763: eyepiece, 764: operation switch, 765: display portion, 766: battery, 767: display portion, 770: television device, 771: housing, 773: display portion, 775: stand, 780: remote controller, 840: electrode, 841: electrode, 842: insulating layer, 130a: drain electrode, 130b: drain electrode, 136a: electrode, 136b: electrode, 136c: electrode, 142a: electrode, 142b: electrode, 143a: oxide conductive layer, 143b: oxide conductive layer, 145a: crystalline oxide semiconductor layer, 145*b*: crystalline oxide semiconductor layer, 148*a*: electrode, 148*b*: conductive layer, 154*a*: electrode, 170*a*: memory cell, 170*b*: memory cell, 170*c*: memory cell, 170*d*: memory cell, 201*a*: memory cell array, 201*b*: memory cell array, 211*a*: driver circuit, 211*b*: driver circuit, 212*a*: driver circuit, 212*b*: driver circuit, 213*a*: driver circuit, 213*b*: driver circuit, 214*a*: driver circuit, 214*b*: driver circuit, 216*a*: sense amplifier group, 216*b*: sense amplifier group, 217*a*: column decoder, 217*b*: column decoder, 223*a*: row decoder, 223*b*: row decoder, 501*a*: electrode, 501*b*: electrode, 502*a*: electrode, 502*b*: electrode, 601A: memory cell array, 601B: memory cell array, 601C: memory cell array, 601D: memory cell array, 1101: substrate, 1102: base insulating layer, 1104: protective insulating film, 1106*a*: high-resistance region, 1106*b*: low-resistance region, 1106: oxide semiconductor film, 1108: gate insulating film, 1110: gate electrode, 1112: sidewall insulating film, 1114: one pair of electrodes, 1116: interlayer insulating film, 1118: wiring, 8101: base insulating layer, 8102: embedded insulator, 8103*a*: semiconductor region, 8103*b*: semiconductor region, 8103*c*: semiconductor region, 8104: gate insulating layer, 8105: gate, 8106*a*: sidewall insulator, 8106*b*: sidewall insulator, 8107: insulator, 8108*a*: source, and 8108*b*: drain.

This application is based on Japanese Patent Application serial no. 2010-204090 filed with Japan Patent Office on Sep. 13, 2010, and Japanese Patent Application serial no. 2011-108899 filed with Japan Patent Office on May 14, 2011, the entire contents of which are hereby incorporated by reference.

The invention claimed is:

1. A memory device comprising:
a driver circuit comprising a bit line driver circuit and a word line driver circuit over a substrate;
a plurality of memory cell arrays that is provided over the driver circuit and includes a first memory cell array and a second memory cell array stacked to overlap with each other, wherein each memory cell array comprises a plurality of memory cells arranged in matrix, and each memory cell comprises a transistor;
1st to n-th bit lines each of which is electrically connected to and driven by the bit line driver circuit and is electrically connected to a source or a drain of at least one of the transistors included in the plurality of memory cells; and
1st to m-th word lines each of which is electrically connected to and driven by the word line driver circuit and is electrically connected to a gate of at least one of the transistors included in the plurality of memory cells;
wherein a total number of the memory cells included in the memory device is n×m,
wherein 1st to x-th bit lines are provided in the first memory cell array, and (x+1)-th to y-th bit lines are provided in the second memory cell array,
wherein the driver circuit comprises a transistor including a channel formation region provided in a semiconductor substrate comprising silicon, and
wherein each of the transistors included in the memory cells comprises a channel formation region provided in an oxide semiconductor layer.

2. The memory device according to claim 1, wherein y is equal to n.

3. The memory device according to claim 1,
wherein the plurality of memory cell arrays include a third memory cell array that is stacked to overlap with the first and second memory cell arrays,
wherein (y+1)-th to n-th bit lines are provided in the third memory cell array.

4. The memory device according to claim 1,
wherein the plurality of memory cell arrays include a third memory cell array and a fourth memory cell array that are stacked to overlap with the first and second memory cell arrays,
wherein (y+1)-th to z-th bit lines are provided in the third memory cell array, and
wherein (z+1)-th to n-th bit lines are provided in the fourth memory cell array.

5. The memory device according to claim 1, wherein each of the memory cells further comprises a capacitor.

6. The memory device according to claim 1, wherein the 1st word line comprises a word line α provided in the first memory cell array and a word line β provided in the second memory cell array, and the word line α and the word line β are electrically connected to each other.

7. The memory device according to claim 6, wherein the word line α and the word line β are arranged so as not to overlap with each other.

8. A memory device comprising:
a driver circuit comprising a bit line driver circuit and a word line driver circuit over a substrate;
a plurality of memory cell arrays that is provided over the driver circuit and includes a first memory cell array and a second memory cell array stacked to overlap with each other, wherein each memory cell array comprises a plurality of memory cells arranged in matrix, and each memory cell comprises a transistor;
1st to n-th bit lines each of which is electrically connected to and driven by the bit line driver circuit and is electrically connected to a source or a drain of at least one of the transistors included in the plurality of memory cells; and
1st to m-th word lines each of which is electrically connected to and driven by the word line driver circuit and is electrically connected to a gate of at least one of the transistors included in the plurality of memory cells;
wherein a total number of the memory cells included in the memory device is n×m,
wherein 1st to x-th word lines are provided in the first memory cell array, and (x+1)-th to y-th word lines are provided in the second memory cell array, and
wherein the driver circuit comprises a transistor including a channel formation region provided in a semiconductor substrate comprising silicon, and
wherein each of the transistors included in the memory cells comprises a channel formation region provided in an oxide semiconductor layer.

9. The memory device according to claim 8, wherein y is equal to n.

10. The memory device according to claim 8,
wherein the plurality of memory cell arrays include a third memory cell array that is stacked to overlap with the first and second memory cell arrays,
wherein (y+1)-th to n-th word lines are provided in the third memory cell array.

11. The memory device according to claim 8,
wherein the plurality of memory cell arrays include a third memory cell array and a fourth memory cell array that are stacked to overlap with the first and second memory cell arrays,
wherein (y+1)-th to z-th word lines are provided in the third memory cell array, and
wherein (z+1)-th to n-th word lines are provided in the fourth memory cell array.

12. The memory device according to claim 8, wherein each of the memory cells further comprises a capacitor.

13. The memory device according to claim 8, wherein the 1st bit line comprises a bit line α provided in the first memory cell array and a bit line β provided in the second memory cell array, and the bit line α and the bit line β are electrically connected to each other.

14. The memory device according to claim 13, wherein the bit line α and the bit line β are arranged so as not to overlap with each other.

15. A memory device comprising:
a driver circuit comprising a bit line driver circuit and a word line driver circuit over a substrate;
first to fourth memory cell arrays that are stacked to overlap with one another and provided over the driver circuit, wherein each memory cell array comprises a plurality of memory cells arranged in matrix, and each memory cell comprises a transistor;
1st to n-th bit lines each of which is electrically connected to and driven by the bit line driver circuit and is electrically connected to a source or a drain of at least one of the transistors included in the plurality of memory cells; and
1st to m-th word lines each of which is electrically connected to and driven by the word line driver circuit and is electrically connected to a gate of at least one of the transistors included in the plurality of memory cells;
wherein a total number of the memory cells included in the memory device is n×m,
wherein 1st to x-th bit lines are provided in the first and second memory cell arrays, and (x+1)-th to n-th bit lines are provided in the third and fourth memory cell arrays,
wherein 1st to y-th word lines are provided in the first and third memory cell array, and (y+1)-th to m-th word lines are provided in the second and fourth memory cell arrays,
wherein the driver circuit comprises a transistor including a channel formation region provided in a semiconductor substrate comprising silicon, and
wherein each of the transistors included in the memory cells comprises a channel formation region provided in an oxide semiconductor layer.

16. The memory device according to claim 15, wherein each of the memory cells further comprises a capacitor.

17. The memory device according to claim 15,
wherein the bit line driver circuit includes a first driver circuit and a second driver circuit,
wherein the word line driver circuit includes a third driver circuit and a fourth driver circuit,
wherein the first to fourth driver circuits are arranged so as to be symmetrical with respect to a center point of the first memory cell array.

18. The memory device according to claim 17,
wherein the first memory cell array is driven by the first and third driver circuits,
wherein the second memory cell array is driven by the first and fourth driver circuits,
wherein the third memory cell array is driven by the second and third driver circuits, and
wherein the fourth memory cell array is driven by the second and fourth driver circuits.

19. The memory device according to claim 15,
wherein the 1st bit line comprises a bit line α provided in the first memory cell array and a bit line β provided in the second memory cell array, and the bit line α and the bit line β are electrically connected to each other, and
wherein the 1st word line comprises a word line α provided in the first memory cell array and a word line β provided in the third memory cell array, and the bit line α and the bit line β are electrically connected to each other.

20. The memory device according to claim 19,
wherein the word line α and the word line β are arranged so as not to overlap with each other, and
wherein the bit line α and the bit line β are arranged so as not to overlap with each other.

21. The memory device according to claim 15, wherein the first to fourth memory cell arrays are stacked in this order.

* * * * *